(12) United States Patent
Taguchi et al.

(10) Patent No.: US 6,624,448 B2
(45) Date of Patent: Sep. 23, 2003

(54) SEMICONDUCTOR DEVICE WITH MULTIPLE SUPPORTING POINTS

(75) Inventors: Kazunori Taguchi, Fukuoka (JP); Kazuhiro Morishita, Fukuoka (JP); Kenji Oota, Chiyoda-ku (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 29 days.

(21) Appl. No.: 09/822,342

(22) Filed: Apr. 2, 2001

(65) Prior Publication Data

US 2002/0036339 A1 Mar. 28, 2002

(30) Foreign Application Priority Data

Sep. 28, 2000 (JP) ........................................ 2000-296304

(51) Int. Cl.[7] .............................................. H01L 29/74
(52) U.S. Cl. ...................... 257/150; 257/177; 257/180; 257/725; 257/732; 361/760; 361/770; 361/801
(58) Field of Search ................................ 257/150, 177, 257/180, 725, 726, 727, 732, 733; 361/760, 770, 801

(56) References Cited

U.S. PATENT DOCUMENTS 5,930,114 A * 7/1999 Kuzmin et al. ............ 165/80.2
6,252,773 B1 * 6/2001 Werner ........................ 165/185
6,323,547 B1 * 11/2001 Kawamura et al. ......... 257/139
6,339,231 B1 * 1/2002 Ohta .......................... 257/147
6,445,013 B1 * 9/2002 Taguchi ...................... 257/138

FOREIGN PATENT DOCUMENTS

| EP | 432796 A2 * | 6/1991 | ......... H01L/23/051 |
| JP | 60046060 A * | 3/1985 | ................. 257/726 |

* cited by examiner

Primary Examiner—Allen R. Wilson
Assistant Examiner—Matthew E. Warren
(74) Attorney, Agent, or Firm—Oblon, Spivak, McClelland, Maier & Neustadt, P.C.

(57) ABSTRACT

A semiconductor device having a supporting member that reduces a resonance phenomenon. A pair of reinforcing members is fixed on a gate drive substrate with spacers interposed there between and upright portions of the pair of reinforcing members are fastened with screws on a side wall of a cathode flange. A spacer is fixed on the gate drive substrate and a projection of the spacer is inserted in an engaging member fixed on the bottom of the cathode fin electrode and thus fixed on the bottom of the cathode fin electrode. The pair of upright portions as the first and second supporting points and the projection of the spacer as the third supporting point stably support the gate drive substrate on the cathode fin electrode without freedom of rotation at the three positions arranged to surround an opening.

20 Claims, 43 Drawing Sheets

182
182
137

SEMICONDUCTOR DEVICE WITH MULTIPLE SUPPORTING POINTS

BACKGROUND OF THE INVENTION

1. Field of the Invention

The present invention relates to a semiconductor device having a pressure-contact type semiconductor element, preferably being a gate commutated turn-off (hereinafter referred to as GCT) thyristor element, in which most of the main current flowing between the anode and cathode during turn-on can be commutated to the gate electrode at the time of turn-off, and particularly to improvement for enhancing the resistance to vibration.

2. Description of the Background Art

Conventional GTO (Gate Turn-Off) thyristor devices have widely adopted structures in which the gate terminal connected to the gate electrode is drawn out in one direction to transmit a control signal to the gate electrode (see the technique described in Japanese Patent Application Laid-Open No. 56-125863 (1981), for example). In such a structure, however, large inductance is parasitically generated at the gate terminal and it is therefore difficult to instantaneously terminate the main current flowing from the anode to cathode when the element is turned off.

GCT thyristor devices in which this inductance is remarkably lowered have been developed to solve this problem. Such a GCT thyristor device adopts a ring-shaped gate terminal in place of the gate terminal extending in one direction; such a ring-shaped gate terminal is connected to a gate drive substrate on which a gate driver is provided. (See the techniques described in Japanese Patent Application Laid-Open No. 10-294406 (1998) and Japanese Patent Application Laid-Open No. 8-330572 (1996), for example). GCT thyristor devices adopting this structure can reduce the inductance of the loop including the GCT thyristor element, gate drive substrate and gate driver (referred to as gate-side inductance) to about 1/100 of that of GTO thyristors.

The GCT thyristor devices thus having much lower gate-side inductance than GTO thyristors can increase the reverse gate current rise rate ($di_{GQ}/dt$) during turn-off to about 100 times that of GTO thyristors, thus commutating almost all main current to the gate in a short time to be turned off. That is to say, the time required for turning off can be reduced and the turn-off gain can be almost one, thus achieving improved turn-off characteristics. This suppresses breakdown due to local heat generation in the semiconductor substrate and enables control of large current.

FIG. 38 is a top view showing a semiconductor device which is regarded not as a known technique but as a background art of the invention. This semiconductor device 200 is described in an U.S. application (application Ser. No. 09/549,062) by the same applicant. FIG. 39 shows the section of the semiconductor device taken along the line B—B in FIG. 38. The semiconductor device 200 is constructed as a GCT thyristor device, which comprises a gate drive substrate 7 as a circuit board, a GCT thyristor 1 fixed on the gate drive substrate 7 and a gate driver as a control circuit including capacitors 36 and transistors 35. The transistors 35 are attached to the wall surface of wall-like members 34 fixed vertically on the gate drive substrate 7. While the capacitors 36 are arranged on the gate drive substrate 7, they are not shown in FIG. 39 for the sake of simplicity.

FIG. 40 shows the section of the semiconductor device taken along the line A—A in FIG. 38 and FIGS. 41 and 42 are sectional views each showing a part of FIG. 40 in an enlarged manner. The GCT thyristor element 1 comprises, in its center area, a disk-like semiconductor substrate (wafer) 24 having a pnpn structure inside and a gate region along the periphery, a cathode strain buffer plate 25 connected to the cathode region of the semiconductor substrate 24, and an anode strain buffer plate 26 connected to the anode region of the semiconductor substrate 24.

A cathode post electrode 2 as one main electrode is connected to the cathode strain buffer plate 25 and an anode post electrode 3 as the other main electrode is connected to the anode strain buffer plate 26. Further, an electrically conductive first cathode flange (main terminal plate) 14 is connected to the cathode post electrode 2 and a cathode fin electrode 5 is connected to the first cathode flange 14. An anode fin electrode 6 is connected to the anode post electrode 3. The semiconductor substrate 24, cathode strain buffer plate 25, anode strain buffer plate 26, cathode post electrode 2, anode post electrode 3 and first cathode flange 14 are sandwiched and pressed between the cathode fin electrode 5 and the anode fin electrode 6. Thus, the GCT thyristor element 1 is constructed as a kind of pressure-contact type semiconductor element.

In the semiconductor device 200, the part excluding the cathode fin electrode 5 and the anode fin electrode 6, i.e. the device part sandwiched with a pressing force between the pair of fin electrodes 5 and 6, is called a gate drive unit 300 (hereinafter refereed to as GDU). FIG. 38 shows the cathode fin electrode 5 with a broken line.

The GCT thyristor element 1 comprises a ring-shaped second cathode flange 20 fitted around the cathode post electrode 2 and a ring-shaped anode flange 23 fitted around the anode post electrode 3. An insulating tube 21 made of ceramics (e.g. alumina) is provided between the second cathode flange 20 and the anode flange 23. In FIG. 40, the unit composed of the semiconductor substrate 24, cathode strain buffer plate 25, anode strain buffer plate 26, cathode post electrode 2 and anode post electrode 3 passes through the insulating tube 21.

In the GCT thyristor element 1, as shown in FIGS. 41 and 42, a cathode electrode 7a forming a path of current between the gate driver and the cathode of the GCT thyristor element 1 and a gate electrode 7b forming a path of current between the gate driver and the gate of the GCT thyristor element 1 are both formed on one main surface of the gate drive substrate 7 (the main surface to which the cathode fin electrode 5 faces is referred to as "upper main surface" hereinafter since this surface is shown as the upper surface in the drawings). The two are of course formed of circuit patterns insulated from each other. Although FIG. 38 does not show these circuit patterns for the sake of simplicity, the cathode electrode 7a is formed in a circuit pattern which is connected to branch-like protrusions of the first cathode flange 14 which will be described later and the gate electrode 7b is formed in a circuit pattern which is connected to branch-like protrusions of the gate flange (control terminal plate) 15 described later. The presence of the cathode electrode 7a and the gate electrode 7b forms a loop between the gate and cathode of the GCT thyristor element 1 and the gate driver. The gate current flows into this loop during commutation, whereby the main current flowing between the cathode and anode of the GCT thyristor element 1 is instantaneously terminated.

FIG. 43 is a perspective view showing the structure of the first cathode flange 14. The first cathode flange 14 is an electrically conductive thin plate having a thickness of about 0.2 to 2 mm, for example. As shown in FIG. 43, the first cathode flange 14 comprises a disk-like portion 14f having approximately the same diameter as the cathode post electrode 2, a flange portion 14e surrounding the disk-like portion 14f, and a plurality of branch-like protrusions 14d extending approximately outward from the flange portion 14e. This structure can be obtained by processing a thin plate with a press machine etc. The one-piece structure as shown in FIG. 43, i.e. the branch-like protrusions 14d, flange portion 14e and disk-like portion 14f integrally formed into the first cathode flange 14, can be easily obtained through a single press process.

Each branch-like protrusion 14d has a screw hole 14a near its end. Screws 9 are inserted in the screw holes 14a as shown in FIG. 41 to fix the branch-like protrusions 14d on the gate drive substrate 7. The gate drive substrate 7 has electrically conductive screw pedestals 17 at positions corresponding to the screw holes 14a; the branch-like protrusions 14d establish electric conduction with the cathode electrode 7a through the screw pedestals 17. The screw pedestals 17 can be attached to the gate drive substrate 7 by soldering, for example.

Commercially available low-price pedestal parts can be used as the screw pedestals 17. The screw pedestals 17 can work as long as they are in contact with the branch-like protrusions 14d and they do not have to provide a precisely smoothed surface like cathode spacer 4 and gate spacer 10 in a conventional gate commutated semiconductor device.

The branch-like protrusions 14d do not extend straight sideways from the flange portion 14e but they have some bends 14b and 14c so that the screw holes 14a can be positioned where the gate drive substrate 7 exists. The bends 14b allow a margin. Therefore vibrations and stresses generated during switching operation are absorbed especially at the bends 14b.

In the semiconductor substrate 24, the gate region is formed on the cathode region side and a ring-shaped gate electrode 29 is connected to the gate region through a gate electrode connecting layer 28 as shown in FIGS. 41 and 42. The gate electrode 29 is connected to the gate flange 15 on its inner periphery side. The cathode strain buffer plate 25 is connected to the cathode region on the semiconductor substrate 24 through a cathode electrode connecting layer 27.

FIG. 44 shows the structure of the gate flange 15. The gate flange 15 is an electrically conductive thin plate having a thickness of about 0.2 to 2 mm, for example. As shown in FIG. 44, the gate flange 15 has a ring hole 15e in which the cathode post electrode 2 is inserted, a ring-shaped portion 15d surrounding the ring hole 15e, and a plurality of branch-like protrusions 15c extending approximately outward from the ring-shaped portion 15d.

Each branch-like protrusion 15c has a screw hole 15a near its end. As shown in FIG. 42, screws 12 are inserted in the screw holes 15a to fix the branch-like protrusions 15c to the gate drive substrate 7. The gate drive substrate 7 has electrically conductive screw pedestals 16, like the screw pedestals 17, at the positions corresponding to the screw holes 15a; the branch-like protrusions 15c establish electric conduction with the gate electrode 7b through the screw pedestals 16. Like the screw pedestals 17, commercially available low-price pedestal parts can be used as the screw pedestals 16 and they can be attached to the gate drive substrate 7 by soldering, for example.

The branch-like protrusions 15c do not extend straight sideways from the ring-shaped portion 15d but they have bends 15b so that the screw holes 15a can be positioned where the gate drive substrate 7 exists. The bends 15b allow a margin. Therefore vibrations and stresses generated at the time of switching operation can be absorbed especially at the bends 15b.

As shown in FIG. 42, an insulating sheet 30 is provided to achieve insulation of the gate electrode 29 and gate flange 15 from the cathode strain buffer plate 25 and cathode post electrode 2.

While the ring-shaped portion 15d of the gate flange 15 is sandwiched in the insulating tube 21, it projects outward from the side of the insulating tube 21. The branch-like protrusions 15c of the gate flange 15 extend outward from the insulating tube 21.

FIG. 38 shows, by way of example, a structure in which the first cathode flange 14 has six branch-like protrusions 14d and the gate flange 15 also has six branch-like protrusions 15c. The branch-like protrusions 14d and 15c are positioned to equally divide, into six, the periphery of the first cathode flange 14 and the gate flange 15, respectively. Further, the first cathode flange 14 and the gate flange 15 are arranged so that adjacent branch-like protrusions 14d and 15c extend approximately parallel with each other and so that the branch-like protrusions 14d and 15c are alternately positioned. The distance between the branch-like protrusions 14d and 15c is designed to be equal to or larger than the minimum limit which can ensure insulation.

Further, when the structure is designed so that the branch-like protrusions 14d and 15c are sufficiently separated from the cathode fin electrode 5 and the anode fin electrode 6, it is possible to suppress the possibility of leakage current from external circuitry connected to the cathode fin electrode 5 or the anode fin electrode 6 to the branch-like protrusions 14d and 15c. For this purpose, the bends 14b, 14c and 15b of the branch-like protrusions 14d and 15c can be adjusted to determine the relative position between the gate drive substrate 7 and the GCT thyristor element 1 in the height direction.

It is desired that the first cathode flange 14 and the gate flange 15 should have a plurality of, three or more, branch-like protrusions 14d and branch-like protrusions 15c, respectively. If they have only one branch-like protrusion each, there will be a difficulty in holding the GCT thyristor element 1. Further, it does not make much difference in characteristics from the gate terminal extending in one direction as adopted in conventionally known GTO thyristors. When they have two branch-like protrusions each, the GCT thyristor element 1 will be resonated or twisted by vibrations and stresses generated during switching operation. With a structure having three branch-like protrusions 14d and three branch-like protrusions 15c, the three can be formed in positions approximately equally dividing, into three, the periphery of the first cathode flange 14 and the gate flange 15 so that the GCT thyristor element 1 will not be resonated nor twisted by vibrations and stresses generated during switching operation.

The number of branch-like protrusions can be selected in the range of three or more by considering the current capacity of the GCT thyristor element 1, or the turn-off reverse gate current rise rate ($di_{GQ}/dt$) required for the GCT thyristor element 1, required inductance value, working efficiency in manufacturing process, cost, etc.

With the semiconductor device 200 thus constructed, the gate flange 15 and the first cathode flange 14 can be fixed to the gate drive substrate 7 by using low-price pedestal parts, instead of the cathode spacer and gate spacer used in conventionally-known GCT thyristor devices, so as to achieve cost reduction. This structure also achieves weight reduction of the semiconductor device 200.

Moreover, while screws are attached on both upper and lower surfaces of the gate drive substrate in conventionally known GCT thyristor devices, the branch-like protrusions 14d of the first cathode flange 14 and the branch-like protrusions 15c of the gate flange 15 are fixed with screws on the same surface of the gate drive substrate 7, which provides improved working efficiency in manufacture process and maintenance.

Furthermore, while interconnection patterns are formed on both upper and lower surfaces (i.e. both of one main surface and the other main surface) of the gate drive substrate 7 in conventionally known GCT thyristor devices, the gate and cathode interconnection patterns of this device are both formed on the upper main surface of the gate drive substrate 7, which reduces the time and cost required for manufacture.

On the other hand, the semiconductor device 200 does not have a case like those of conventionally known GCT thyristor devices, which may result in lack of strength. Reinforcing members 18 are therefore provided as shown in FIGS. 38 and 39 in order to enhance the strength. In FIG. 39, a pair of L-shaped reinforcing members 18 are provided parallel with each other on opposite sides of the GCT thyristor element 1. Each reinforcing member 18 has a flat portion 41 extending parallel with the upper main surface of the gate drive substrate 7 and an upright portion 40 connected to one end of it and vertically standing above the upper main surface of the gate drive substrate 7.

The reinforcing members 18 are fixed on the gate drive substrate 7 with screws 33 and nuts 32, each reinforcing member 18 being insulated from the gate drive substrate 7 by insulating spacers 37 provided in two positions separated along the direction in which the flat portions 41 extend. The spacers 37 interposed between respective flat portions 41 and the upper main surface of the gate drive substrate 7 serve also to keep the interval between them. The reinforcing members 18 thus effectively function as reinforcing members for preventing the gate drive substrate 7 from curving due to the weight of the transistors 35 etc.

The upright portions 40 are each detachably fixed with a screw 31 to a side wall of the cathode fin electrode 5 which is formed in an approximately rectangular shape in plane view. Fixing the cathode fin electrode 5 to the reinforcing members 18 in this way more effectively prevents the gate drive substrate 7 from curving because of the weight of the transistors 35 etc.

In the semiconductor device 200, as described above, the flanges 14 and 15 provided in the GCT thyristor element 1 are just flexibly connected to the GDU 300, so that they do not substantially function as members for supporting the GDU 300. The GDU 300 is supported on the GCT thyristor element 1 mostly by the reinforcing members 18 provided on the gate drive substrate 7. Thus, the gate drive substrate 7 is supported on the cathode fin electrode 5 substantially at the two supporting points in the pair of upright portions 40 of the pair of reinforcing members 18.

Accordingly, when the semiconductor device 200 is used in an environment where it is subjected to vibrations, e.g. when it is applied to an electric railway train etc., and particularly when vibrations are applied to the semiconductor device 200 in the direction vertical to the main surface of the gate drive substrate 7 (Z direction), moments are produced around the two supporting points in the pair of upright portions 40 of the pair of reinforcing members 18 to possibly cause the GDU 300 to resonate.

SUMMARY OF THE INVENTION

The present invention has been made to solve the above-described problem of the background art and an object of the present invention is to provide a semiconductor device which can suppress resonance phenomena in an environment where it is subjected to vibrations.

According to a first aspect of the present invention, a semiconductor device comprises: (a) a circuit board having a pair of main surfaces and an opening selectively formed through the pair of main surfaces; (b) a pressure-contact type semiconductor element inserted in the opening, the pressure-contact type semiconductor element comprising a semiconductor substrate, a pair of main electrodes between which opposite main surfaces of the semiconductor substrate are sandwiched, a fin electrode abutting on one of the pair of main electrodes and facing one main surface of the pair of main surfaces of the circuit board, and a control terminal connected to the semiconductor substrate; (c) a control circuit attached to the circuit board and electrically connected to the control terminal to control the pressure-contact type semiconductor element; and (d) a supporting member for supporting the circuit board on the fin electrode at three or more supporting points arranged to surround the opening.

Preferably, according to a second aspect, in the semiconductor device, the supporting member comprises (d-1) a pair of reinforcing members having a pair of flat portions arranged to extend in one direction along the periphery of the opening, while facing the said one main surface in a pair of positions facing each other across the opening, and a pair of upright portions respectively coupled to the pair of flat portions at one end in the said one direction, the pair of upright portions vertically standing above the said one main surface and detachably fixed on a side wall surface of the fin electrode, (d-2) a spacer interposed between the pair of flat portions and the said one main surface to fixedly couple the pair of flat portions and the circuit board at an interval therebetween, the spacer being arranged, for each flat portion, in a position including at least two points spaced from each other along the said one direction, and (d-3) a fixing member provided in such a position as to surround the opening together with the pair of upright portions and interposed between the fin electrode and the said one main surface to detachably fix the fin electrode and the circuit board at an interval therebetween.

Preferably, according to a third aspect, in the semiconductor device, the supporting member comprises (d-1) a pair of reinforcing members interposed between the fin electrode and the one main surface in a pair of positions facing each other across the opening, the pair of reinforcing members extending in one direction along the periphery of the opening and detachably fixed along the one direction in close contact on a surface of the fin electrode which faces the one main surface, and (d-2) a spacer interposed between the pair of reinforcing members and the one main surface to fixedly couple the pair of reinforcing members and the circuit board at an interval therebetween, the spacer being arranged, for each reinforcing member, in a position including at least two points spaced from each other along the one direction.

Preferably, according to a fourth aspect, in the semiconductor device, the supporting member comprises (d-1) a pair of reinforcing members having a pair of flat portions arranged to extend in one direction along the periphery of the opening, while facing the one main surface in a pair of positions facing each other across the opening, a pair of upright portions respectively coupled to the pair of flat portions at one end in one direction, the pair of upright portions vertically standing above the one main surface and detachably fixed on a side wall surface of the fin electrode, and a pair of fixing portions respectively coupled to the pair of flat portions at the other end in the one direction and detachably fixed to the fin electrode, and (d-2) a spacer interposed between the pair of flat portions and the one main surface to fixedly couple the pair of flat portions and the circuit board at an interval therebetween, the spacer being arranged, for each flat portion, in a position including at least two points spaced from each other along the one direction.

According to a fifth aspect, a semiconductor device comprises: (a) a circuit board having a pair of main surfaces and an opening selectively formed through the pair of main surfaces; (b) a pressure-contact type semiconductor element inserted in the opening, the pressure-contact type semiconductor element comprising a semiconductor substrate, a pair of main electrodes between which opposite main surfaces of the semiconductor substrate are sandwiched, a fin electrode abutting on one of the pair of main electrodes and facing one main surface of the pair of main surfaces of the circuit board, and a control terminal connected to the semiconductor substrate; (c) a control circuit attached to the circuit board and electrically connected to the control terminal to control the pressure-contact type semiconductor element; (d) a reinforcing member having a plate-like flat portion arranged to cover an area surrounding the opening in the one main surface, and an upright portion coupled to one end of the flat portion in one direction along the one main surface, the upright portion standing vertically above the one main surface and detachably fixed on a side wall surface of the fin electrode; and (e) a spacer interposed between the flat portion and the one main surface to fixedly couple the flat portion and the circuit board at an interval therebetween, the spacer being arranged in a position including at least four points separated from one another to surround the opening.

According to a sixth aspect, a semiconductor device comprises: (a) a circuit board having a pair of main surfaces and an opening selectively formed through the pair of main surfaces; (b) a pressure-contact type semiconductor element inserted in the opening, the pressure-contact type semiconductor element comprising a semiconductor substrate, a pair of main electrodes between which opposite main surfaces of the semiconductor substrate are sandwiched, a fin electrode abutting on one of the pair of main electrodes and facing one main surface of the pair of main surfaces of the circuit board, and a control terminal connected to the semiconductor substrate; (c) a control circuit attached to the circuit board and electrically connected to the control terminal to control the pressure-contact type semiconductor element; (d) a pair of reinforcing members having a pair of flat portions arranged to extend in one direction along the periphery of the opening, while facing the one main surface in a pair of positions facing each other across the opening, and a pair of upright portions respectively coupled to the pair of flat portions at one end in the one direction, the pair of upright portions vertically standing above the one main surface and detachably fixed on a side wall surface of the fin electrode; and (e) a spacer interposed between the pair of flat portions and the one main surface to fixedly couple the pair of flat portions and the circuit board at an interval therebetween, the spacer being arranged, for each flat portion in a separated manner, in three or more positions arranged along the one direction.

According to a seventh aspect, a semiconductor device comprises: (a) a circuit board having a pair of main surfaces and an opening selectively formed through the pair of main surfaces; (b) a pressure-contact type semiconductor element inserted in the opening, the pressure-contact type semiconductor element comprising a semiconductor substrate, a pair of main electrodes between which opposite main surfaces of the semiconductor substrate are sandwiched, a fin electrode abutting on one of the pair of main electrodes and facing one main surface of the pair of main surfaces of the circuit board, and a control terminal connected to the semiconductor substrate; (c) a control circuit attached to the circuit board and electrically connected to the control terminal to control the pressure-contact type semiconductor element; (d) a pair of reinforcing members having a pair of flat portions arranged to extend in one direction along the periphery of the opening, while facing the one main surface in a pair of positions facing each other across the opening, and a pair of upright portions respectively coupled to the pair of flat portions at one end in the one direction, the pair of upright portions vertically standing above the one main surface and detachably fixed on a side wall surface of the fin electrode; and (e) a spacer interposed between the pair of flat portions and the one main surface to fixedly couple the pair of flat portions and the circuit board at an interval therebetween, the spacer being arranged, for each flat portion, to extend along the one direction in close contact with each flat portion and the one main surface along the one direction.

According to an eighth aspect, a semiconductor device comprises: (a) a circuit board having a pair of main surfaces and an opening selectively formed through the pair of main surfaces; (b) a pressure-contact type semiconductor element inserted in the opening, the pressure-contact type semiconductor element comprising a semiconductor substrate, a pair of main electrodes between which opposite main surfaces of the semiconductor substrate are sandwiched, a fin electrode abutting on one of the pair of main electrodes and facing one main surface of the pair of main surfaces of the circuit board, and a control terminal connected to the semiconductor substrate; (c) a control circuit attached to the circuit board and electrically connected to the control terminal to control the pressure-contact type semiconductor element; (d) a pair of reinforcing members having a pair of flat portions arranged to extend in one direction along the periphery of the opening, while facing the one main surface in a pair of positions facing each other across the opening, the pair of flat portions having a plurality of through holes arranged along the one direction, and a pair of upright portions respectively coupled to the pair of flat portions at one end in the one direction, the pair of upright portions vertically standing above the one main surface and detachably fixed on a side wall surface of the fin electrode; and (e) a spacer interposed between the pair of flat portions and the one main surface to fixedly couple the pair of flat portions and the circuit board at an interval therebetween, the spacer being arranged, for each flat portion, in a position including at least two points spaced from each other along the one direction.

According to a ninth aspect, a semiconductor device comprises: (a) a circuit board having a pair of main surfaces and an opening selectively formed through the pair of main surfaces; (b) a pressure-contact type semiconductor element inserted in the opening, the pressure-contact type semiconductor element comprising a semiconductor substrate, a pair of main electrodes between which opposite main surfaces of the semiconductor substrate are sandwiched, a fin electrode abutting on one of the pair of main electrodes and facing one main surface of the pair of main surfaces of the circuit board, and a control terminal connected to the semiconductor substrate; (c) a control circuit attached to the circuit board and electrically connected to the control terminal to control the pressure-contact type semiconductor element; (d) a pair of reinforcing members having a pair of flat portions arranged to extend in one direction along the periphery of the opening, while facing the one main surface in a pair of positions facing each other across the opening, and a pair of upright portions respectively coupled to the pair of flat portions at one end in the one direction, the pair of upright portions vertically standing above the one main surface and detachably fixed on a side wall surface of the fin electrode; (e) a spacer interposed between the pair of flat portions and the one main surface to fixedly couple the pair of flat portions and the circuit board at an interval therebetween, the spacer being arranged, for each flat portion, in a position including at least two points spaced from each other along the one direction; and (f) a frame fixed to the circuit board along at least part of the periphery of the circuit board and in close contact with the at least part of the periphery.

Preferably, according to a tenth aspect, in the semiconductor device, the supporting member comprises (d-1) a spacer interposed between the fin electrode and the one main surface in four or more positions separated to surround the opening to detachably and fixedly couple the fin electrode and the circuit board at an interval therebetween.

According to an eleventh aspect, a semiconductor device comprises: (a) a circuit board having a pair of main surfaces and an opening selectively formed through the pair of main surfaces; (b) a pressure-contact type semiconductor element inserted in the opening, the pressure-contact type semiconductor element comprising a semiconductor substrate, a pair of main electrodes between which opposite main surfaces of the semiconductor substrate are sandwiched, a fin electrode abutting on one of the pair of main electrodes and facing one main surface of the pair of main surfaces of the circuit board, and a control terminal connected to the semiconductor substrate; (c) a control circuit attached to the circuit board and electrically connected to the control terminal to control the pressure-contact type semiconductor element; (d) a pair of reinforcing members having a pair of flat portions arranged to extend in one direction along the periphery of the opening, while facing the one main surface in a pair of positions facing each other across the opening, and a pair of upright portions respectively coupled to the pair of flat portions at one end in the one direction, the pair of upright portions vertically standing above the one main surface and detachably fixed on a side wall surface of the fin electrode; (e) a spacer interposed between the pair of flat portions and the one main surface to fixedly couple the pair of flat portions and the circuit board at an interval therebetween, the spacer being arranged, for each flat portion, in a position including at least two points spaced from each other along the one direction; (f) another reinforcing member having another plate-like flat portion arranged to face an area of the one main surface which does not face the fin electrode, and another upright portion coupled to one end of said another flat portion in one direction along the one main surface, said another upright portion vertically standing above the one main surface and detachably fixed on the side wall surface of the fin electrode; and (g) another spacer interposed between said another flat portion and the one main surface and fixedly coupling said another flat portion and the circuit board at an interval therebetween, said another spacer being arranged in a position including at least four points separated from one another and not aligned in a straight line.

According to a twelfth aspect, a semiconductor device comprises: (a) a circuit board having a pair of main surfaces and an opening selectively formed through the pair of main surfaces; (b) a pressure-contact type semiconductor element inserted in the opening, the pressure-contact type semiconductor element comprising a semiconductor substrate, a pair of main electrodes between which opposite main surfaces of the semiconductor substrate are sandwiched, a fin electrode abutting on one of the pair of main electrodes and facing one main surface of the pair of main surfaces of the circuit board, another fin electrode abutting on the other one of the pair of main electrodes and facing the other main surface of the pair of main surfaces of the circuit board, and a control terminal connected to the semiconductor substrate; (c) a control circuit attached to the circuit board and electrically connected to the control terminal to control the pressure-contact type semiconductor element; (d) a ring-shaped elastic member sandwiched with a pressing force between said fin electrode and said one main surface and surrounding the opening; and (e) another ring-shaped elastic member sandwiched with a pressing force between said another fin electrode and said other main surface and surrounding the opening.

Preferably, according to a thirteenth aspect, in the semiconductor device, the fixing member comprises (d-3-1) a spacer having a projection projecting to a side opposite to the one end along the one direction, the spacer being fixed on the circuit board and abutting on a surface of the fin electrode which faces the one main surface to hold the interval between the fin electrode and the circuit board, and (d-3-2) an engaging member fixed to the fin electrode and detachably engaged with the projection with an elastic recovery force to press the projection against the fin electrode.

Preferably, according to a fourteenth aspect, in the semiconductor device, the supporting member further comprises (d-3) a pair of engaging members fixed to the fin electrode and engaged slidably in the one direction with the pair of reinforcing members with an elastic recovery force to press the pair of reinforcing members against the fin electrode, and the pair of reinforcing members are fixed by the pair of engaging members in close contact on the surface of the fin electrode which faces the one main surface.

Preferably, according to a fifteenth aspect, in the semiconductor device, the pair of fixing portions comprise a pair of protrusions vertically standing above the one main surface and detachably fixed on another side wall surface of the fin electrode which is opposite to the side wall surface.

Preferably, according to a sixteenth aspect, in the semiconductor device, the pair of fixing portions are fastened with screws and thus detachably coupled respectively to the pair of flat portions.

Preferably, according to a seventeenth aspect, in the semiconductor device, the pair of upright portions and the pair of fixing portions are integrally coupled respectively to the pair of flat portions.

Preferably, according to an eighteenth aspect, in the semiconductor device, the pair of fixing portions are fastened with screws and thus detachably fixed to said another side wall surface.

Preferably, according to a nineteenth aspect, in the semiconductor device, each of the pair of fixing portions comprises a protrusion abutting on a surface of the fin electrode which faces the one main surface and protruding along the one direction to a side opposite to said one end, and the supporting member further comprises (d-3) an engaging member fixed on the fin electrode and detachably engaged with the protrusions to hold the protrusions abutting on the surface of the fin electrode which faces the one main surface.

Preferably, according to a twentieth aspect, in the semiconductor device, the fin electrode has a recess on its another side wall surface which is opposite to said side wall surface and the pair of fixing portions respectively have a pair of protrusions which can be inserted in the recess, and wherein the pair of protrusions are detachably inserted in the recess to fix the pair of fixing portions to the fin electrode.

Preferably, according to a twenty-first aspect, the semiconductor device further comprises (f) a ring-shaped elastic member sandwiched with a pressing force between the flat portion and the one main surface to surround the opening.

Preferably, according to a twenty-second aspect, in the semiconductor device, the fin electrode has a fin on its said side wall surface and said another upright portion has a window selectively opening in a part facing toward the fin.

Preferably, according to a twenty-third aspect, in the semiconductor device, the pair of upright portions are fastened with screws and thus detachably fixed to the side wall surface of the fin electrode.

Preferably, according to a twenty-fourth aspect, in the semiconductor device, the upright portion is fastened with a screw and thus detachably fixed to the side wall surface of the fin electrode.

Preferably, according to a twenty-fifth aspect, in the semiconductor device, the one direction is a direction approximately connecting the center of the opening and the center of the one main surface, and while the pair of flat portions have two ends in the one direction, the one end at which the pair of upright portions are coupled is the end closer to the center of the one main surface.

Preferably, according to a twenty-sixth aspect, in the semiconductor device, the one direction is a direction approximately connecting the center of the opening and the center of the one main surface, and while the flat portion has two ends in the one direction, the one end at which the upright portion is coupled is the end closer to the center of the one main surface.

Preferably, according to a twenty-seventh aspect, in the semiconductor device, for each flat portion, the spacer is arranged in a separated manner in three or more positions arranged along the one direction.

Preferably, according to a twenty-eighth aspect, in the semiconductor device, for each flat portion, the spacer extends along the one direction in close contact with each flat portion and the one main surface along the one direction.

Preferably, according to a twenty-ninth aspect, the semiconductor device further comprises a frame fixed to the circuit board along at least part of the periphery of the circuit board and in close contact with the at least part of the periphery.

Preferably, according to a thirtieth aspect, in the semiconductor device, the circuit board has a contour having opposite two sides in plane view and the at least part of the periphery of the circuit board corresponds to the two sides.

Preferably, according to a thirty-first aspect, in the semiconductor device, the circuit board has first and second interconnection patterns respectively provided on the one main surface and the other main surface, the pressure-contact type semiconductor element further comprises a main terminal plate, the main terminal plate having its inner region electrically connected to the one main electrode, the main terminal plate having a ring-shaped region extending outside of the inner region along its periphery, the ring-shaped region of the main terminal plate being connected to the first interconnection pattern in a part disposed in a ring-shaped region extending along the periphery of the opening, and wherein the control circuit is electrically connected to the main terminal plate as well as the control terminal to control the pressure-contact type semiconductor element, and wherein the control terminal is a control terminal plate having its inner region electrically connected to the semiconductor substrate, the control terminal plate having a ring-shaped region extending outside of the inner region along its periphery, the ring-shaped region of the control terminal plate being connected to the second interconnection pattern in a part disposed in a ring-shaped region extending along the periphery of the opening.

Preferably, according to a thirty-second aspect, in the semiconductor device, the circuit board has first and second interconnection patterns provided on the one main surface, the pressure-contact type semiconductor element further comprises a main terminal plate, the main terminal plate having its inner region electrically connected to the one main electrode, the main terminal plate having a branch-like protrusion projecting outward from the inner region, the branch-like protrusion of the main terminal plate being connected to the first interconnection pattern in a part disposed in the vicinity of the periphery of the opening, and the control circuit is electrically connected to the main terminal plate as well as the control terminal to control the pressure-contact type semiconductor element, and wherein the control terminal is a control terminal plate having its inner region electrically connected to the semiconductor substrate, the control terminal plate having a branch-like protrusion projecting outward from the inner region, the branch-like protrusion of the control terminal plate being connected to the second interconnection pattern in a part disposed in the vicinity of the periphery of the opening.

Preferably, according to a thirty-third aspect, in the semiconductor device, the main terminal plate and the control terminal plate are fastened with screws to the circuit board.

Preferably, according to a thirty-fourth aspect, in the semiconductor device, the pressure-contact type semiconductor element is a gate commutated turn-off thyristor element.

According to the first aspect, a circuit board connected to a pressure-contact type semiconductor element is stably supported on a fin electrode without freedom of rotation at three or more supporting points arranged to surround an opening in which the pressure-contact type semiconductor element is inserted. Thus no rotating moment is produced around each supporting point even in an environment in which the semiconductor device is subjected to vibrations and the resonance phenomenon of the circuit board is thus prevented. Thus, a semiconductor device having excellent vibration resistance is obtained.

According to the second aspect, a pair of reinforcing members and a spacer enhance the rigidity of the circuit board (including components provided thereon) to further suppress the resonance phenomenon. Moreover, since the upright portions of the reinforcing members are detachably fixed on a side wall surface of the fin electrode, inserting attachment can be used in the process of assembling the semiconductor device.

According to the third aspect, a pair of reinforcing members and a spacer enhance the rigidity of the circuit board to further suppress the resonance phenomenon. Moreover, the pair of reinforcing members are detachably fixed in close contact on the surface of the fin electrode which faces the circuit board, which means that the supporting points are continuously and infinitely distributed. This further enhances the effect of suppressing the resonance phenomenon.

According to the fourth aspect, a pair of reinforcing members and a spacer enhance the rigidity of the circuit board to further suppress the resonance phenomenon. Moreover, the device can be manufactured at low cost since the four supporting points for effectively suppressing the resonance phenomenon can be realized just by adding a pair of fixing members to the pair of reinforcing members.

According to the fifth aspect, a reinforcing member and spacer enhance the rigidity of the circuit board to suppress the resonance phenomenon. Particularly, the rigidity is effectively enhanced since the reinforcing member has a plate-like flat portion arranged to cover an area surrounding the opening.

According to the sixth aspect, a pair of reinforcing members and a spacer enhance the rigidity of the circuit board to suppress the resonance phenomenon. Particularly, the spacer is arranged in a separated manner in three or more positions for each reinforcing member, which effectively enhances the rigidity of the circuit board and achieves weight reduction of the circuit board (including components provided thereon). This more effectively suppresses the resonance phenomenon.

According to the seventh aspect, a pair of reinforcing members and a spacer enhance the rigidity of the circuit board to suppress the resonance phenomenon. Particularly, the rigidity of the circuit board is effectively enhanced since the spacer is provided to extend along each reinforcing member and in close contact with each reinforcing member and the circuit board. This more effectively suppresses the resonance phenomenon.

According to the eighth aspect, a pair of reinforcing members and a spacer enhance the rigidity of the circuit board to suppress the resonance phenomenon. Further, inserting attachment can be used in the process of assembling the semiconductor device since upright portions of the reinforcing members are detachably fixed on a side wall surface of the fin electrode. Moreover, the weight of the circuit board including components provided thereon can be reduced since the reinforcing members have a plurality of through holes arranged along the direction in which they extend. This further effectively suppresses the resonance phenomenon.

According to the ninth aspect, a frame is fixed to the circuit board along at least part of the periphery of the circuit board and in contact with at least that part, so as to enhance the rigidity of the circuit board. This suppresses the resonance phenomenon of the circuit board.

According to the tenth aspect, a spacer supporting at at least four supporting points further suppresses the resonance phenomenon. Moreover, the device can be manufactured with a smaller number of parts and hence at lower cost.

According to the eleventh aspect, a pair of reinforcing members and a spacer enhance the rigidity of the circuit board to suppress the resonance phenomenon. Furthermore, another reinforcing member and another spacer further enhance the rigidity of the circuit board to further effectively suppress the resonance phenomenon. Moreover, a pair of upright portions of the pair of reinforcing members and an upright portion of the other reinforcing member are detachably fixed on a side wall surface of the fin electrode, so that the inserting attachment can be used in the process of assembling the semiconductor device.

According to the twelfth aspect, a pair of ring-shaped elastic members are sandwiched between the pair of fin electrodes and the circuit board to suppress the resonance phenomenon of the circuit board.

According to the thirteenth aspect, a projection projecting away from the upright portions of the reinforcing members and an engaging member engaged with the projection with an elastic recovery force serve as the third supporting point to support the circuit board on the fin electrode. This structure further facilitates the inserting attachment in the semiconductor device assembly process, thus improving the assembly efficiency and reducing the assembly cost.

According to the fourteenth aspect, a pair of engaging members slidably engage with the pair of reinforcing members with an elastic recovery force to fix the pair of reinforcing members on the fin electrode, which facilitates the inserting attachment in the semiconductor device assembly process. This improves the assembly efficiency and reduces the assembly cost.

According to the fifteenth aspect, the pair of upright portions and a pair of similar protrusions detachably fix the pair of reinforcing members on a pair of opposite side wall surfaces of the fin electrode and the pair of reinforcing members can thus be easily fixed on the fin electrode.

According to the sixteenth aspect, the pair of fixing portions are fastened with screws and thus detachably coupled to the pair of flat portions and therefore the inserting attachment can be used in the semiconductor device assembly process.

According to the seventeenth aspect, the pair of upright portions and the pair of fixing portions are integrated with the pair of flat portions, so that the stacking attachment can be used in the semiconductor device assembly process. Further, integrally forming each reinforcing member as one piece reduces the number of parts and reduces the manufacturing cost.

According to the eighteenth aspect, the pair of fixing portions are fastened with screws and thus detachably fixed on a side wall surface of the fin electrode, which further facilitates the process of assembling the semiconductor device. This improves the assembly efficiency and reduces the assembly cost.

According to the nineteenth aspect, a pair of protrusions projecting away from the pair of upright portions and a pair of engaging members detachably engaged with the protrusions serve as the third and fourth supporting points to support the circuit board on the fin electrode. This further facilitates the inserting attachment in the semiconductor device assembly process, thus improving the assembly efficiency and reducing the assembly cost.

According to the twentieth aspect, a pair of protrusions are inserted in a recess formed on the fin electrode and serve as the third and fourth supporting points to support the circuit board on the fin electrode. Therefore the stacking attachment can be easily achieved in the process of assembling the semiconductor device, and the assembly efficiency is enhanced and the assembly cost is reduced.

According to the twenty-first aspect, a ring-shaped elastic member is sandwiched between the flat portion of the reinforcing member and the circuit board to further effectively suppress the resonance phenomenon of the circuit board.

According to the twenty-second aspect, the fin electrode has a fin and the upright portion of another reinforcing member has a window opening over the fin, which allows the fin electrode to effectively dissipate heat.

According to the twenty-third aspect, the pair of upright portions are fastened with screws and thus detachably fixed on a side wall surface of the fin electrode, which facilitates the semiconductor device assembly process. This improves the assembly efficiency and reduces the assembly cost.

According to the twenty-fourth aspect, the upright portion is fastened with screws and thus detachably fixed on a side wall surface of the fin electrode, which facilitates the semiconductor device assembly process. This improves the assembly efficiency and reduces the assembly cost.

According to the twenty-fifth aspect, the pair of upright portions are located closer to the center of the circuit board, which reduces moments produced by vibrations around the pair of upright portions. This more effectively suppresses the resonance phenomenon.

According to the twenty-sixth aspect, the upright portion is located closer to the center of the circuit board, which reduces moments produced by vibrations around the upright portion. This further effectively suppresses the resonance phenomenon.

According to the twenty-seventh aspect, the spacer is provided in a separated manner in three or more points for each reinforcing member, so that the rigidity of the circuit board is effectively enhanced while achieving weight reduction of the circuit board. This more effectively suppresses the resonance phenomenon.

According to the twenty-eighth aspect, the spacer is provided to extend along each reinforcing member in close contact with each reinforcing member and the circuit board, thus effectively enhancing the rigidity of the circuit board. This further effectively suppresses the resonance phenomenon.

According to the twenty-ninth aspect, a frame is fixed to the circuit board along at least part of the periphery of the circuit board and in contact with that part, so as to enhance the rigidity of the circuit board. This further effectively suppresses the resonance phenomenon of the circuit board.

According to the thirtieth aspect, the frame is fixed to the circuit board in close contact with opposite two sides of the circuit board, thus further enhancing the rigidity of the circuit board. This further effectively suppresses the resonance phenomenon of the circuit board.

According to the thirty-first aspect, the main terminal plate and the control terminal plate are connected to the interconnection patterns in a ring-shaped area extending along the periphery of the opening of the circuit board. This suppresses the inductance between the control circuit and the semiconductor substrate and enhances operating speed of the pressure-contact type semiconductor element. The structure is therefore suitable for use with a gate commutated turn-off element.

According to the thirty-second aspect, the main terminal plate and the control terminal plate are both connected to interconnection patterns provided on one main surface of the circuit board, which facilitates the assembly process of the semiconductor device. This improves the assembly efficiency and saves the assembly cost.

According to the thirty-third aspect, the main terminal plate and the control terminal plate are fastened with screws to the circuit board, which further facilitates the process of assembling the semiconductor device. This further improves the assembly efficiency and further saves the assembly cost.

According to the thirty-fourth aspect, the pressure-contact type semiconductor element is a gate commutated turn-off thyristor element and the turn-off characteristic can be improved. This suppresses excessive local heat generation in the semiconductor substrate and the structure is suitable for application controlling large current.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
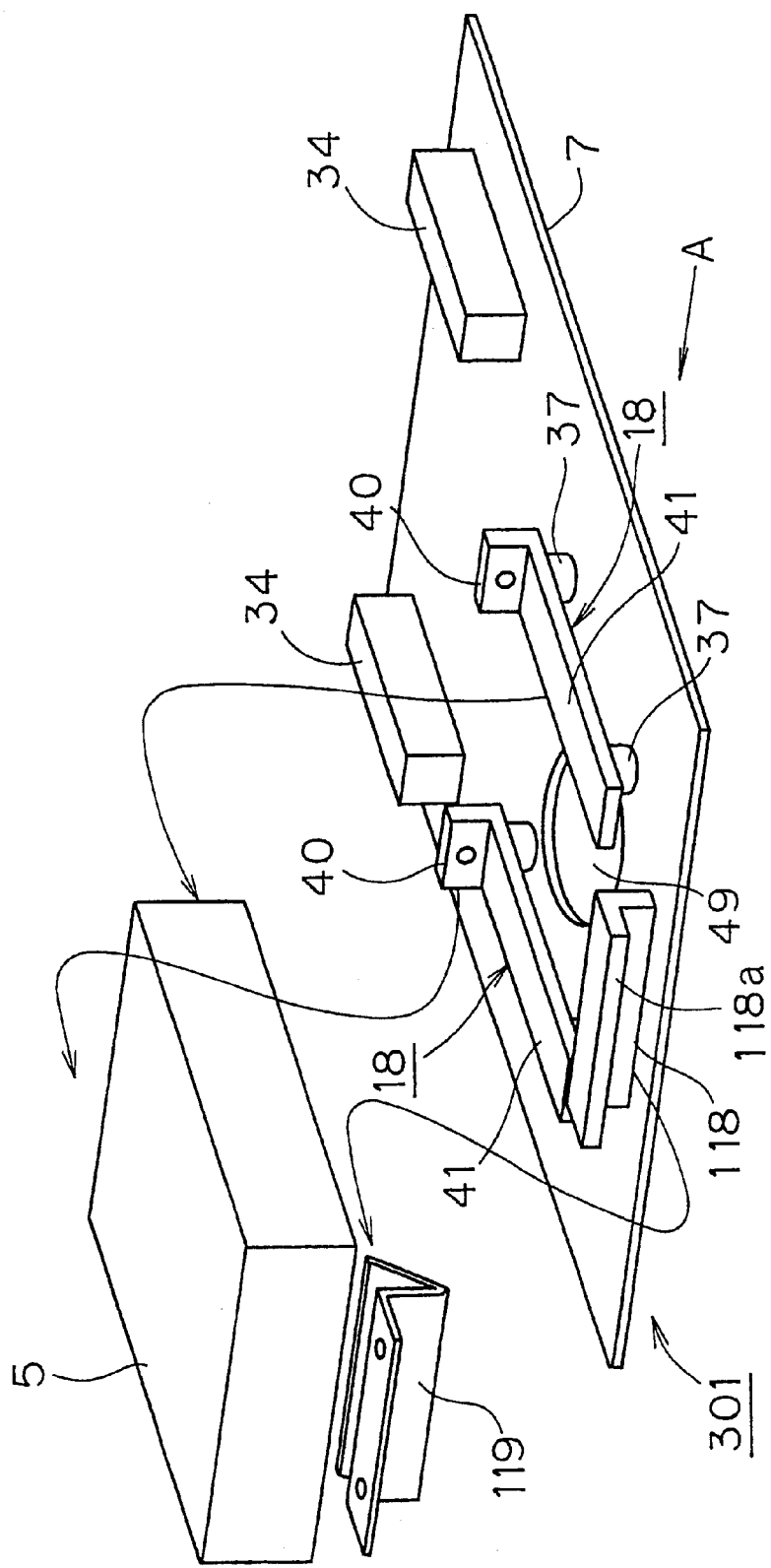
FIG. 1 is a perspective view showing a semiconductor device according to a first preferred embodiment.

The first to sixteenth preferred embodiments shown below mainly describe characteristic improvements on the semiconductor device 200 shown as a background art in FIGS. 38 to 44. Elements other than the characteristically improved parts are not described nor shown in the drawings in the following preferred embodiments; the semiconductor devices 201 to 216 of the preferred embodiments are understood by also referring to FIGS. 38 to 44 and descriptions thereof.

Particularly, while the semiconductor devices 201 to 214, 216 of the first to fourteenth and sixteenth preferred embodiments all comprise the GCT thyristor element 1 included in the semiconductor device 200 (FIGS. 38 to 44), most components of the GCT thyristor element 1 and part of the components provided on the gate drive substrate 7 are not shown in the drawings. Also, in the drawings, the same parts as those of the semiconductor device 200 shown in FIGS. 38 to 44 and corresponding parts (parts having the same functions) are shown at the same reference characters and are not described in detail again.

The semiconductor device of this invention is not limited to the semiconductor devices 201 to 216 of the following preferred embodiments. For example, the GCT thyristor element 1 can be extended to a wide variety of general pressure-contact type semiconductor elements.

First Preferred Embodiment

FIG. 1 is a perspective view schematically showing a semiconductor device 201 of a first preferred embodiment. The GDU 301 corresponds to the part of the semiconductor device 201 excepting the cathode fin electrode 5.

In the semiconductor device 201, as in the semiconductor device 200, a pair of reinforcing members 18 are fixed to the upper main surface of the gate drive substrate 7 with electrically insulating spacers 37 interposed therebetween. Each reinforcing member 18 has a flat portion 41 extending parallel with the upper main surface of the gate drive substrate 7 and an upright portion 40 coupled to one end of it and vertically standing above the upper main surface of the gate drive substrate 7.

The spacers 37 are interposed between the flat portions 41 of the pair of reinforcing members 18 and the upper main surface of the gate drive substrate 7, thus fixedly coupling the pair of flat portions 41 and the gate drive substrate 7 keeping an interval between them. In the example of FIG. 1, for each flat portion 41, the spacers 37 are spaced from each other and arranged in two positions separated along the direction in which the flat portions 41 extend. The pair of reinforcing members 18 thus function as reinforcing members for preventing the gate drive substrate 7 from curving.

Figure 39:
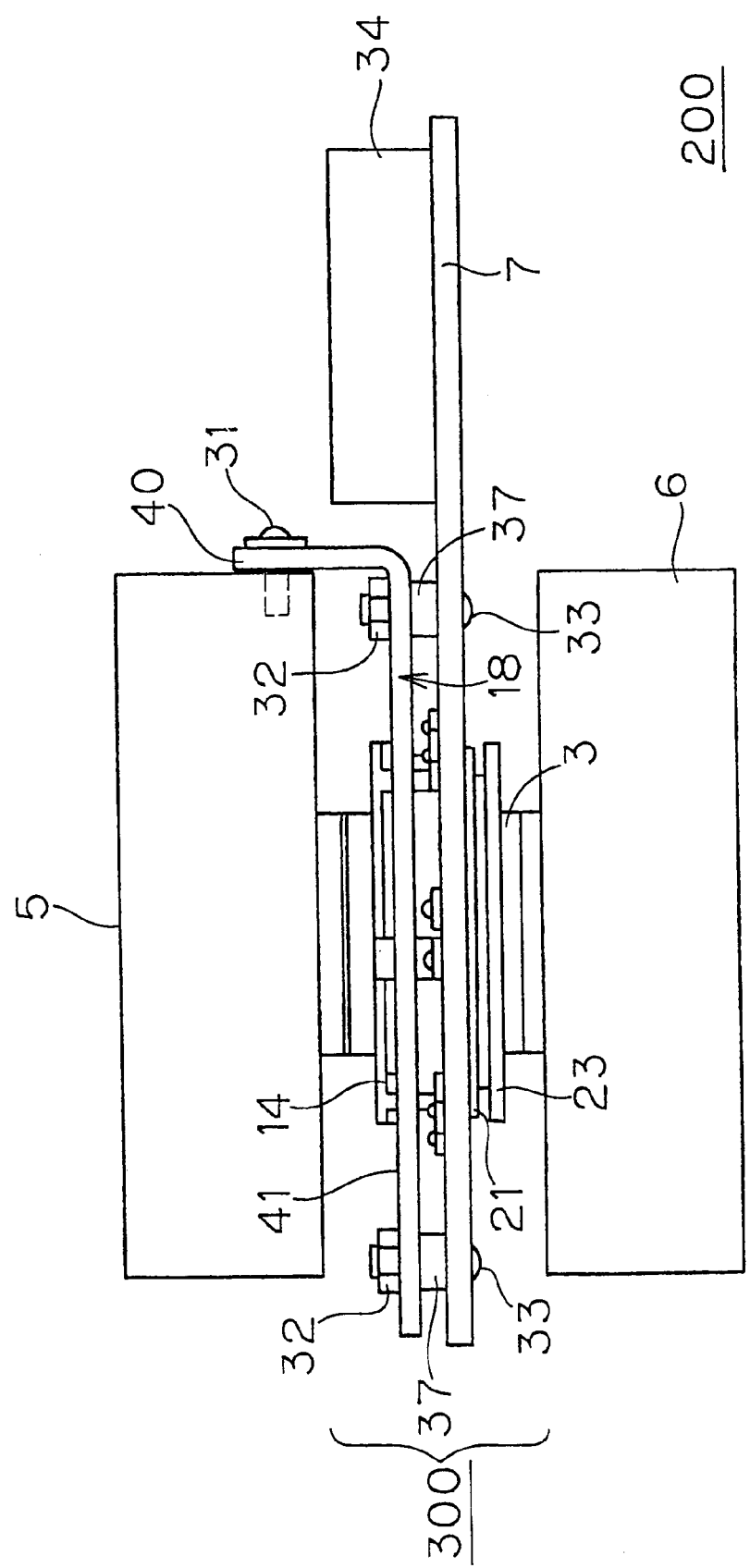
FIG. 39 is a side view of the semiconductor device of FIG. 38.
Figure 40:
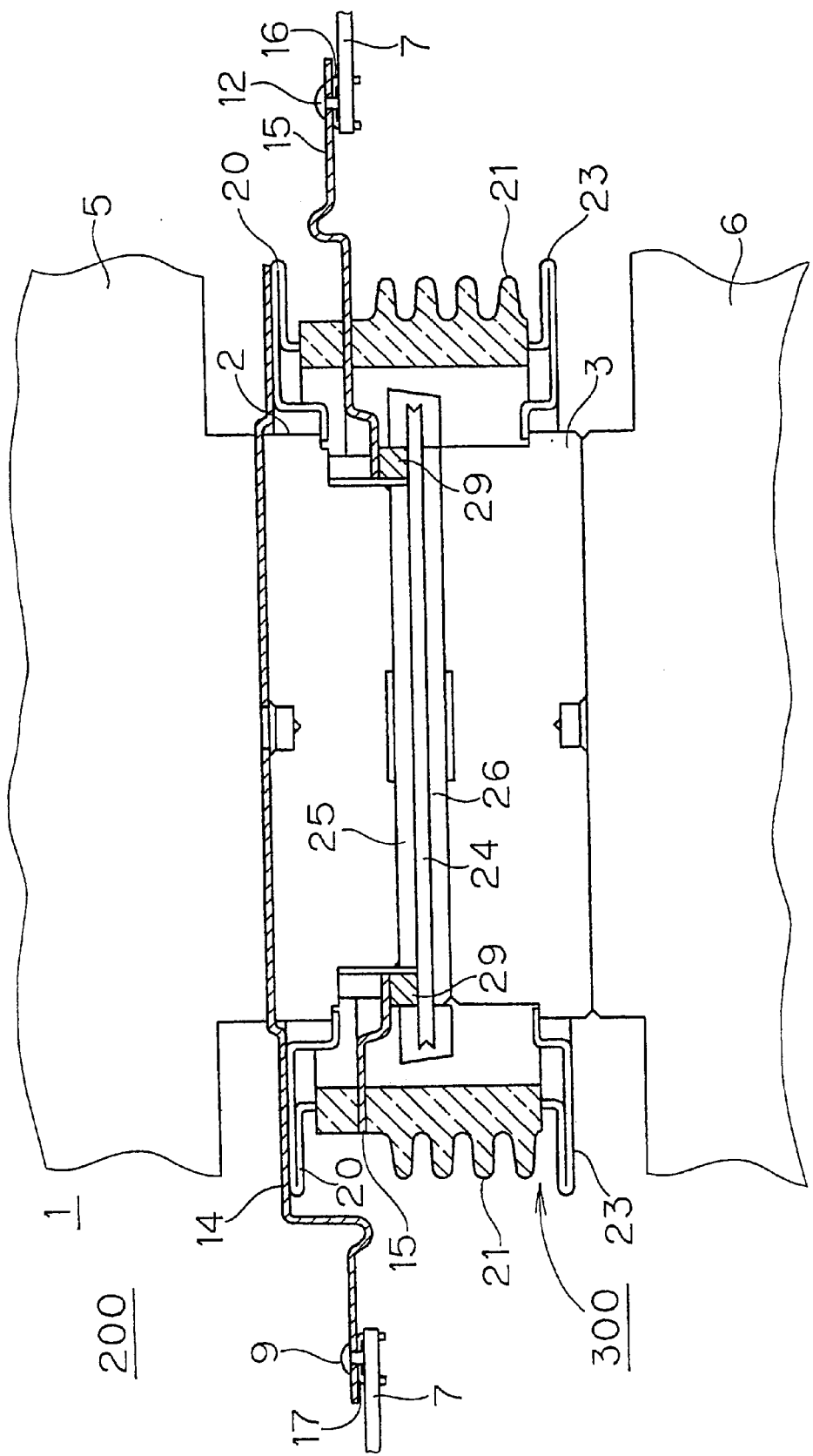
FIG. 40 is a vertical section of the GCT thyristor element of FIG. 38.
Figure 41:
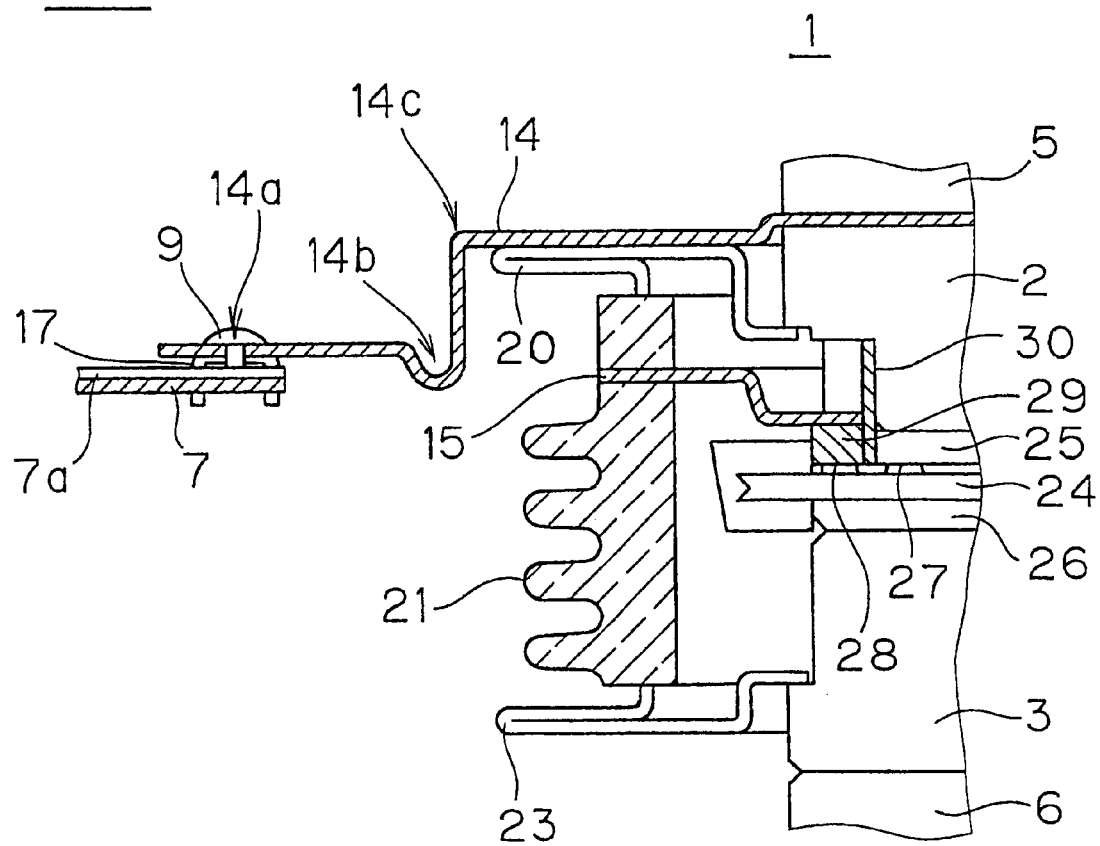
FIGS. 41 and 42 are partial enlarged views of the GCT thyristor element of FIG. 40.
Figure 42:
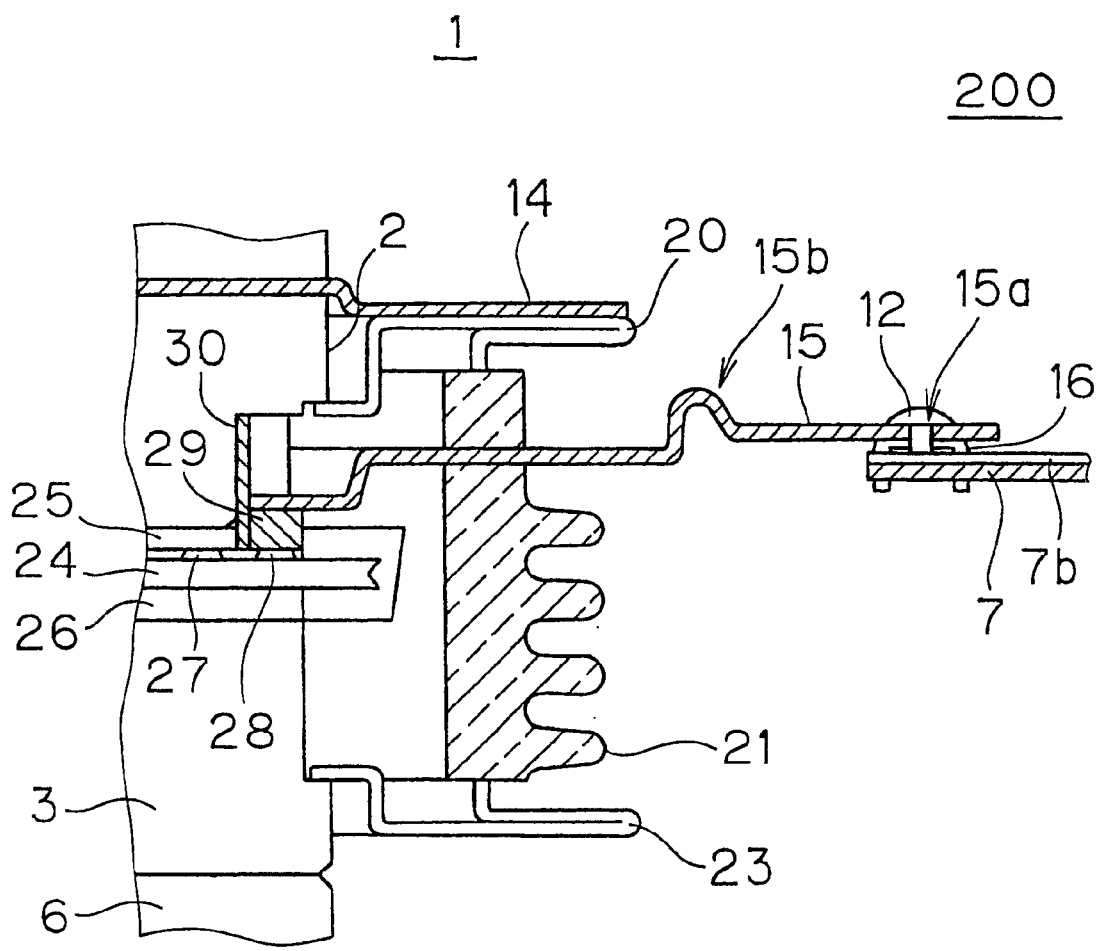
Figure 43:
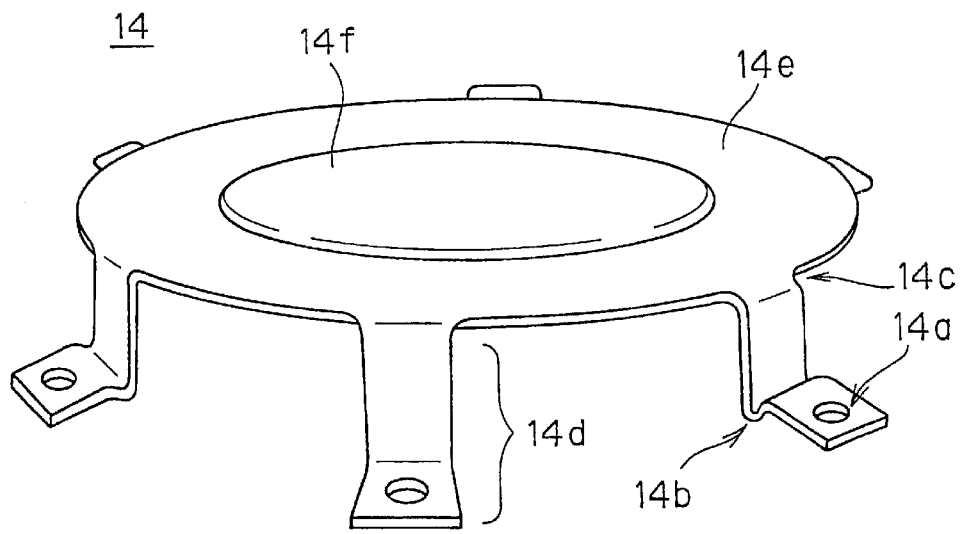
FIG. 43 is a perspective view showing the cathode flange of FIG. 40.
Figure 44:
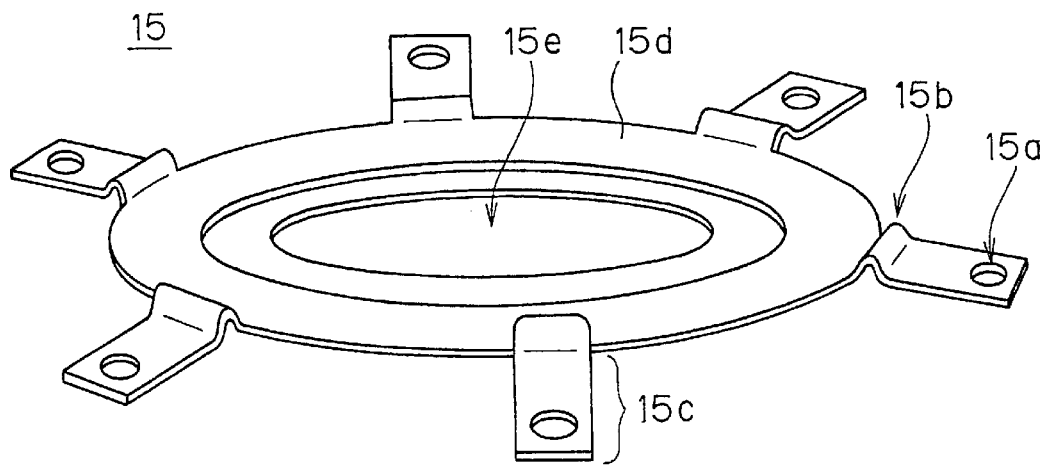
FIG. 44 is a perspective view showing the gate flange of FIG. 40.

The upright portions 40 are detachably fixed on a side wall of the cathode fin electrode 5 with screws 31 not shown (see FIG. 39). The pair of upright portions 40 thus function as a pair of supporting points supporting the gate drive substrate 7 on the cathode fin electrode 5.

The gate drive substrate 7 has an opening 49 in which the GCT thyristor element 1 is inserted; the pair of reinforcing members 18 are positioned so that their flat portions 41 extend in one direction along the periphery of the opening 49, while facing the upper main surface in a pair of positions facing each other across the opening 49. The pair of flat portions 41 are thus arranged parallel with each other.

Preferably, as shown in FIG. 1, the flat portions 41 are arranged to extend along the direction connecting the center of the opening 49, i.e. the center of the GCT thyristor element 1 with the center of the gate drive substrate 7. In the example of FIG. 1, the gate drive substrate 7 is formed in a rectangular shape in plane view and the opening 49 has its center shifted in the lengthwise direction from the center of the gate drive substrate 7. Thus, in the example of FIG. 1, the pair of flat portions 41 are arranged on the opposite sides of the opening 49 in the lateral direction of the gate drive substrate 7 and extend along the lengthwise direction of the gate drive substrate 7.

While the flat portions 41 have two ends in the direction in which they extend, the upright portions 40 are coupled to respective flat portions 41 on the side closer to the center of the gate drive substrate 7. While the pair of upright portions 40 serve as first and second supporting points to support the gate drive substrate 7 on the cathode fin electrode 5, positioning these supporting points closer to the center of the gate drive substrate 7 suppresses moments produced by vibrations around the pair of upright portions 40. This more effectively suppresses the resonance phenomenon.

The gate drive substrate 7 further comprises an electrically insulating spacer 118 fixed thereon. Also, the cathode fin electrode 5 further comprises an engaging member 119 fixed on its bottom (i.e. on its surface which faces to the upper main surface of the gate drive substrate 7); the engaging member 119 can be detachably engaged with the spacer 118. Seen from the opening 49, the spacer 118 is positioned on the side opposite to the center of the gate drive substrate 7.

Figure 2:
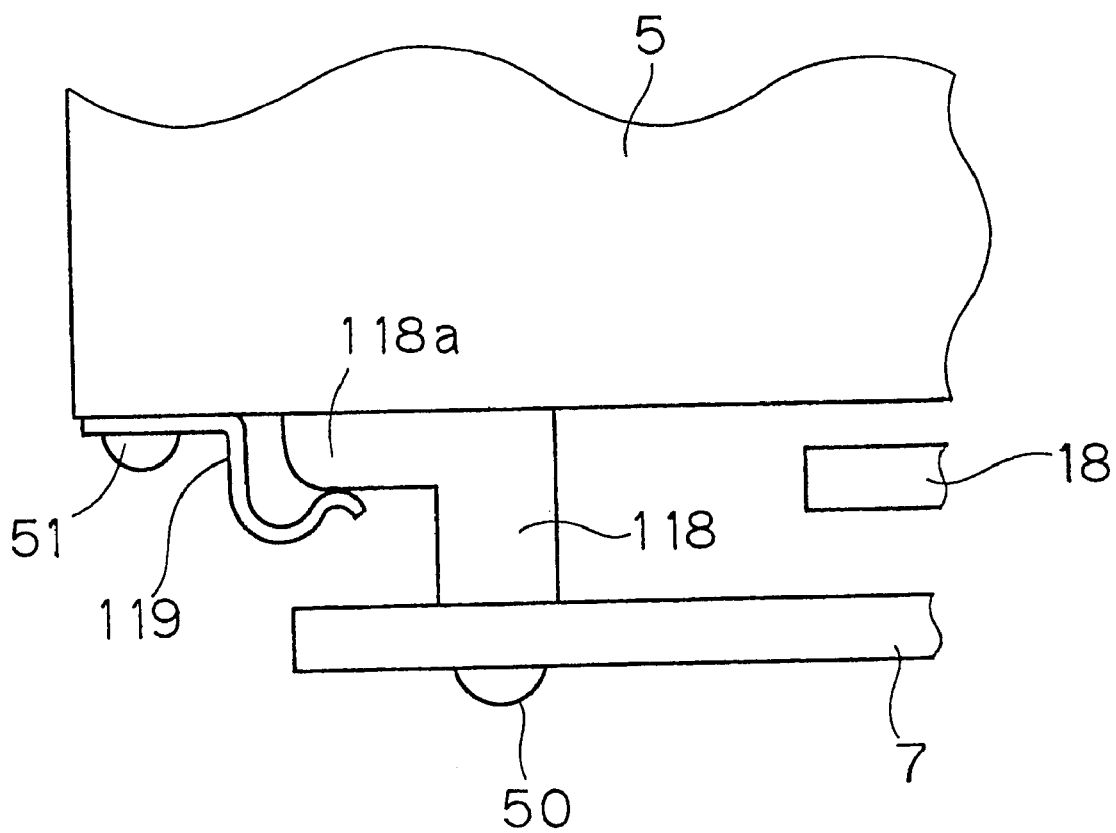
FIG. 2 is a partial side view of the semiconductor device of FIG. 1 seen from the direction A.

FIG. 2 is a partial side view of the semiconductor device 201 seen from the direction A in FIG. 1, where the spacer 118 and engaging member 119 are shown in an enlarged manner. The bottom of the spacer 118 is fastened on the upper main surface of the gate drive substrate 7 with screws 50 and its top surface abuts on the bottom of the cathode fin electrode 5 to hold the interval between the cathode fin electrode 5 and the gate drive substrate 7. The spacer 118 comprises, on its top, a projection 118a which projects away from the upright portions 40 along the direction in which the reinforcing members 18 extend.

The engaging member 119 is made of a metal plate having good elasticity and is fastened on the bottom of the cathode fin electrode 5 with screws 51. The engaging member 119 detachably engages with the projection 118a with an elastic recovery force to press the projection 118a against the cathode fin electrode 5. The engaging member 119 has at its end a guiding part (R-shaped part) which is curved at a curvature toward the gate drive substrate 7 so that the projection 118a can be attached/detached easily.

As described so far, the spacer 118 and the engaging member 119 serve as a fixing member for detachably fixing the gate drive substrate 7 to the cathode fin electrode 5. The fixing member is arranged to surround the opening 49 together with the pair of upright portions 40. The fixing member and the pair of reinforcing members 18 function as supporting members for supporting the gate drive substrate 7 on the cathode fin electrode 5 at three or more supporting points arranged to surround the opening 49.

Specifically, the semiconductor device 201 comprises, in addition to the pair of upright portions 40 as the first and second supporting points, the projection 118a as the third supporting point, so that the gate drive substrate 7 is stably supported, without freedom to rotate, on the cathode fin electrode 5 at the three supporting points surrounding the opening 49. Thus, rotating moment is not produced around each supporting point even in an environment in which the semiconductor device 201 is subjected to vibrations in use, so that resonance of the gate drive substrate 7 can be more effectively suppressed. Thus, the semiconductor device 201 provides more excellent vibration resistance than the semiconductor device 200.

The elastic recovery force of the engaging member 119 is appropriately set for this purpose on the basis of the weight of the GDU 301 and vibrating conditions. For example, when the GDU 301 is about 1,000 g in weight, the elastic recovery force is satisfactorily set to 2 to 3 Kgf.

In the assembly process of the semiconductor device 201 by attaching the GDU 301 to the cathode fin electrode 5, the projection 118a is first inserted into the engaging member 119 to fix one end of the GDU 301 to the cathode fin electrode 5. Next, the pair of upright portions 40 are fastened to the side wall of the cathode fin electrode 5 with the screws 31 (see FIG. 39). The GDU 301 can be fixed to the cathode fin electrode 5 through this simple process.

Figure 3:
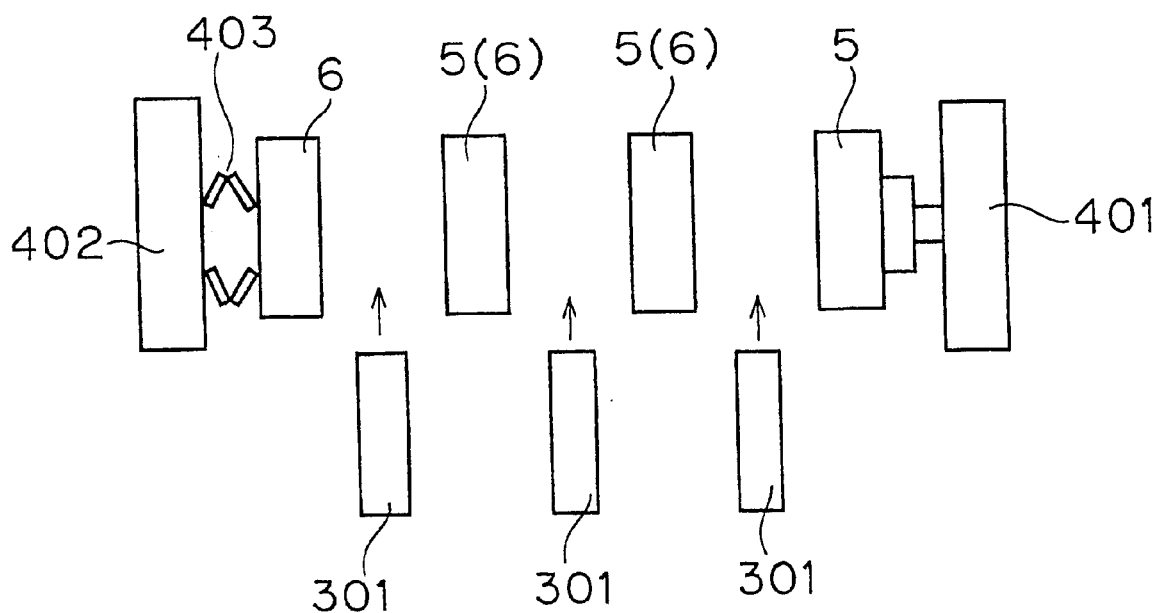
FIG. 3 is an explanation diagram showing a process of assembling the semiconductor device of FIG. 1.

As described above, the semiconductor device 201 can be easily assembled by inserting attachment. The inserting attachment means a method in which, as schematically shown in FIG. 3, the semiconductor device 201 (and a stacked unit comprising a plurality of semiconductor devices 201) is assembled by inserting GDUs 301 sideways into gaps between cathode fin electrodes 5 and anode fin electrodes 6. Generally, as shown in FIG. 3, a plurality of GDUs 301 are interposed between cathode fin electrodes 5 and anode fin electrodes 6 and the entire structure is pressed by spring 403 between a pair of stack plates 401 and 402.

A fin electrode sandwiched between adjacent GDUs 301 functions as a cathode fin electrode 5 for one GDU 301 and functions as an anode fin electrode 6 for the other GDU 301. The cathode fin electrodes 5 and anode fin electrodes 6 serve to scatter and dissipate loss heat generated in the presence of large current.

The semiconductor device 201, which is capable of easy inserting attachment, provides improved maintenance work efficiency. Specifically, the GDUs 301 can be detached for maintenance just by releasing the pressing force of the stack plates 401 and 402.

Semiconductor devices capable of the inserting attachment, like the semiconductor device 201, are also capable of stacking attachment as described in the fifth preferred embodiment.

Second Preferred Embodiment

Figure 4:
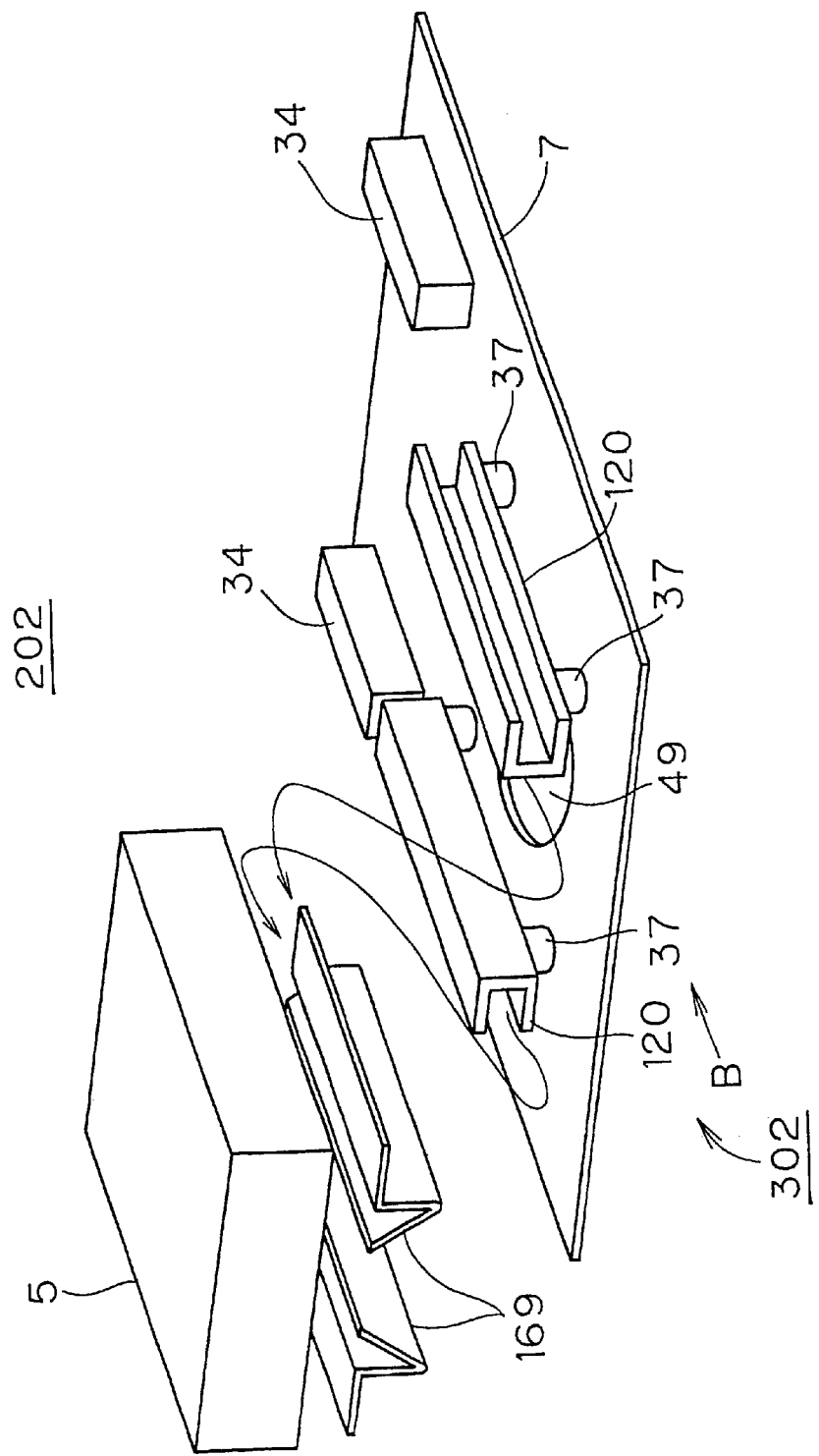
FIG. 4 is a perspective view showing a semiconductor device according to a second preferred embodiment.

FIG. 4 is a perspective view schematically showing a semiconductor device 202 according to a second preferred embodiment. As well as the semiconductor device 201 of the first preferred embodiment, the semiconductor device 202 is constructed so that it can be assembled by the inserting attachment. The GDU 302 corresponds to the part of the semiconductor device 202 excepting the cathode fin electrode 5.

The semiconductor device 202 comprises, in place of the pair of reinforcing members 18 of the semiconductor device 201, a pair of reinforcing members 120 interposed between the bottom of the cathode fin electrode 5 and the upper main surface of the gate drive substrate 7 and fixed to the upper main surface of the gate drive substrate 7 with electrically insulating spacers 37 interposed therebetween. The reinforcing members 120, which are preferably made of a metal, extend in parallel with the upper main surface of the gate drive substrate 7.

The spacers 37 are interposed between the pair of reinforcing members 120 and the upper main surface of the gate drive substrate 7 to fixedly couple the pair of reinforcing members 120 and the gate drive substrate 7 at an interval. In the example of FIG. 4, for each reinforcing member 120, the spacers 37 are arranged in two positions separated in the direction in which the reinforcing member 120 extends. Like the pair of reinforcing members 18 of the semiconductor device 201, the pair of reinforcing members 120 thus function as reinforcing members to prevent the gate drive substrate 7 from curving.

Like the pair of flat portions 41 of the semiconductor device 201, the pair of reinforcing members 120 are positioned in a pair of positions facing across the opening 49 and extend, facing the upper main surface, in one direction along the periphery of the opening 49. The pair of reinforcing members 120 are thus provided parallel with each other. Preferably, like the pair of flat portions 41 of the semiconductor device 201, the reinforcing members 120 extend in the direction connecting the center of the opening 49 with the center of the gate drive substrate 7.

The pair of reinforcing members 120 are interposed between the bottom of the cathode fin electrode 5 and the upper main surface of the gate drive substrate 7, with their top surfaces in close contact with the bottom of the cathode fin electrode 5. The cathode fin electrode 5 has a pair of engaging members 169 fixed on its bottom; these engaging members 169 detachably engage with the top of the reinforcing members 120 to support the gate drive substrate 7 on the cathode fin electrode 5.

Figure 5:
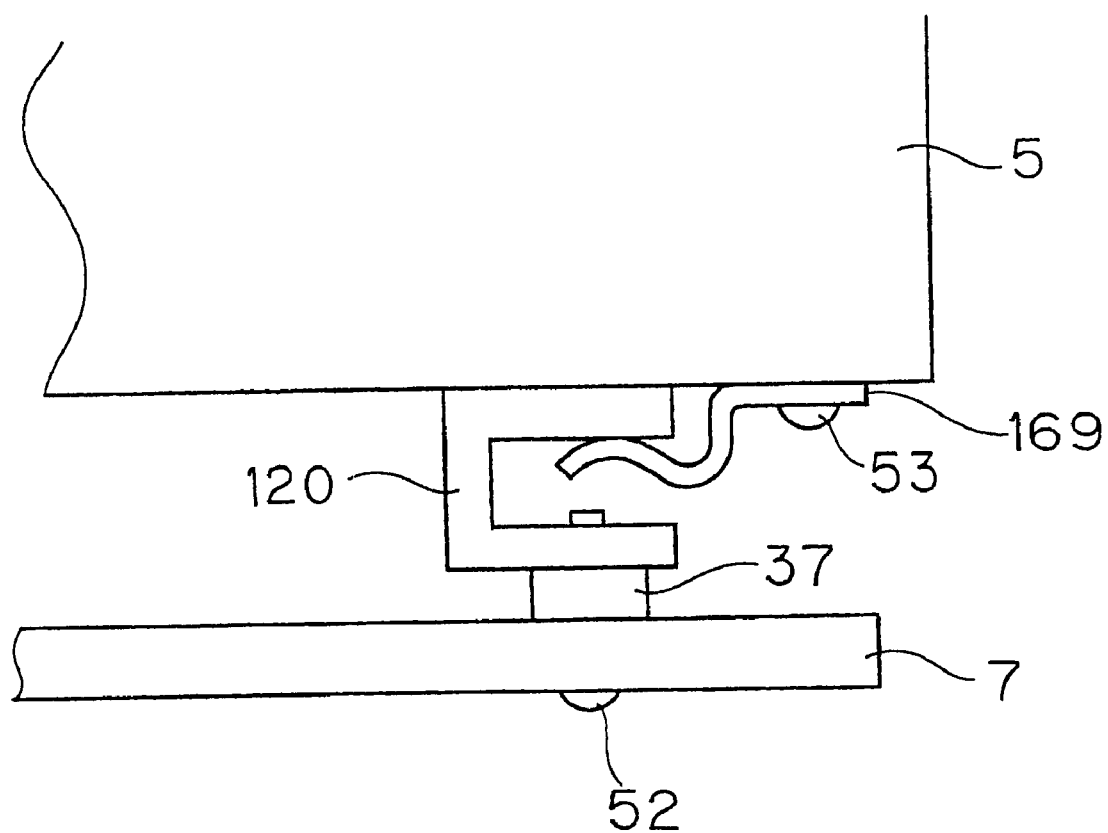
FIG. 5 is a partial side view of the semiconductor device of FIG. 4 seen from the direction B.

FIG. 5 is a partial side view of the semiconductor device 202 seen from the direction B of FIG. 4, which shows one reinforcing member 120 and one engaging member 169 in an enlarged manner. Each reinforcing member 120 is shaped like U (but having angular corners) in section; its bottom is fastened to the upper main surface of the gate drive substrate 7 with screws 52 with the spacers 37 interposed therebetween and its top immediately abuts in surface contact on the bottom of the cathode fin electrode 5 to keep the interval between the cathode fin electrode 5 and the gate drive substrate 7.

The engaging members 169, which are made of a metal plate having good elasticity, are fastened on the bottom of the cathode fin electrode 5 with screws 53. The engaging members 169 are respectively engaged with the top of the reinforcing members 120 with an elastic recovery force and they can be slid in the direction in which the reinforcing members 120 extend, so as to press the top of the reinforcing members 120 against the cathode fin electrode 5.

As described above, the semiconductor device 202 has a pair of reinforcing members 120 fixed in contact with the bottom of the cathode fin electrode 5, so that the gate drive substrate 7 is supported on the cathode fin electrode 5 at supporting points continuously and infinitely distributed along the direction in which the pair of reinforcing members 120 extend. This effectively suppresses the resonance of the gate drive substrate 7.

Further, the pair of engaging members 169 and the pair of reinforcing members 120 can be engaged with each other with an elastic recovery force so that they can slide relative to each other in the direction in which they extend. The GDU 302 can thus be attached to the cathode fin electrode 5 just by inserting and sliding the pair of reinforcing members 120 with respect to the pair of engaging members 169 along the direction in which they extend. No extra process, like screwing, is needed after the GDU 302 has been attached to the cathode fin electrode 5. In this way, the semiconductor device 202 can be efficiently assembled by the inserting attachment. This also improves the maintenance work efficiency.

Third Preferred Embodiment

Figure 6:
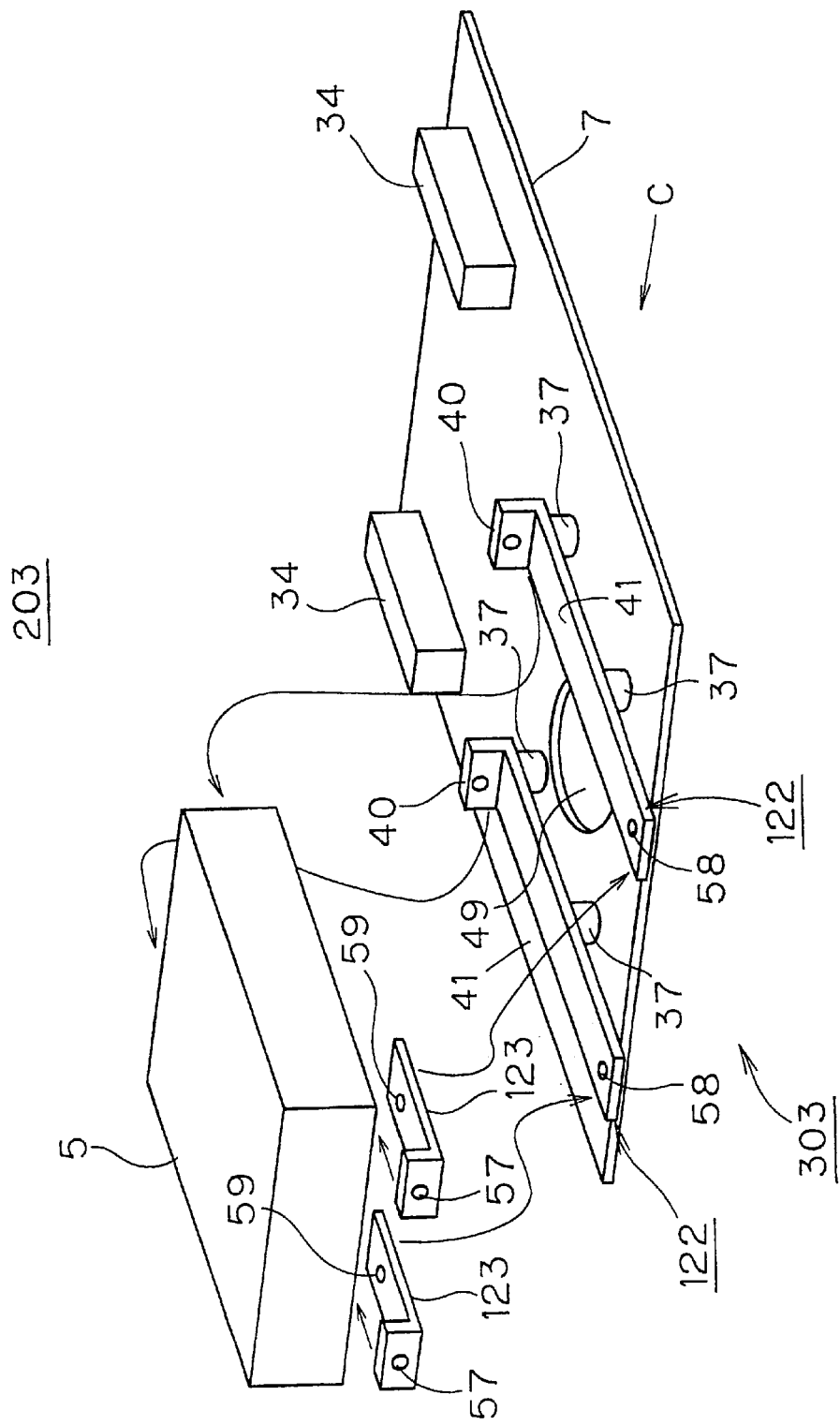
FIG. 6 is a perspective view showing a semiconductor device according to a third preferred embodiment.

FIG. 6 is a perspective view schematically showing a semiconductor device 203 according to a third preferred embodiment. Like the semiconductor device 201 of the first preferred embodiment, the semiconductor device 203 is also constructed to allow the inserting attachment in the assembly process. The GDU 303 corresponds to the part of the semiconductor device 203 excluding the cathode fin electrode 5.

Just as the semiconductor device 200 comprises a pair of reinforcing members 18, the semiconductor device 203 comprises a pair of reinforcing members 122 fixed to the upper main surface of the gate drive substrate 7 with spacers 37 interposed therebetween. Each reinforcing member 122 has a flat portion 41 extending parallel with the upper main surface of the gate drive substrate 7 and an upright portion 40 connected to one end of it and standing vertically above the upper main surface of the gate drive substrate 7.

The spacers 37 are interposed between the pair of flat portions 41 and the upper main surface of the gate drive substrate 7 to fixedly couple the pair of flat portions 41 and the gate drive substrate 7 at an interval. In the example shown in FIG. 6, for each flat portion 41, the spacers 37 are arranged in two positions separated from each other in the direction in which the flat portion 41 extends. The upright portions 40 are detachably fixed to a wall surface of the cathode fin electrode 5 with screws 31 not shown (see FIG. 39).

Like the pair of flat portions 41 of the semiconductor device 201, the pair of flat portions 41 are arranged to extend in one direction along the periphery of the opening 41, while facing the upper main surface in a pair of positions on opposite sides of the opening 49. The pair of flat portions 41 thus extend parallel with each other. Preferably, like the pair of flat portions 41 in the semiconductor device 201, the flat portions 41 extend along the direction connecting the center of the opening 49 with the center of the gate drive substrate 7.

Each flat portion 41 has a fixing portion 123 coupled to its end opposite to the upright portion 40 in the direction in which the flat portion 41 extends. The pair of fixing portions 123 are preferably made of a metal plate bent in the form of L. Each fixing portion 123 has through holes 59 and 57 for insertion of screws in its bottom extending along the flat portion 41 of the reinforcing member 122 and in the protrusion vertically standing above the upper main surface of the gate drive substrate 7.

Figure 7:
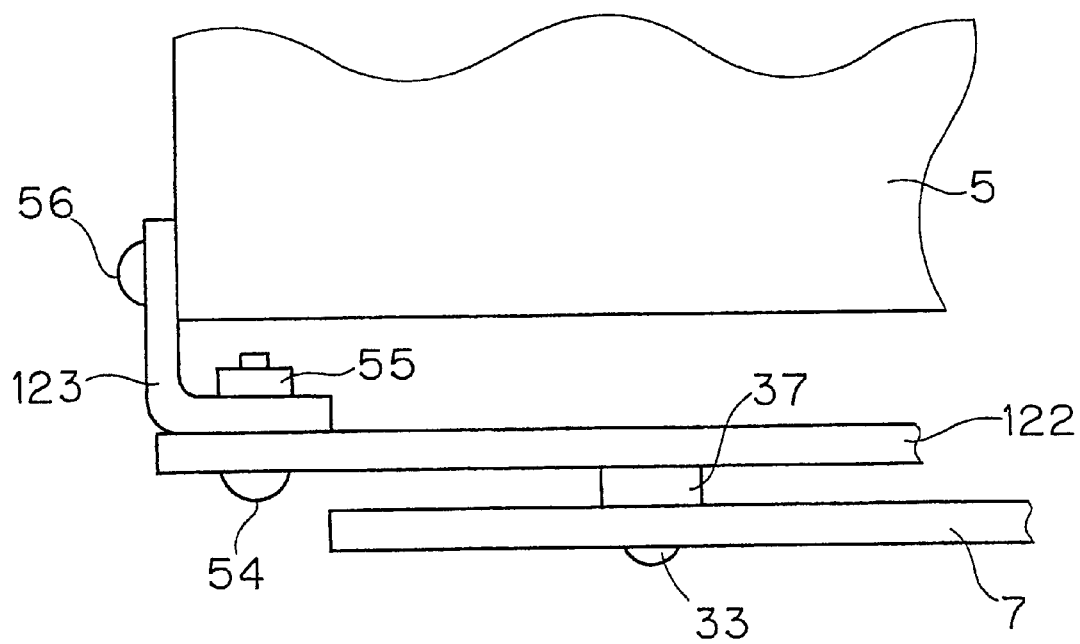
FIG. 7 is a partial side view of the semiconductor device of FIG. 6 seen from the direction C.

FIG. 7 is a partial side view of the semiconductor device 203 seen from the direction C of FIG. 6, where one fixing portion 123 is shown in an enlarged manner. The bottom of the fixing portion 123 is fastened to the flat portion 41 of the reinforcing member 122 with a screw 54 and a nut 55. The protrusion of the fixing portion 123 is fastened to the side wall of the cathode fin electrode 5 with a screw 56. The fixing portion 123 is thus detachably fixed to both of the reinforcing member 122 and the cathode fin electrode 5.

In the semiconductor device 203, as described above, the gate drive substrate 7 is stably supported on the cathode fin electrode 5 without freedom of rotation at the four supporting points arranged to surround the opening 49, i.e. it is supported by the pair of upright portions 40 as the first and second supporting points and also the protrusions of the pair of fixing portions 123 as the third and fourth supporting points. This effectively suppresses the resonance of the gate drive substrate 7. Further, it can be manufactured at low cost since the four supporting points effectively suppressing the resonance phenomenon can be realized just by providing the pair of fixing portions 123 in addition to the pair of reinforcing members 122.

In the process of assembling the semiconductor device 203 by attaching the GDU 303 to the cathode fin electrode 5, the inserting attachment can be achieved by fastening the pair of upright portions 40 to the side wall of the cathode fin electrode 5 with the screws 31 (see FIG. 39) and then fastening the fixing portions 123 to both the reinforcing members 122 and the cathode fin electrode 5. This, at the same time, contributes to improvement of the maintenance work efficiency.

Preferably, as shown in FIG. 6, the ends of the flat portions 41 of the reinforcing members 122 to which the fixing portions 123 are attached protrude beyond the edge of the gate drive substrate 7. This facilitates the process of fixing the fixing portions 123 to the flat portions 41 after the GDU 303 has been inserted between the cathode fin electrode 5 and an anode fin electrode 6 not shown.

Fourth Preferred Embodiment

Figure 8:
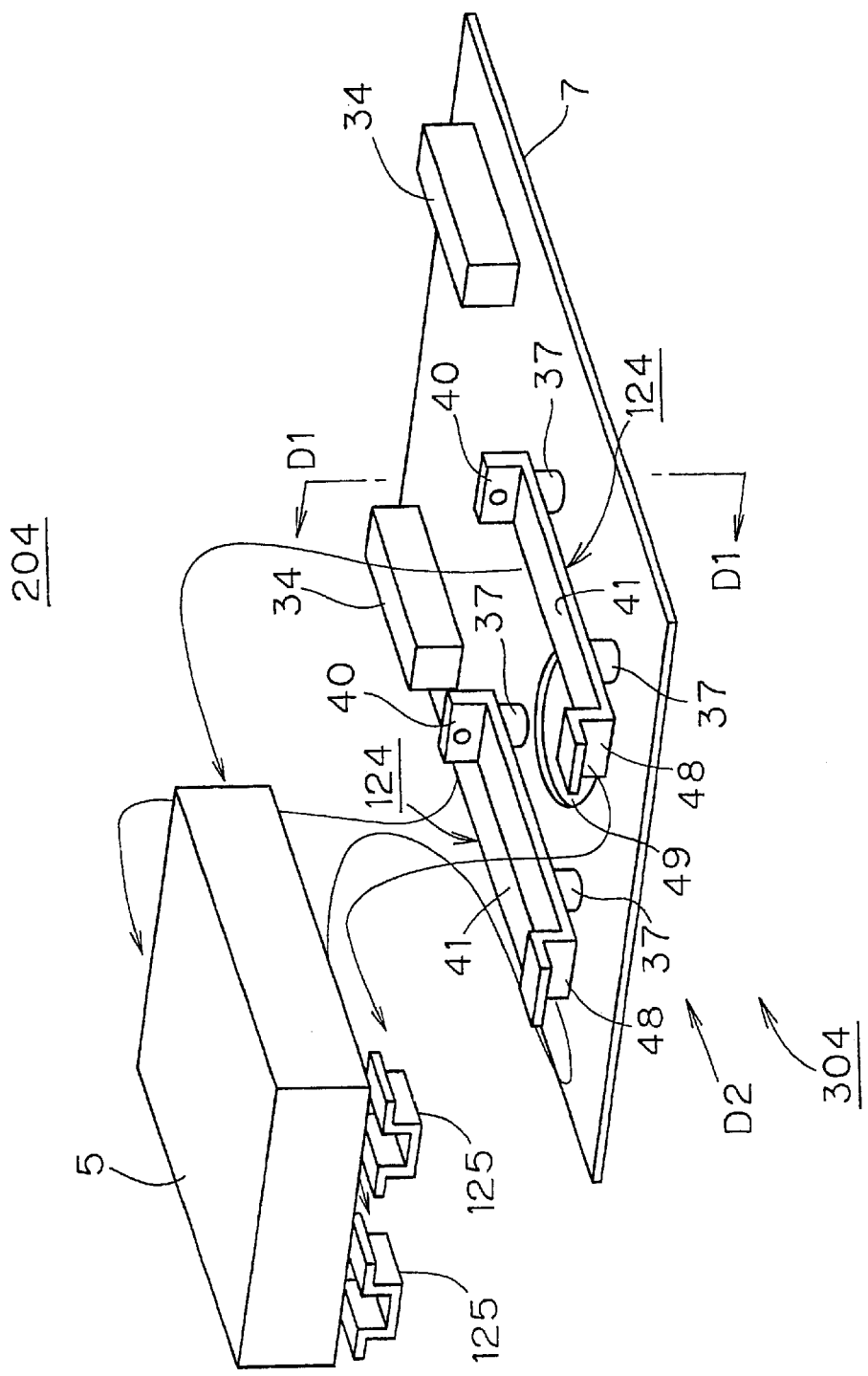
FIG. 8 is a perspective view showing a semiconductor device according to a fourth preferred embodiment.

FIG. 8 is a perspective view schematically showing a semiconductor device 204 according to a fourth preferred embodiment. Like the semiconductor device 201 of the first preferred embodiment, the semiconductor device 204 is constructed to allow the inserting attachment in the assembly process. The GDU 304 corresponds to the part of the semiconductor device 204 excluding the cathode fin electrode 5.

Just as the semiconductor device 200 comprises the pair of reinforcing members 18, the semiconductor device 204 comprises a pair of reinforcing members 124 fixed to the upper main surface of the gate drive substrate 7 with the spacers 37 interposed therebetween. Each reinforcing member 124 has a flat portion 41 extending parallel with the upper main surface of the gate drive substrate 7 and an upright portion 40 coupled to one end thereof and vertically standing above the upper main surface of the gate drive substrate 7.

The spacers 37 are interposed between the pair of flat portions 41 and the upper main surface of the gate drive substrate 7 to fixedly couple the pair of flat portions 41 and the gate drive substrate 7 at an interval. In the example of FIG. 8, for each flat portion 41, the spacers 37 are arranged in two positions separated in the direction in which the flat portions 41 extend. The upright portions 40 are detachably fixed to a side wall of the cathode fin electrode 5 with screws 31 not shown (FIG. 39). The pair of flat portions 41 are positioned and directed as described in the third preferred embodiment.

Each flat portion 41 has a fixing portion 48 which is integrally coupled to it (as one piece) at the end opposite to the upright portion 40 in the direction in which it extends. The pair of fixing portions 48 are bent in the form of L and they each comprise a protrusion which protrudes away from the upright portions 40 in the direction in which the flat portions 41 extend. Engaging members 125 are fixed on the bottom of the cathode fin electrode 5 and are detachably engaged with the fixing portions 48.

Figure 9:
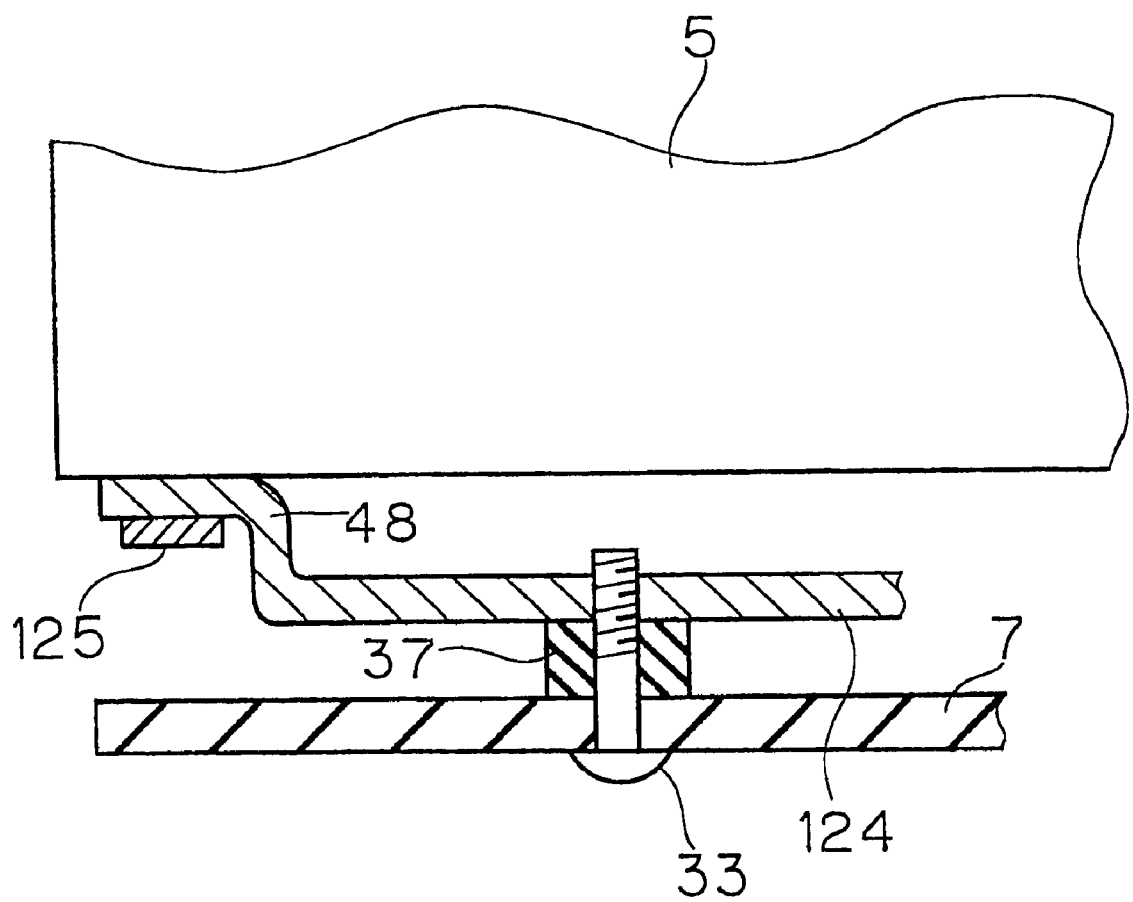
FIG. 9 is a partial section of the semiconductor device of FIG. 8 taken along the line D1—D1.
Figure 10:
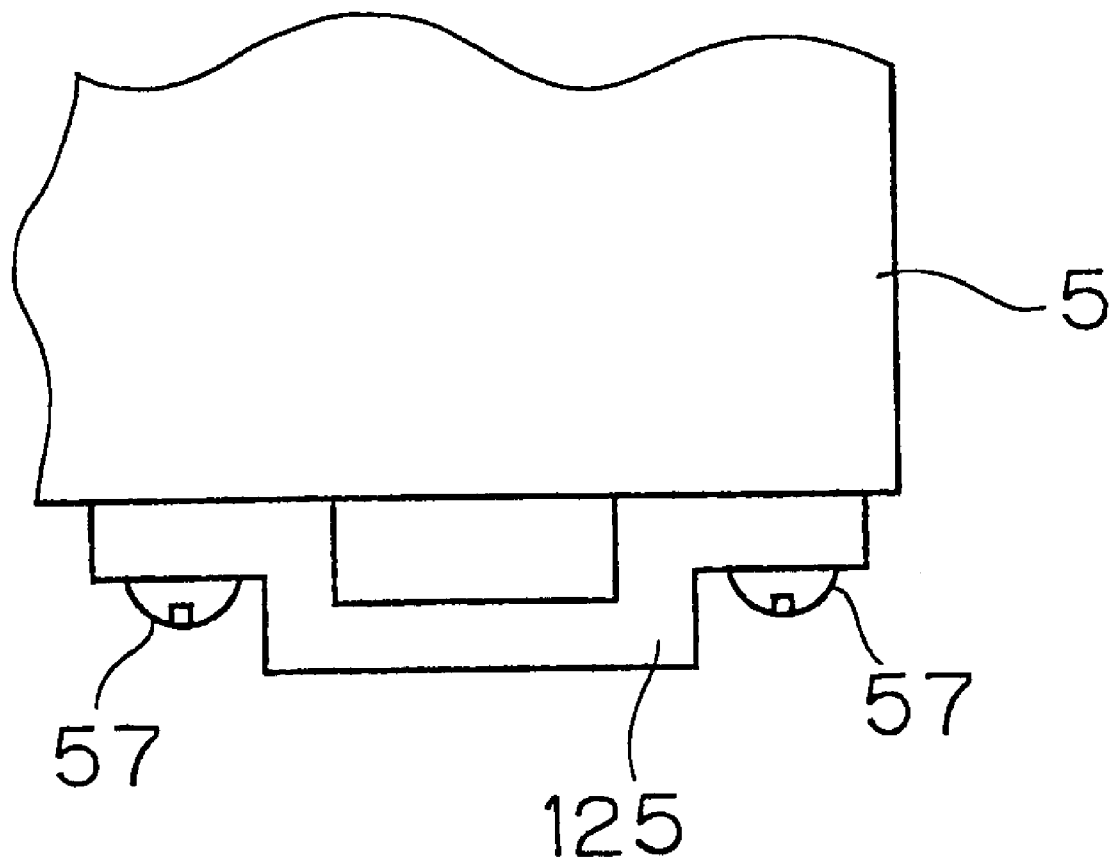
FIG. 10 is a partial side view of the semiconductor device of FIG. 8 seen from the direction D2.

FIG. 9 is a partial section of the semiconductor device 204 taken along the line D1—D1 of FIG. 8, where one fixing portion 48 and one engaging member 125 are shown in an enlarged manner. FIG. 10 is a partial side view of the semiconductor device 204 seen from the direction D2 of FIG. 8, which shows one engaging member 125 in an enlarged manner. The engaging members 125 are fastened to the bottom of the cathode fin electrode 5 with screws 57. The protrusions of the fixing portions 48 are respectively inserted in the gaps between the engaging members 125 and the cathode fin electrode 5 and thus fixed to the cathode fin electrode 5 in contact with the bottom of the cathode fin electrode 5.

In the semiconductor device 204, as described above, the gate drive substrate 7 is stably supported on the cathode fin electrode 5 at the four supporting points arranged to surround the opening 49, i.e. at the pair of upright portions 40 as the first and second supporting points and also the protrusions of the pair of fixing portions 48 as the third and fourth supporting points. This effectively suppresses the resonance of the gate drive substrate 7.

In the process of assembling the semiconductor device 204 by attaching the GDU 304 to the cathode fin electrode 5, first, the protrusions of the pair of fixing portions 48 are inserted into the pair of engaging members 125 to fix one end of the GDU 304 to the cathode fin electrode 5. Subsequently the pair of upright portions 40 are fastened on the side wall of the cathode fin electrode 5 with screws 31 (see FIG. 39). The GDU 304 can be fixed to the cathode fin electrode 5 through this simple process. The semiconductor device 204 can thus be assembled by the inserting attachment. This at the same time contributes to improvement of the maintenance work efficiency.

Fifth Preferred Embodiment

Figure 11:
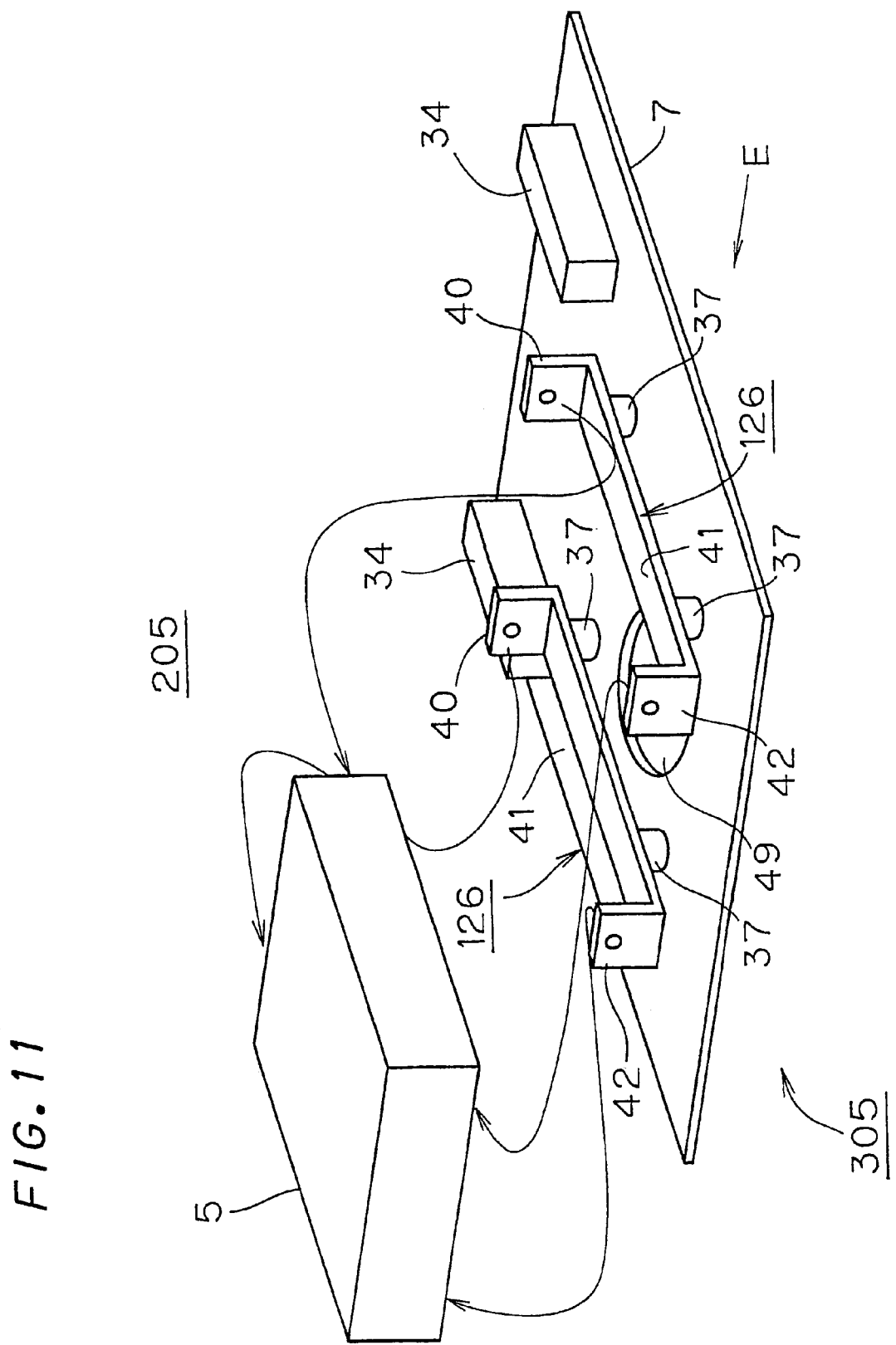
FIG. 11 is a perspective view showing a semiconductor device according to a fifth preferred embodiment.

FIG. 11 is a perspective view schematically showing a semiconductor device 205 according to a fifth preferred embodiment. The GDU 305 corresponds to the part of the semiconductor device 205 excluding the cathode fin electrode 5.

The semiconductor device 205 characteristically differs from the semiconductor device 203 of the third preferred embodiment in that it comprises reinforcing members 126 in place of the reinforcing members 122. Each reinforcing member 126 has a fixing portion 42 integrally coupled (as one piece) to the flat portion 41 in place of the detachable fixing portion 123 (FIG. 7). The fixing portions 42 are formed in the same way as the upright portions 40. The reinforcing members 126 can therefore be easily formed by bending a metal plate into a shape like U (but having angular corners). Like the upright portions 40, the fixing portions 42 each have a through hole for insertion of a screw. The pair of flat portions 41 are positioned and directed as described in the third preferred embodiment.

Figure 12:
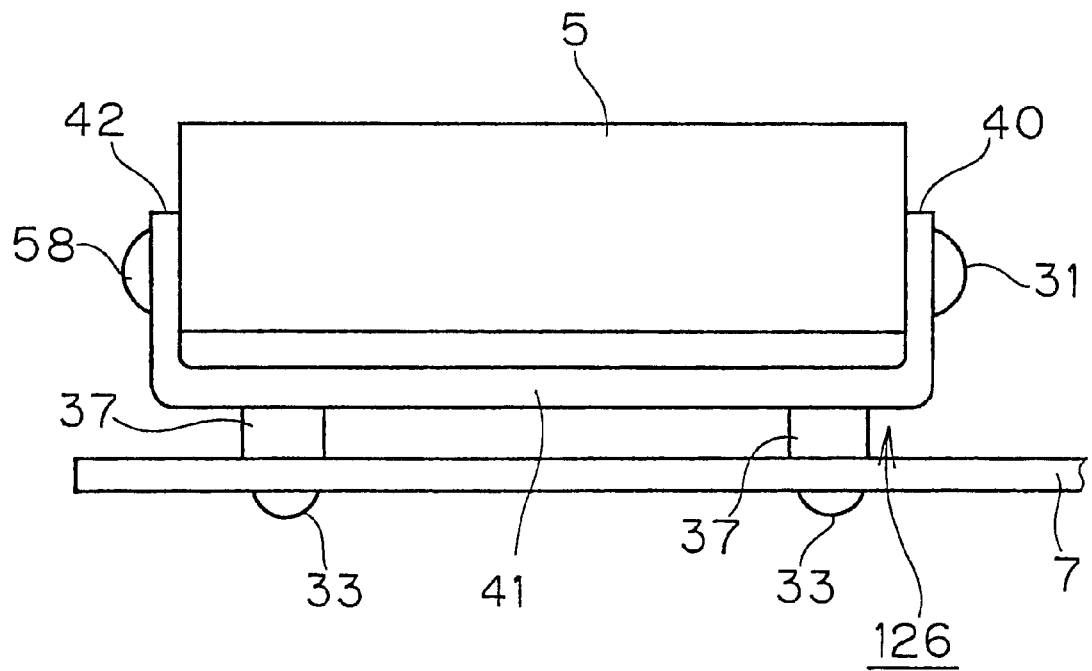
FIG. 12 is a partial side view of the semiconductor device of FIG. 11 seen from the direction D2.

FIG. 12 is a partial side view of the semiconductor device 205 seen from the direction E of FIG. 11, which shows one reinforcing member 126 in an enlarged manner. The upright portion 40 and the fixing portion 42 are fastened on a pair of opposite side walls of the cathode fin electrode 5 with screws 31 and 58.

In the semiconductor device 205, as in the semiconductor device 203, the gate drive substrate 7 can thus be stably supported on the cathode fin electrode 5 at four supporting points arranged to surround the opening 49. This more effectively suppresses the resonance of the gate drive substrate 7. Further, it can be manufactured at low cost since the four supporting points for effectively suppressing the resonance phenomenon can be realized only with the pair of reinforcing members 126.

Figure 13:
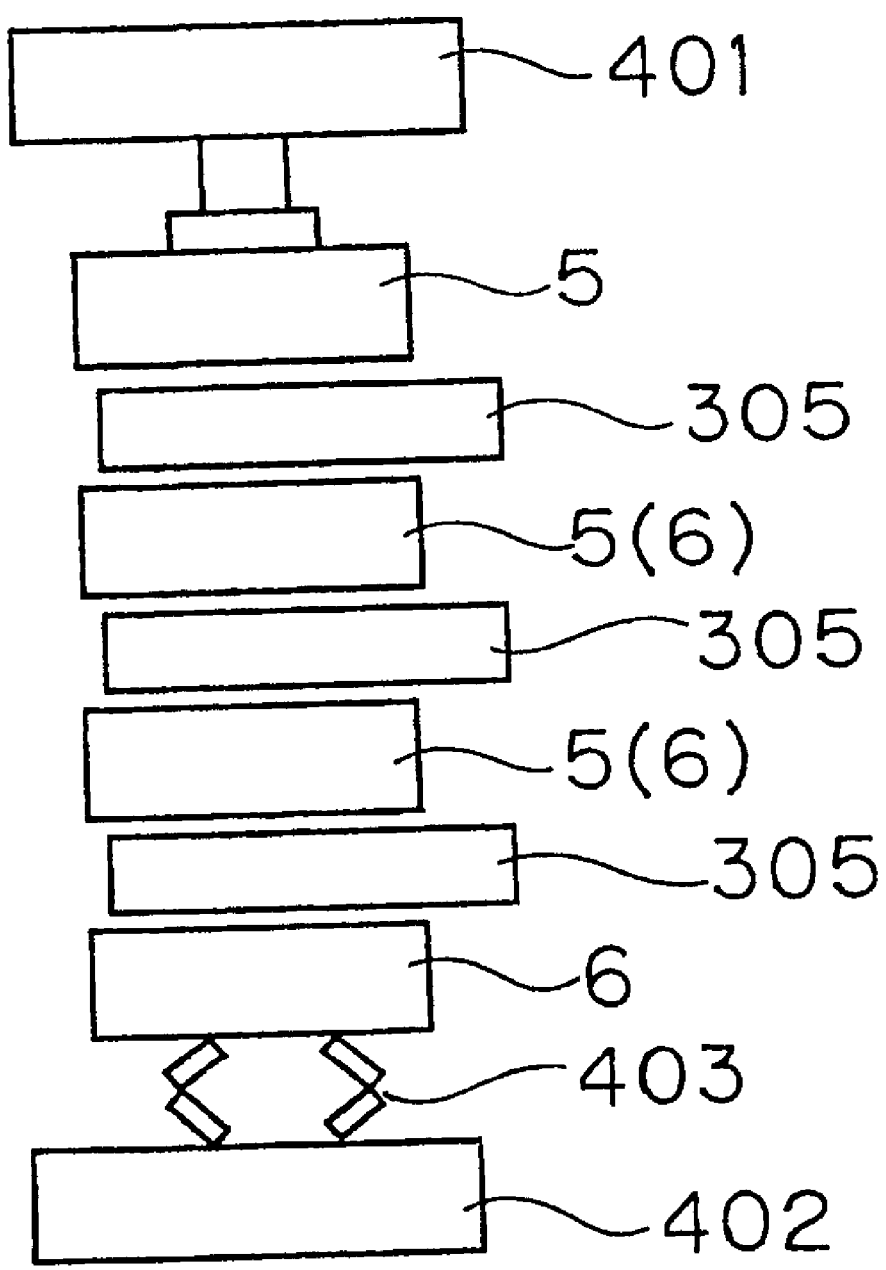
FIG. 13 is an explanation diagram showing a process of assembling the semiconductor device of FIG. 11.

Stacking attachment can be used in the process of assembling the semiconductor device 205 by attaching the GDU 305 to the cathode fin electrode 5. That is to say, the semiconductor device 205 is suitable for assembly by stacking attachment. The stacking attachment means a method in which, as schematically shown in FIG. 13, the semiconductor device 205 (and a stacked unit of a plurality of semiconductor devices 205) is assembled by stacking GDUs 305 and cathode fin electrodes 5 (or anode fin electrodes 6) on top of each other. After the components have been stacked, the stacked semiconductor devices 205 are pressed through spring 403 between a pair of stacking plates 401 and 402.

Sixth Preferred Embodiment

Figure 14:
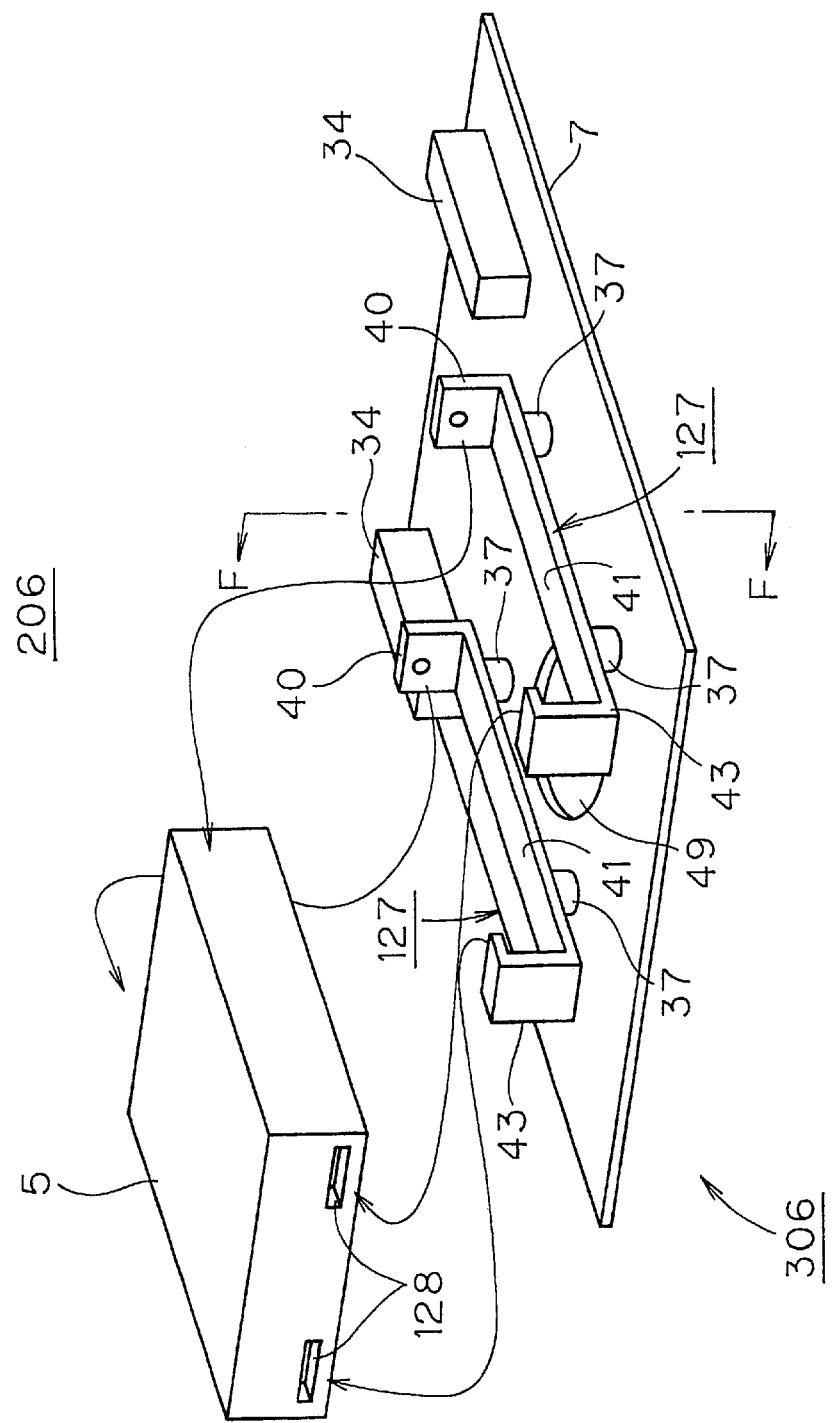
FIG. 14 is a perspective view showing a semiconductor device according to a sixth preferred embodiment.

FIG. 14 is a perspective view schematically showing a semiconductor device 206 according to a sixth preferred embodiment. Like the semiconductor device 205 of the fifth preferred embodiment, the semiconductor device 206 is constructed to allow the stacking attachment in the assembly process. The GDU 306 corresponds to the part of the semiconductor device 206 excluding the cathode fin electrode 5.

The semiconductor device 206 characteristically differs from the semiconductor device 205 of the fifth preferred embodiment in that it comprises reinforcing members 127 in place of the reinforcing members 126. Each reinforcing member 127 has a fixing portion 43 in place of the fixing portion 42. Each fixing portion 43 is integrally coupled to the flat portion 41 and bent in the form L to form at its top a protrusion protruding toward the upright portion 40 along the direction in which the flat portion 41 extends. The reinforcing members 127 can easily be formed by bending a metal plate, for example. The cathode fin electrode 5 has a pair of recesses 128 formed on its side wall opposite to the side wall on which the upright portions 40 are fastened; the protrusions of the pair of fixing portions 43 can be inserted into the pair of recesses 128.

Figure 15:
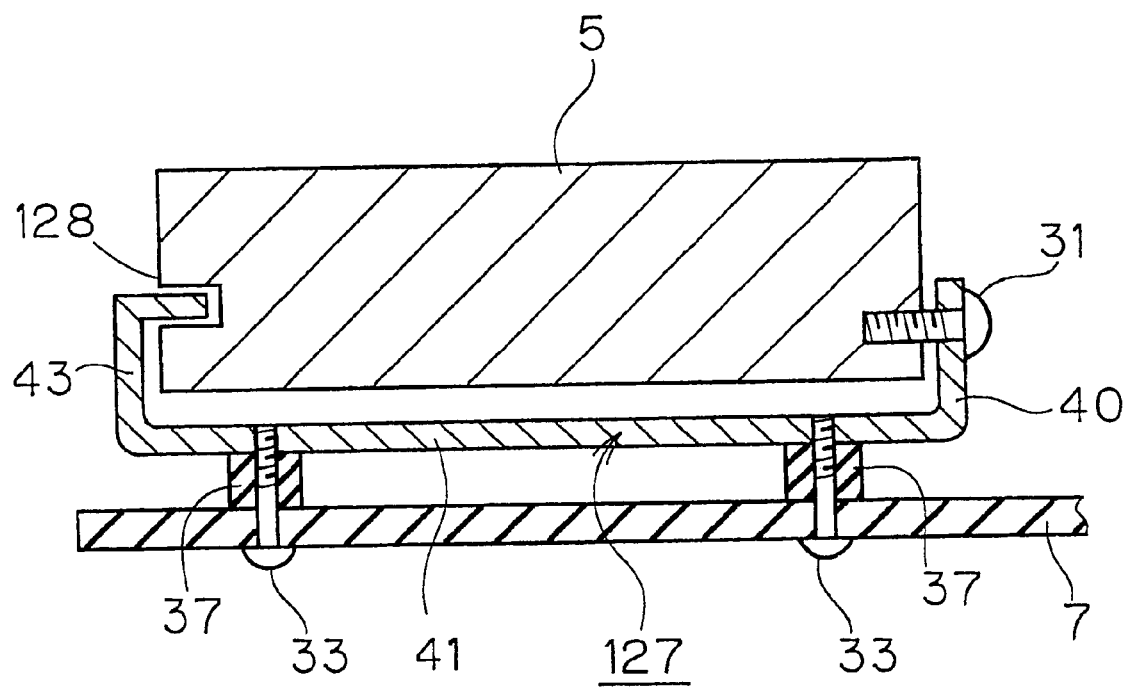
FIG. 15 is a partial section of the semiconductor device of FIG. 14 taken along the line F—F.

FIG. 15 is the partial section of the semiconductor device 206 taken along the line F—F of FIG. 14, which shows one reinforcing member 127 in an enlarged manner. The upright portion 40 is fastened to the cathode fin electrode 5 with a screw 31 and the protrusion of the fixing portion 43 is inserted in the recess 128 and thus fixed to the cathode fin electrode 5. Thus, in the semiconductor device 206, the gate drive substrate 7 is stably supported on the cathode fin electrode 5 at the four supporting points arranged to surround the opening 49, i.e. at the pair of upright portions 40 as the first and second supporting points and also the protrusions of the pair of fixing portions 43 as the third and fourth supporting points. This effectively suppresses the resonance of the gate drive substrate 7.

The stacking attachment can be used in the process of assembling the semiconductor device 206 by attaching the GDU 306 to the cathode fin electrode 5. Specifically, the protrusions of the pair of fixing portions 43 are first inserted into the pair of recesses 128 and then the pair of upright portions 40 are fastened to the cathode fin electrode 5 with the screws 31. The assembly process is simple since screwing is required only to fix the pair of upright portions 40.

Seventh Preferred Embodiment

Figure 16:
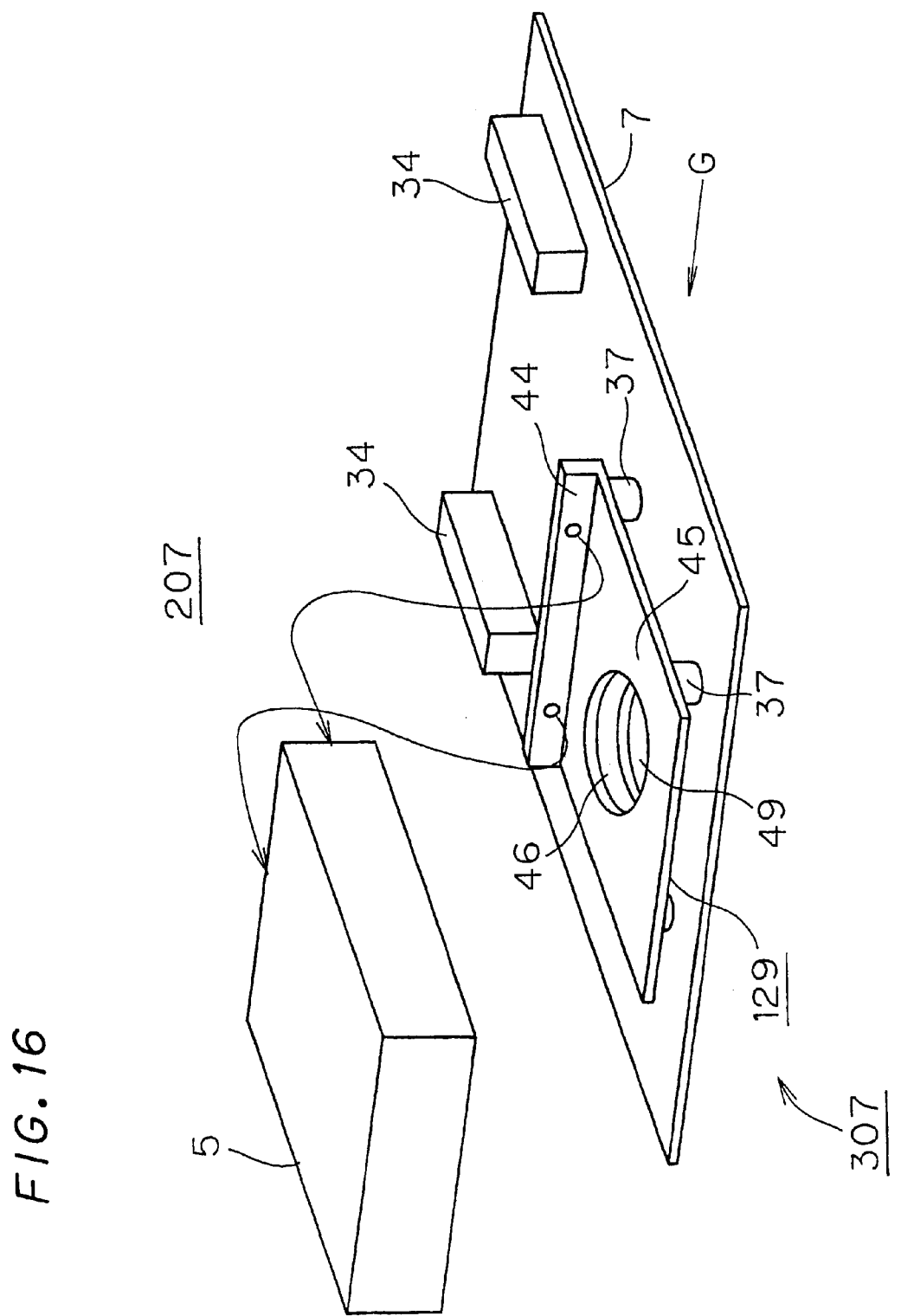
FIG. 16 is a perspective view showing a semiconductor device according to a seventh preferred embodiment.
Figure 17:
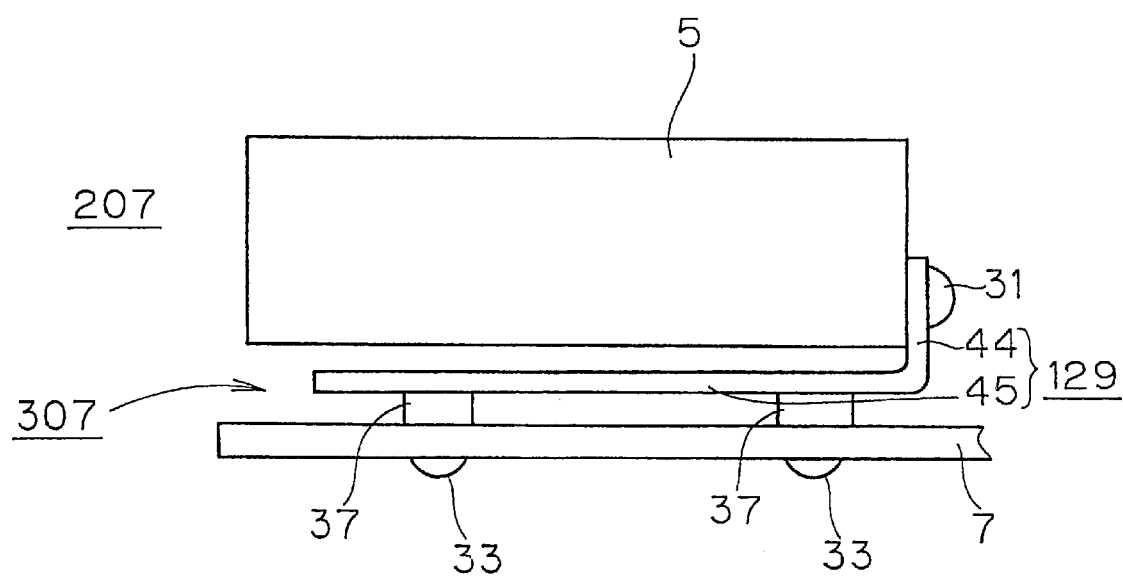
FIG. 17 is a partial side view of the semiconductor device of FIG. 16 seen from the direction G.

FIG. 16 is a perspective view schematically showing a semiconductor device 207 according to a seventh preferred embodiment. FIG. 17 is a partial side view of the semiconductor device 207 seen from the direction G of FIG. 16. Like the semiconductor device 201 of the first preferred embodiment, the semiconductor device 207 is constructed to allow the inserting attachment in the assembly process. The GDU 307 corresponds to the part of the semiconductor device 207 excluding the cathode fin electrode 5.

The semiconductor device 207 comprises, in place of the pair of reinforcing members 18 of the semiconductor device 201, a reinforcing member 129 fixed to the upper main surface of the gate drive substrate 7 with the electrically insulating spacers 37 provided therebetween. The reinforcing member 129 has a plate-like flat portion 45 arranged to cover an area surrounding the opening 49 in the upper main surface of the gate drive substrate 7 and an upright portion 44 coupled to one end of the flat portion 45 and vertically standing above the upper main surface.

The upright portion 44 has through holes in a plurality of positions (two positions in the example of FIG. 16). The upright portion 44 is fastened to a side wall of the cathode fin electrode 5 with screws 31 inserted in these through holes. Specifically, like the upright portions 40 of the first preferred embodiment, the upright portion 44 detachably fixes the gate drive substrate 7 on the side wall of the cathode fin electrode 5. The reinforcing member 129 can be formed at low cost by bending a metal plate.

The reinforcing member 129 is fixed to the gate drive substrate 7 with the insulating spacers 37 interposed therebetween. The spacers 37 are interposed between the flat portion 45 and the upper main surface of the gate drive substrate 7 to fixedly couple the flat portion 45 and the gate drive substrate 7 at an interval. In the example of FIG. 16, the spacers 37 are arranged in four positions separated to surround the opening 49.

While the flat portion 45 has two ends in the direction approximately connecting the center of the opening portion 49 with the center of the upper main surface of the gate drive substrate 7, the upright portion 44 is preferably coupled to the end closer to the center of the upper main surface as shown in FIG. 16. While the plurality of fastening portions of the upright portion 44 serve as supporting points to support the gate drive substrate 7 on the cathode fin electrode 5, providing these supporting points closer to the center of the gate drive substrate 7 suppresses moments produced by vibrations around the upright portion 44. This provides the advantage of further effectively suppressing the resonance phenomenon.

Figure 38:
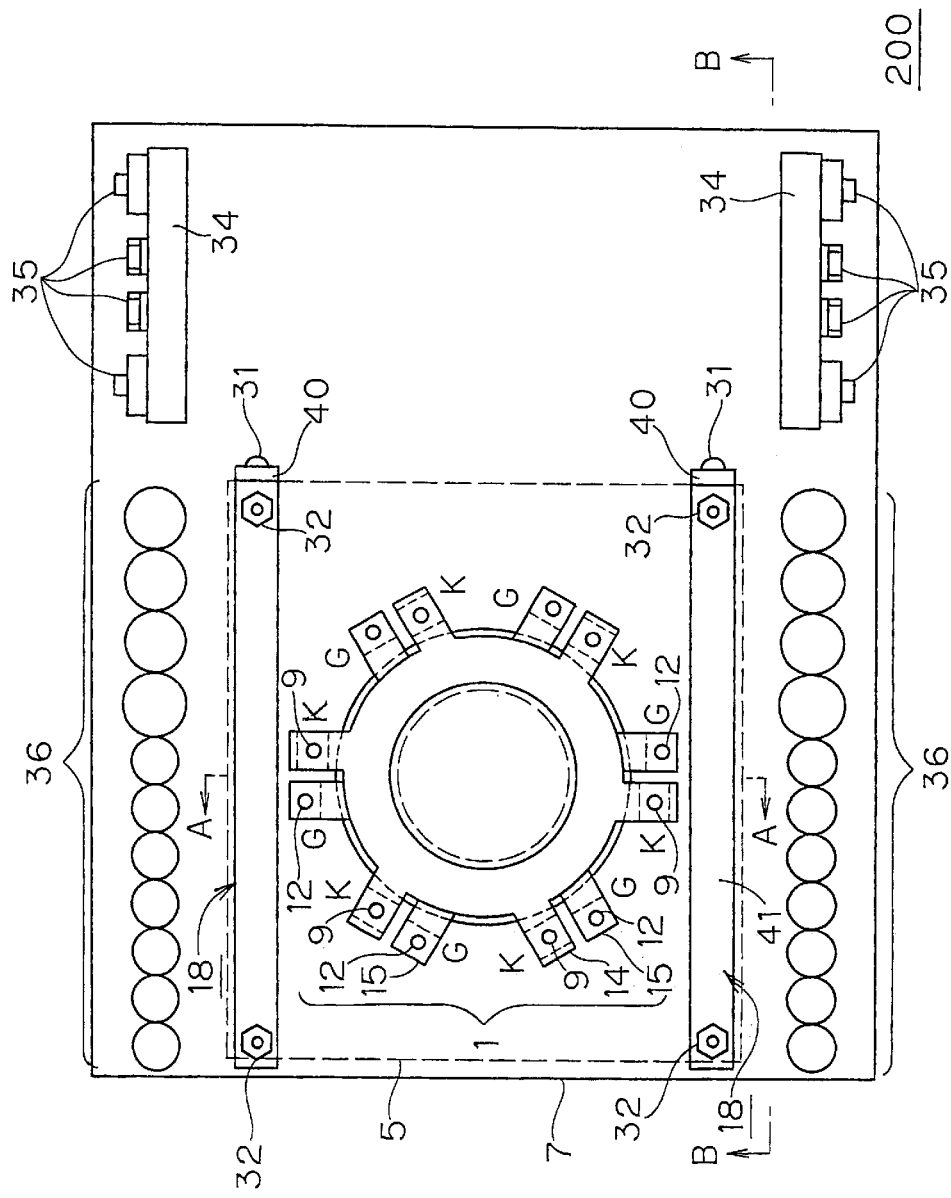
FIG. 38 is a top view showing a semiconductor device as a background art.

The reinforcing member 129 is equivalent to an integrally coupled (one-piece) version of the pair of reinforcing members 18 shown in FIGS. 38 and 39. Therefore the reinforcing member 129 is advantageous in that it has higher rigidity than the pair of reinforcing members 18. Specifically, the reinforcing member 129 also serves to further enhance the rigidity of the gate drive substrate 7 (including components provided thereon). This also effectively contributes to the suppression of resonance of the gate drive substrate 7.

Further, the GDU 307 can easily be attached to the cathode fin electrode 5 through the inserting attachment just by fastening the upright portion 44 to the side wall of the cathode fin electrode 5 with the screws 31. The semiconductor device 207 thus facilitates the inserting attachment, thus providing improved maintenance work efficiency.

Eighth Preferred Embodiment

Figure 18:
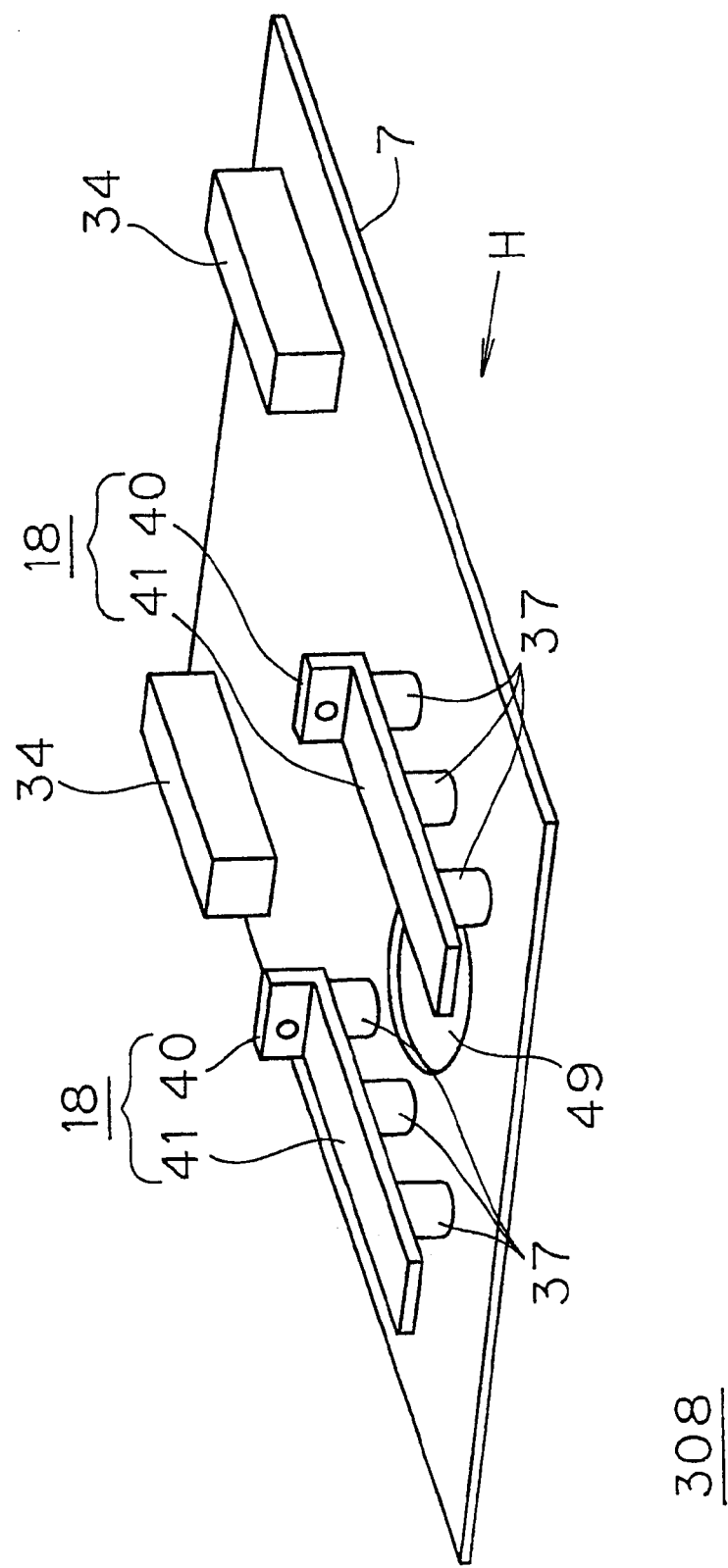
FIG. 18 is a perspective view showing a semiconductor device according to an eighth preferred embodiment.
Figure 19:
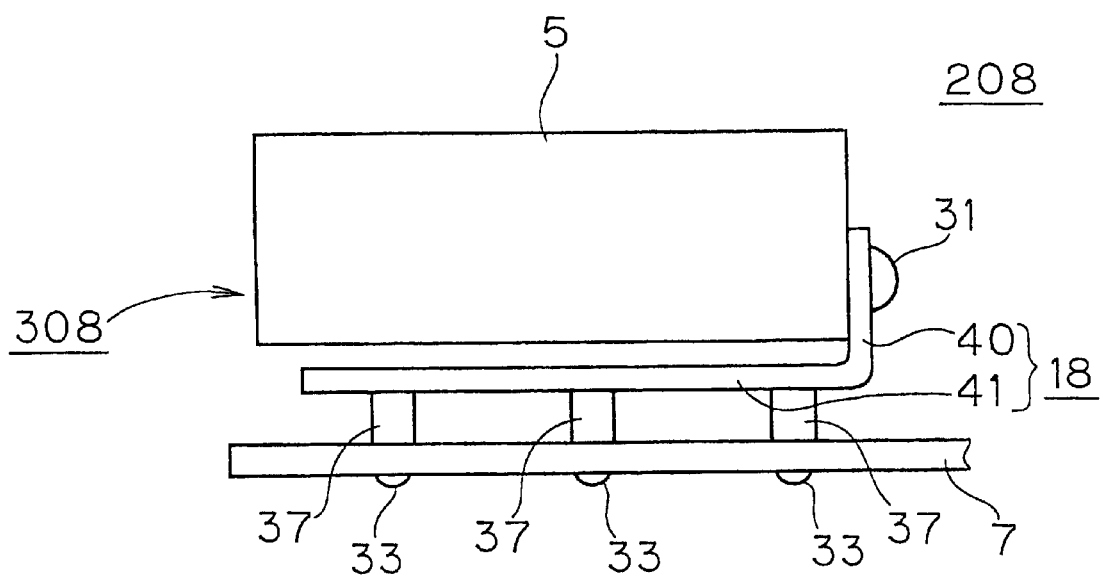
FIG. 19 is a partial side view of the semiconductor device of FIG. 18 seen from the direction H.

FIGS. 18 and 19 are respectively a perspective view and a side view schematically showing a semiconductor device 208 according to an eighth preferred embodiment. FIG. 19 is a partial side view of the semiconductor device 208 seen from the direction H of FIG. 18. The GDU 308 corresponds to the part of the semiconductor device 208 excluding the cathode fin electrode 5.

Like the semiconductor device 201 of the first preferred embodiment, the semiconductor device 208 comprises a pair of reinforcing members 18 fixed to the gate drive substrate 7 with the electrically insulating spacers 37 interposed therebetween. The pair of reinforcing members 18 are shaped and arranged as described in the first preferred embodiment. Unlike the semiconductor device 201, however, the semiconductor device 208 does not have the spacer 118 and engaging member 119; the spacers 37 are arranged, for each flat portion 41, in three positions separated in the direction in which the flat portion 41 extends. The pair of reinforcing members 18 thus more effectively function as reinforcing members for enhancing the rigidity of the gate drive substrate 7 and preventing it from curving. This further effectively suppresses the resonance of the gate drive substrate 7.

Moreover, this structure minimizes the loss of area for mounting circuit components forming the control circuit which are arranged along the upper main surface of the gate drive substrate 7, such as IC (integrated circuit), capacitors, etc. (not shown).

Ninth Preferred Embodiment

Figure 20:
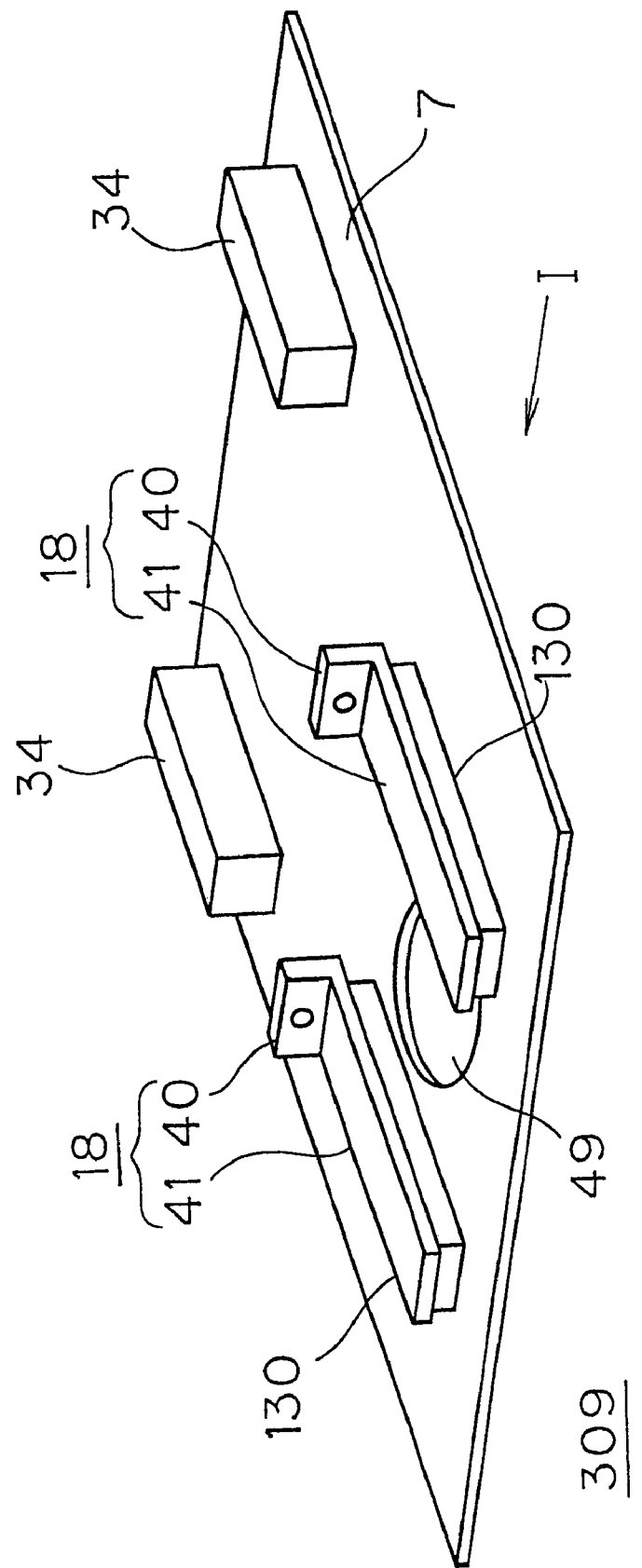
FIG. 20 is a perspective view showing a semiconductor device according to a ninth preferred embodiment.
Figure 21:
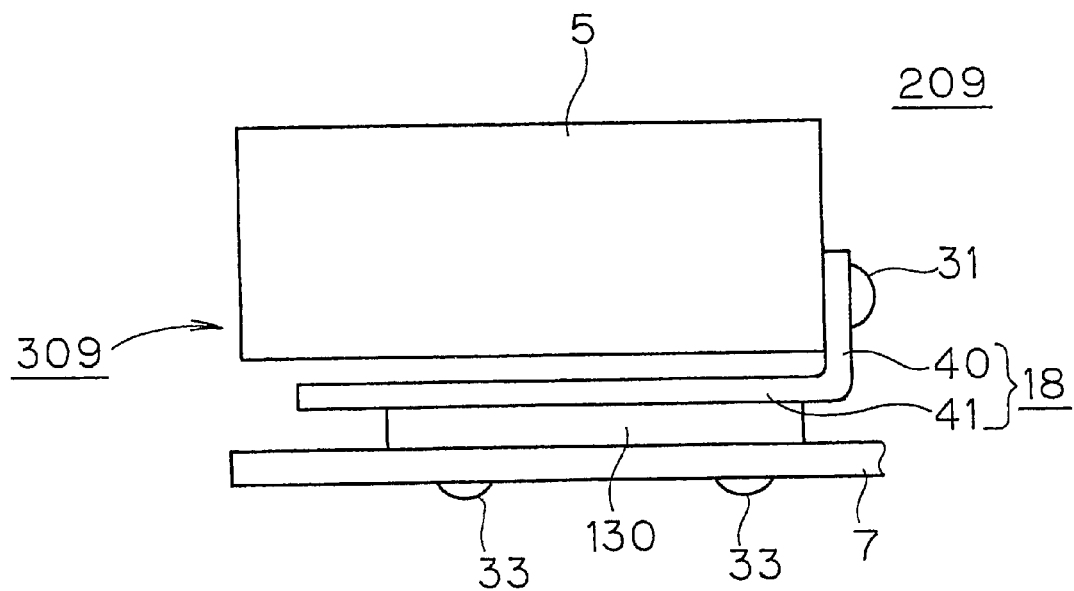
FIG. 21 is a partial side view of the semiconductor device of FIG. 20 seen from the direction I.

FIGS. 20 and 21 are respectively a perspective view and a side view schematically showing a semiconductor device 209 according to a ninth preferred embodiment. FIG. 21 is a partial side view of the semiconductor device 209 seen from the direction I of FIG. 20. The GDU 309 corresponds to the part of the semiconductor device 209 excluding the cathode fin electrode 5.

In the semiconductor device 209, as in the semiconductor device 208 of the eighth preferred embodiment, a pair of reinforcing members 18 are fixed to the gate drive substrate 7 with electrically insulating spacers 130 interposed therebetween. The pair of reinforcing members 18 are shaped and arranged as explained in the eighth preferred embodiment. Unlike the semiconductor device 208, however, the semiconductor device 209 uses the spacers 130 instead of the spacers 37. The spacers 130 are equivalent to the spacers 37 in that they are electrically insulating and interposed between the pair of flat portions 41 and the upper main surface of the gate drive substrate 7 to fixedly couple the pair of flat portions 41 and the gate drive substrate 7 at an interval. The spacers 130, however, characteristically differ from the spacers 37 in that they extend for each flat portion 41 in contact with the flat portion 41 and the upper main surface of the gate drive substrate 7 along the direction in which the flat portions 41 extend.

The pair of reinforcing members 18 thus more effectively function as reinforcing members to enhance the rigidity of the gate drive substrate 7 and to prevent it from curving. This more effectively suppresses the resonance of the gate drive substrate 7. Particularly, this structure effectively suppresses the resonance since it reinforces the gate drive substrate 7 in the part nearest to the terminal parts of the GCT thyristor element 1 (i.e. the parts to which the gate flange 15 and the first cathode flange 14 are connected).

Tenth Preferred Embodiment

Figure 22:
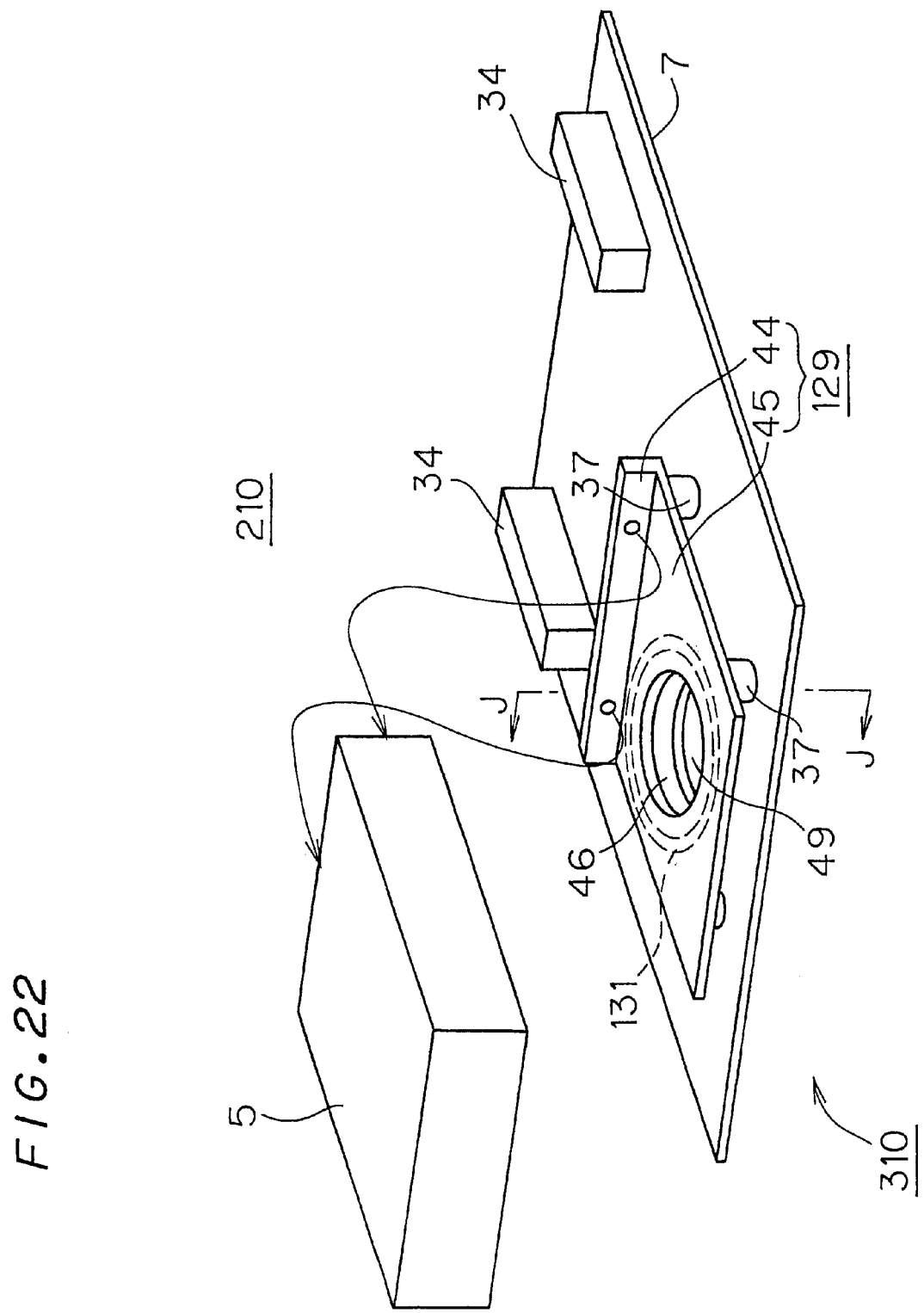
FIG. 22 is a perspective view showing a semiconductor device according to a tenth preferred embodiment.
Figure 23:
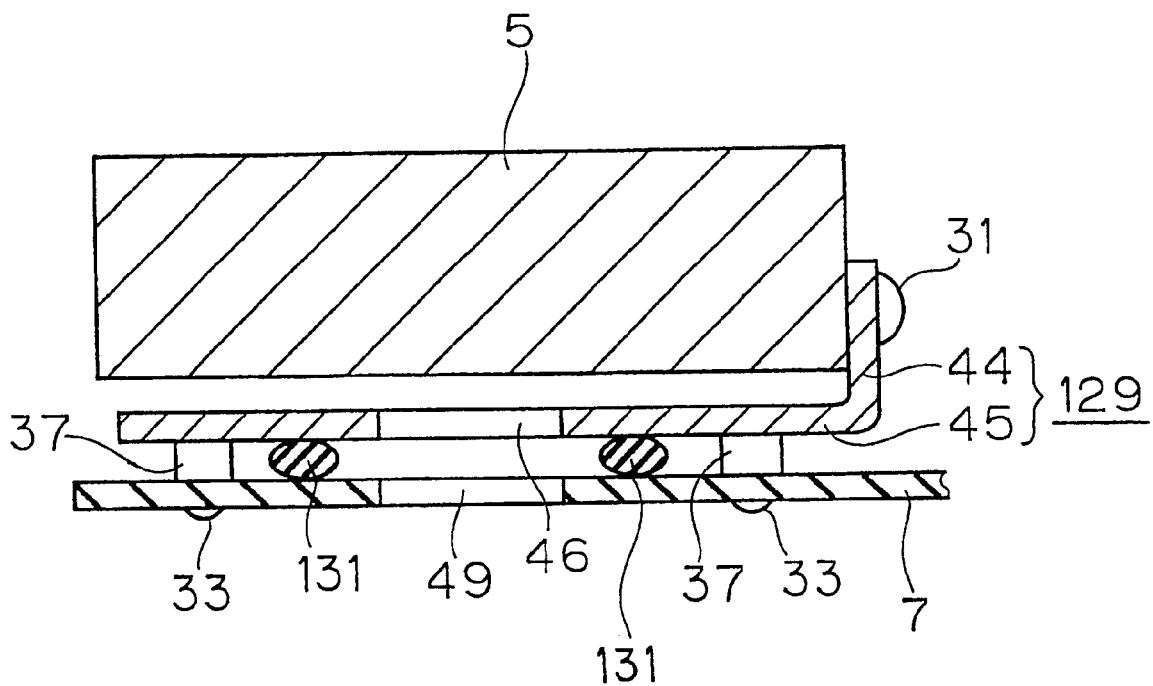
FIG. 23 is a partial section of the semiconductor device of FIG. 22 taken along the line J—J.

FIG. 22 is a perspective view schematically showing a semiconductor device 210 according to a tenth preferred embodiment. FIG. 23 is the partial section of the semiconductor device 210 taken along the line J—J of FIG. 22. Like the semiconductor device 201 of the first preferred embodiment, the semiconductor device 210 is constructed to allow the inserting attachment in the assembly process. The GDU 310 corresponds to the part of the semiconductor device 210 excluding the cathode fin electrode 5.

The semiconductor device 210 corresponds to a modified version of the semiconductor device 207 of the seventh preferred embodiment, which comprises a ring-shaped elastic member 131. A commercially available low-price O-ring can be used as the ring-shaped elastic member 131. The ring-shaped elastic member 131 is provided to surround the opening 49 and sandwiched with a pressing force between the flat portion 45 of the reinforcing member 129 and the upper main surface of the gate drive substrate 7. The ring-shaped elastic member 131 is put between the flat portion 45 and the gate drive substrate 7 when fastening the reinforcing member 129 to the gate drive substrate 7 with the screws 33 with the spacers 37 between them. Therefore a pressing force is applied to the reinforcing member 129 through the fastening force of the screws 33.

In this way, in the semiconductor device 210, the ring-shaped elastic member 131 further enhances the reinforcing effect brought by the reinforcing member 129. This more effectively suppresses the resonance phenomenon.

Eleventh Preferred Embodiment

Figure 24:
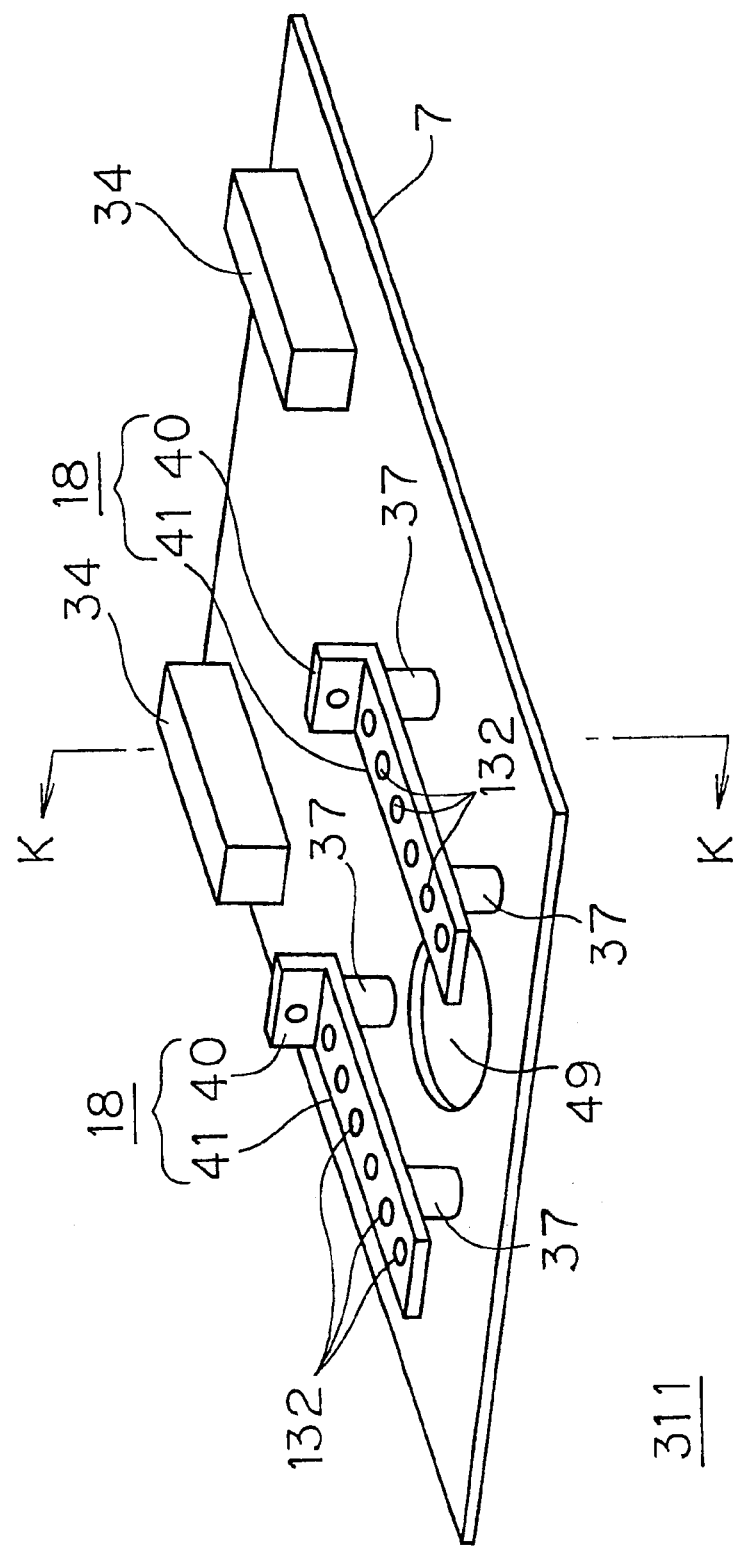
FIG. 24 is a perspective view showing a semiconductor device according to an eleventh preferred embodiment.
Figure 25:
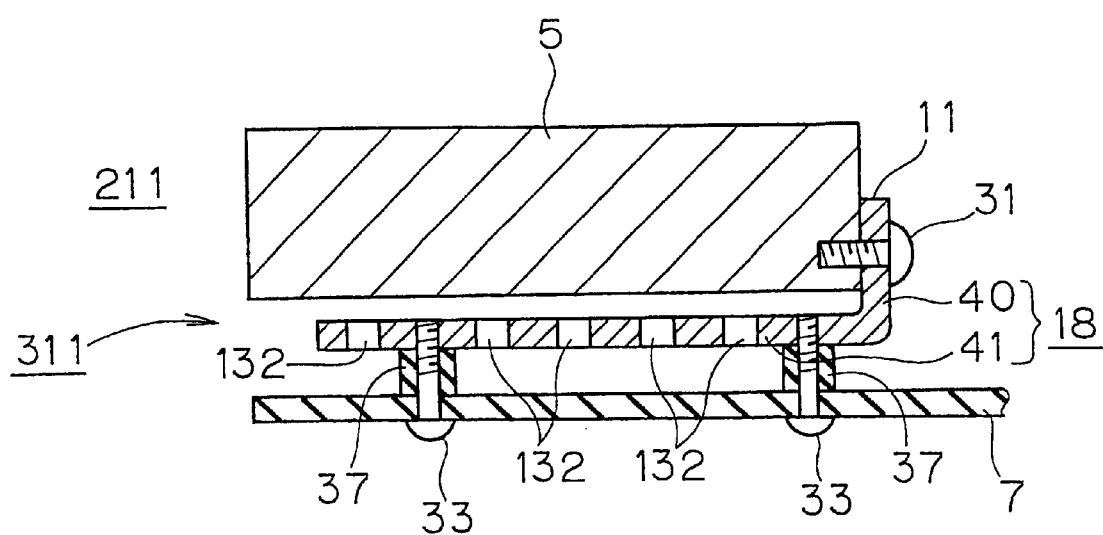
FIG. 25 is a partial section of the semiconductor device of FIG. 24 taken along the line K—K.

FIG. 24 is a perspective view schematically showing a semiconductor device 211 according to an eleventh preferred embodiment. FIG. 25 is the partial section of the semiconductor device 211 taken along the line K—K of FIG. 24. Like the semiconductor device 201 of the first preferred embodiment, the semiconductor device 211 is constructed to allow the inserting attachment in the assembly process. The GDU 311 corresponds to the part of the semiconductor device 211 excluding the cathode fin electrode 5.

In the semiconductor device 211, as in the semiconductor device 201 of the first preferred embodiment, a pair of reinforcing members 18 are fixed to the gate drive substrate 7 with the electrically insulating spacers 37 interposed therebetween. The pair of the reinforcing members 18 are shaped to form the same contour and arranged in the same way as those of the first preferred embodiment.

Unlike those of the semiconductor device 201, the flat portions 41 of the semiconductor device 211 each have a plurality of through holes 132 arranged in the direction in which they extend. This achieves weight reduction of the circuit board including components provided thereon without considerably reducing the reinforcing effect of the reinforcing members 18. In an environment in which the semiconductor device 211 is subjected to vibrations in use, it reduces moments produced around the pair of upright portions 40 as a pair of supporting points for supporting the gate drive substrate 7. This further effectively suppresses the resonance phenomenon.

Twelfth Preferred Embodiment

Figure 26:
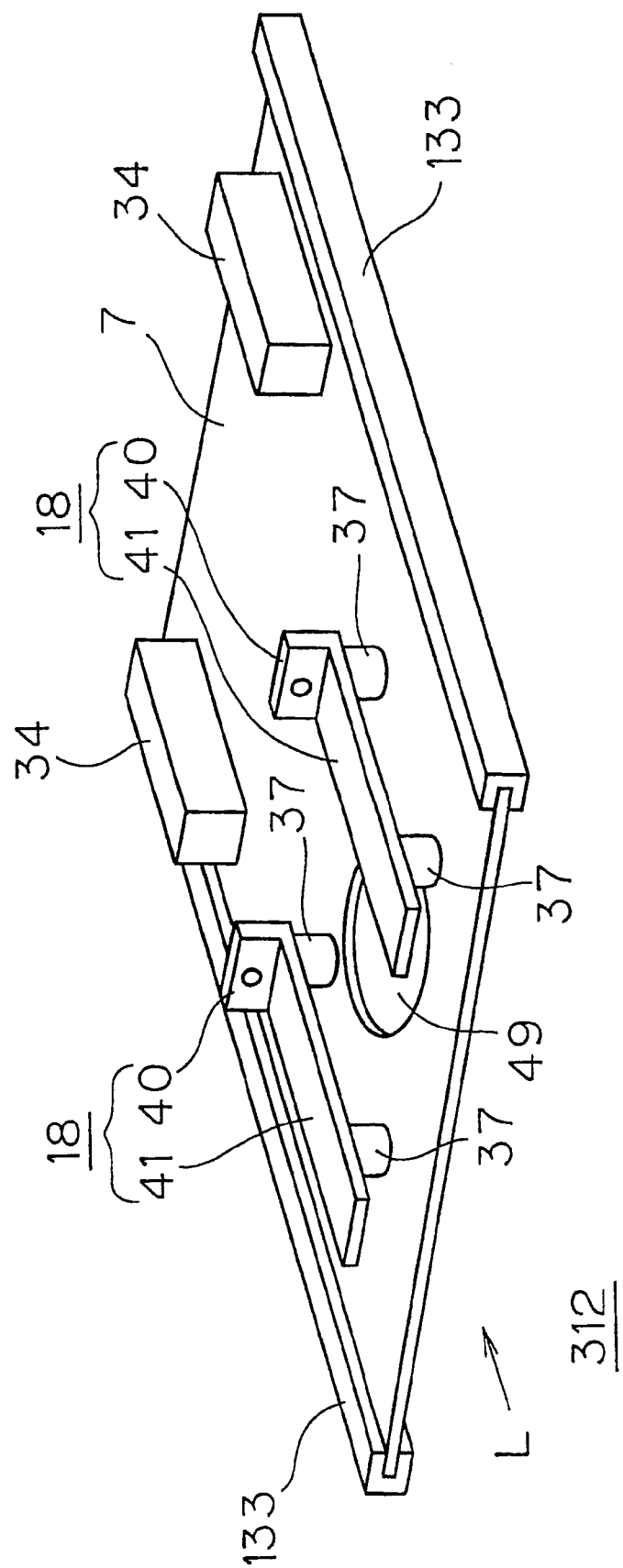
FIG. 26 is a perspective view showing a semiconductor device according to a twelfth preferred embodiment.
Figure 27:
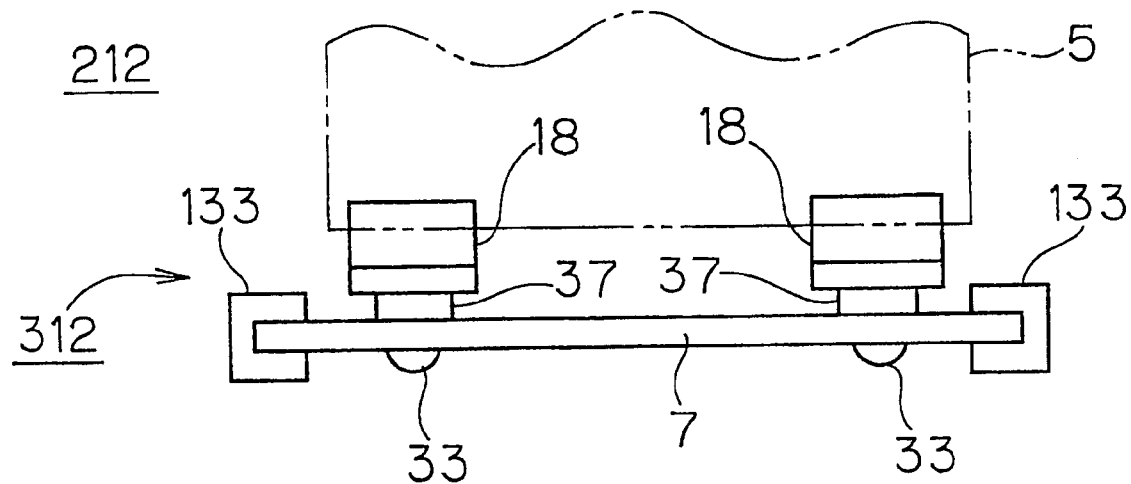
FIG. 27 is a partial side view of the semiconductor device of FIG. 26 seen from the direction L.

FIGS. 26 and 27 are respectively a perspective view and a side view schematically showing a semiconductor device 212 according to a twelfth preferred embodiment. FIG. 27 is a partial side view of the semiconductor device 212 seen from the direction L of FIG. 26. Like the semiconductor device 201 of the first preferred embodiment, the semiconductor device 212 is constructed to allow the inserting attachment in the assembly process. The GDU 312 corresponds to the part of the semiconductor device 212 excluding the cathode fin electrode 5.

The semiconductor device 212 characteristically differs from the semiconductor devices of other preferred embodiments in that frames 133 are attached to the gate drive substrate 7. While FIGS. 26 and 27 show an example in which the frames 133 are attached to the semiconductor device 200 of the background art, they can be attached to any of the semiconductor devices of the preferred embodiments.

The frames 133 are fixed to the gate drive substrate 7 along and in close contact with at least part of the periphery of the gate drive substrate 7. Preferably, as shown in FIG. 27, frames 133 shaped like U (but having angular comers) in section are fitted to the periphery of the gate drive substrate 7. This enhances the rigidity of the gate drive substrate 7, thus effectively suppressing the resonance phenomenon.

The frames 133 can be obtained at low cost by forming a groove in a rectangular metal bar. In this case, an insulating treatment is applied between the frames 133 and the gate drive substrate 7 to prevent electric short-circuit between interconnection patterns (not shown) provided on the gate drive substrate 7.

As shown in FIG. 26, the frames 133 are preferably attached along opposite two sides of the gate drive substrate 7. This more effectively enhances the rigidity of the gate drive substrate 7 and more effectively suppresses the resonance phenomenon.

Thirteenth Preferred Embodiment

Figure 28:
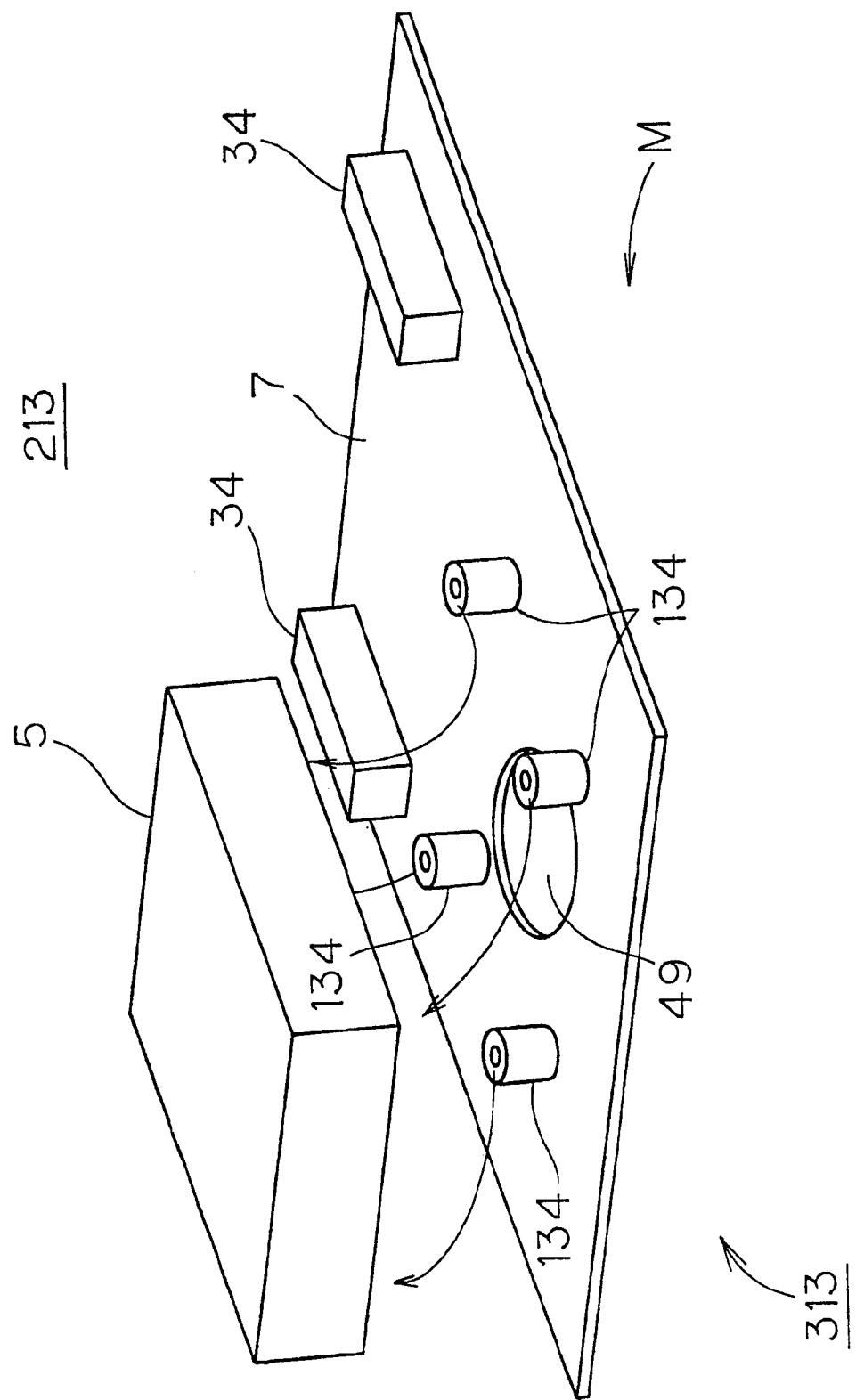
FIG. 28 is a perspective view showing a semiconductor device according to a thirteenth preferred embodiment.
Figure 29:
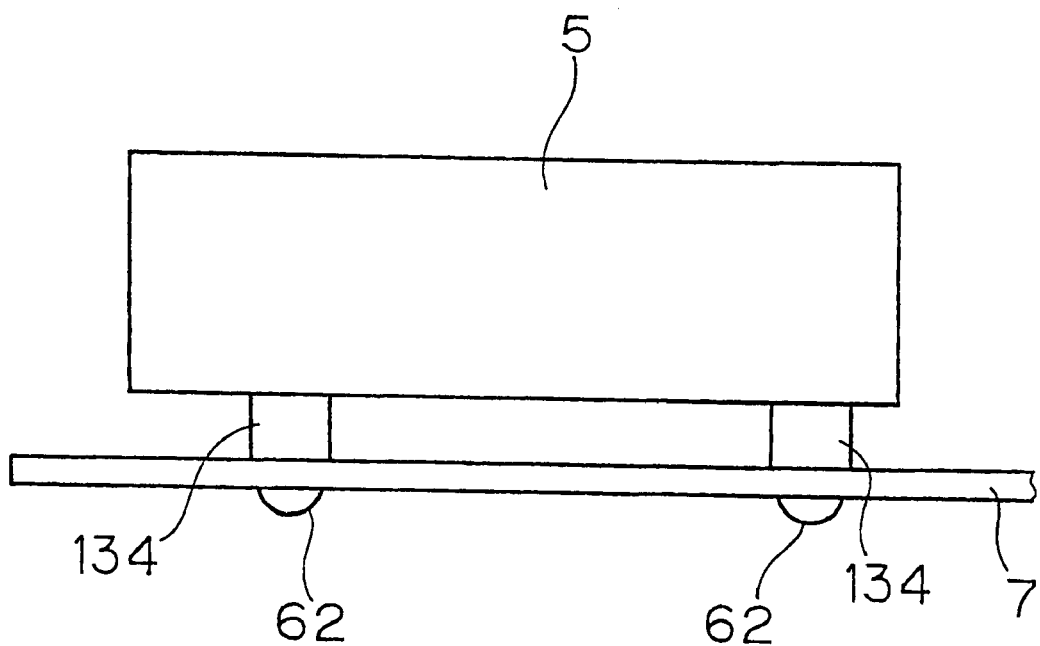
FIG. 29 is a partial side view of the semiconductor device of FIG. 28 seen from the direction M.

FIGS. 28 and 29 are respectively a perspective view and a side view schematically showing a semiconductor device 213 according to a thirteenth preferred embodiment. FIG. 29 is a partial side view of the semiconductor device 213 seen from the direction M of FIG. 28. Like the semiconductor device 205 of the fifth preferred embodiment, the semiconductor device 213 is suitable for the stacking attachment in the assembly process. The GDU 313 corresponds to the part of the semiconductor device 213 excluding the cathode fin electrode 5.

The semiconductor device 213 characteristically differs from the semiconductor device 200 of the background art in that it does not have the reinforcing members 18 and the spacers 37 on the gate drive substrate 7 but it has spacers 134. The spacers 134 have electrically insulating property and are arranged in four or more positions (four positions in FIG. 28) spaced to surround the opening 49. They abut on the bottom of the cathode fin electrode 5 and the upper main surface of the gate drive substrate 7. The cathode fin electrode 5 and the gate drive substrate 7 are fastened to each other with screws 62 with the spacers 134 interposed therebetween.

Specifically, the spacers 134 are interposed between the bottom of the cathode fin electrode 5 and the upper main surface of the gate drive substrate 7 to detachably and fixedly couple the cathode fin electrode 5 and the gate drive substrate 7 at an interval. The spacers 134 are preferably formed in cylindrical form as shown in FIG. 28.

In the semiconductor device 213, as described above, the gate drive substrate 7 is stably supported on the cathode fin electrode 5 at at least four supporting points arranged to surround the opening 49. Therefore, even in an environment in which the semiconductor device 213 is subjected to vibrations, rotating moment is not produced around each supporting point and the gate drive substrate 7 is more effectively prevented from resonating. Thus, the semiconductor device 213 provides stronger vibration resistance than the semiconductor device 200. Further, it can be constructed with a smaller number of parts and hence at lower manufacture cost.

Fourteenth Preferred Embodiment

Figure 30:
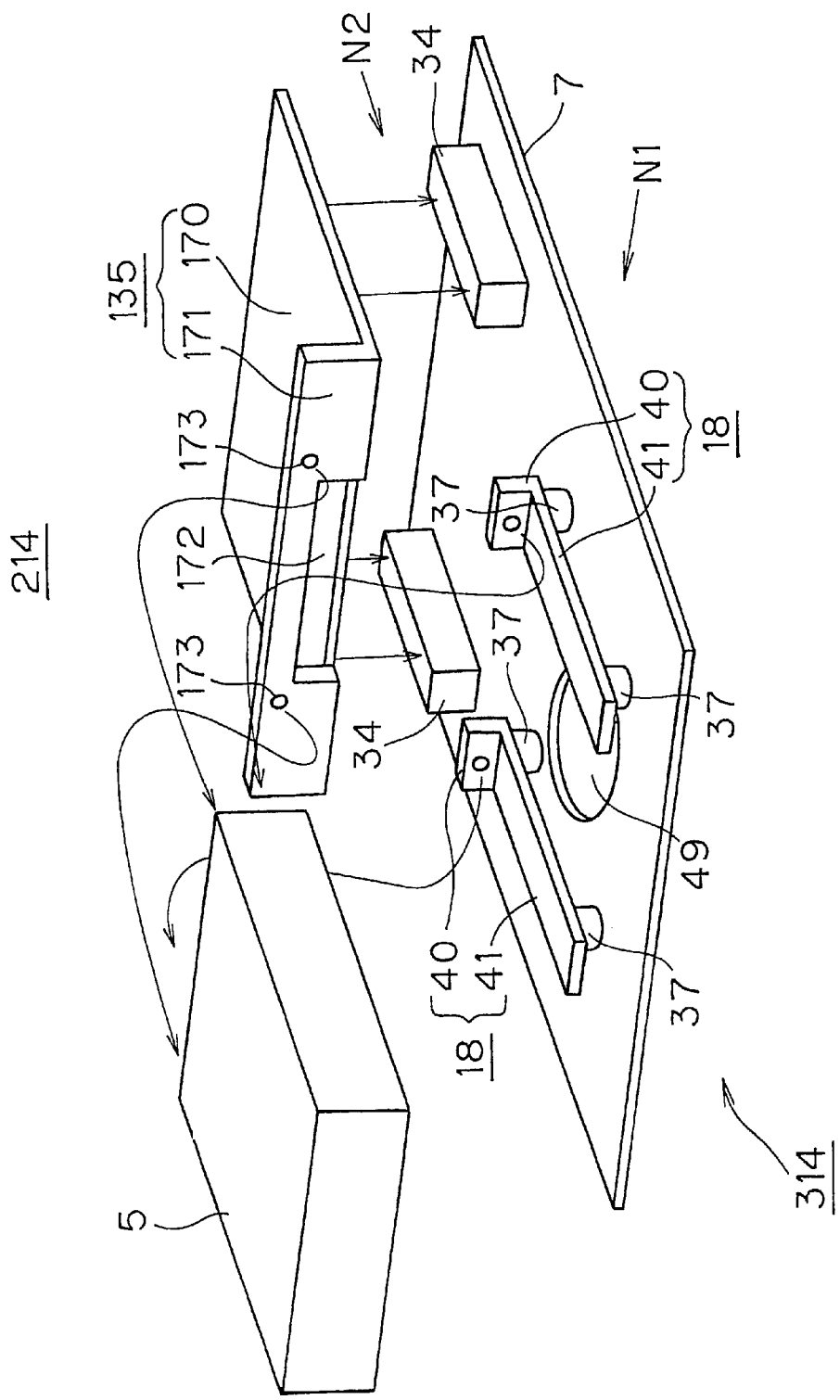
FIG. 30 is a perspective view showing a semiconductor device according to a fourteenth preferred embodiment.
Figure 31:
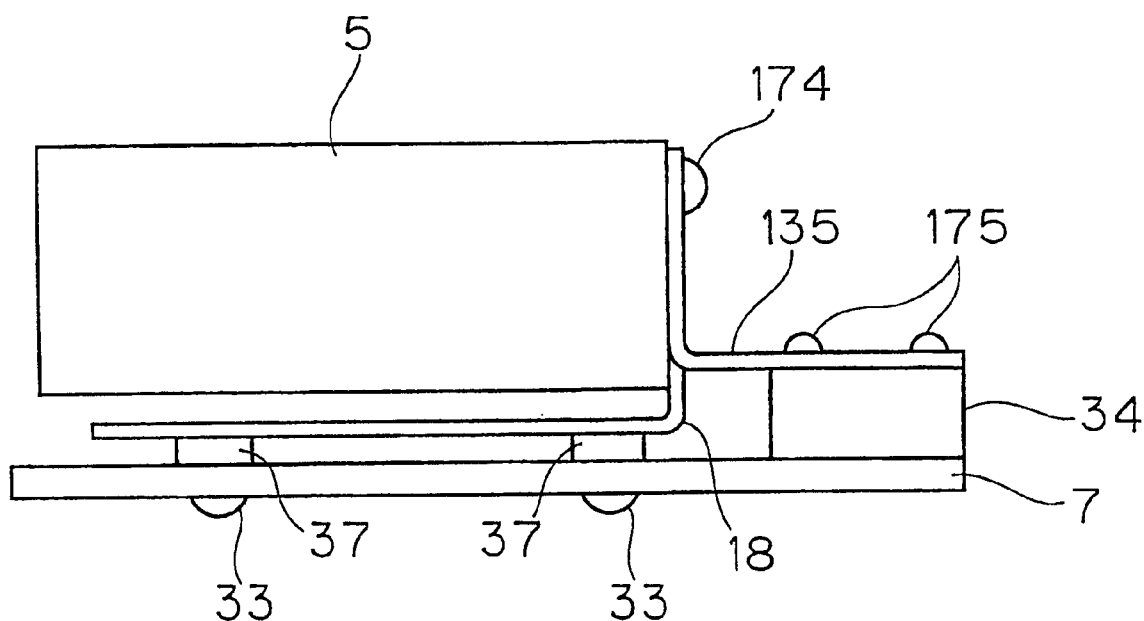
FIG. 31 is a partial side view of the semiconductor device of FIG. 30 seen from the direction N1.
Figure 32:
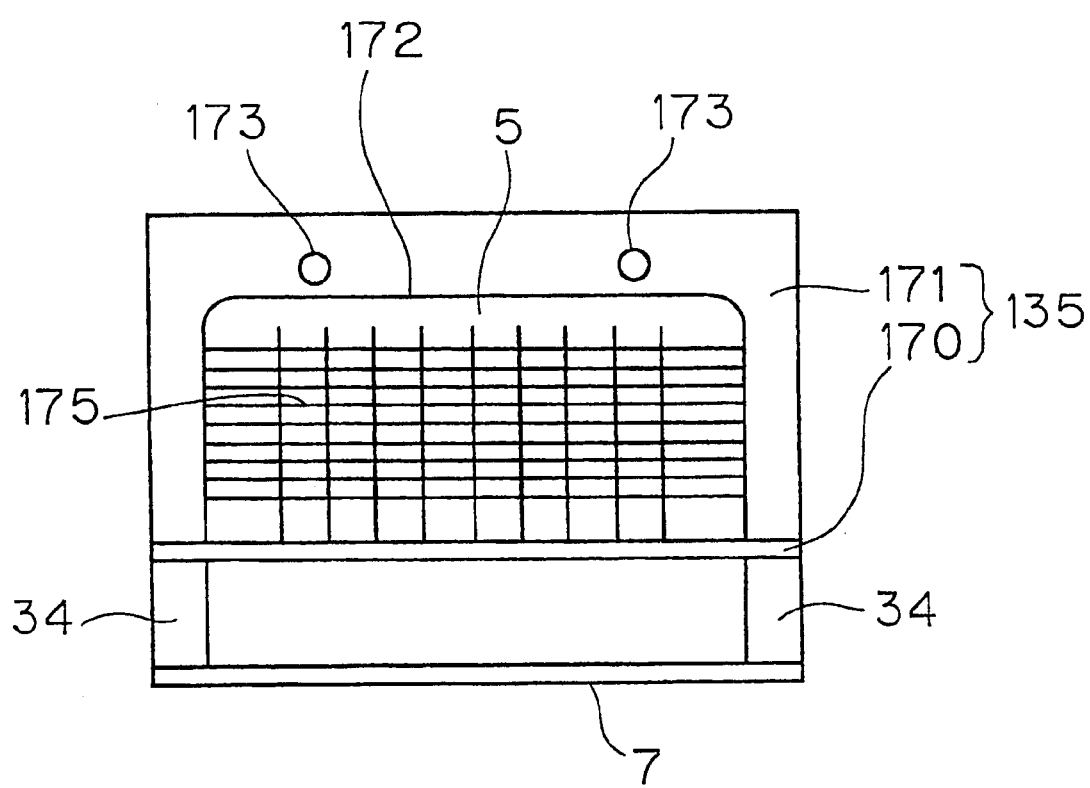
FIG. 32 is a partial side view of the semiconductor device of FIG. 30 seen from the direction N2.

FIG. 30 is a perspective view schematically showing a semiconductor device 214 according to a fourteenth preferred embodiment. FIG. 31 is a partial side view of the semiconductor device 214 seen from the direction N1 of FIG. 30. FIG. 32 is a partial side view of the semiconductor device 214 seen from the direction N2 of FIG. 30. Like the semiconductor device 201 of the first preferred embodiment, the semiconductor device 214 is constructed to allow the inserting attachment in the assembly process. The GDU 314 corresponds to the part of the semiconductor device 214 excluding the cathode fin electrode 5.

The semiconductor device 214 characteristically differs from the semiconductor devices of other preferred embodiments in that a reinforcing member 135 is attached to the gate drive substrate 7. While FIGS. 30 to 32 show an example in which the reinforcing member 135 is attached to the semiconductor device 200 described as a background art, it can be attached to any of the semiconductor devices of other preferred embodiments.

The reinforcing member 135 has a plate-like flat portion 170 arranged to face the upper main surface of the gate drive substrate 7 in an area where the cathode fin electrode 5 does not face, and an upright portion 171 coupled to one end of the flat portion 170 and vertically standing above the upper main surface of the gate drive substrate 7. The upright portion 171 has through holes 173 formed in a plurality of positions (two positions in the example of FIG. 30). The upright portion 171 is fastened, beside the upright portions 40, to the cathode fin electrode 5 with screws 174 inserted in the through holes 173 on the side where the upright portions 40 of the reinforcing members 18 are fixed. The reinforcing member 135 can be formed at low cost by bending a metal plate.

The reinforcing member 135 is fixed to the gate drive substrate 7 with spacers interposed therebetween. Thus, like the upright portions 40 of the reinforcing members 18, the upright portion 44 of the reinforcing member 135 functions to detachably fix the gate drive substrate 7 on the side wall of the cathode fin electrode 5. Spacers are interposed between the flat portion 170 and the upper main surface of the gate drive substrate 7 to fixedly couple the flat portion 170 and the gate drive substrate 7 at an interval.

The example of FIG. 30 uses, as the spacers, the wall-like members 34 to which the transistors 35 are attached (FIG. 38). Accordingly there is no need to separately prepare spacers in addition to the wall-like members 34, thus avoiding an increase in the number of parts and minimizing the loss of area of the gate drive substrate 7 on which the control circuitry is mounted.

The pair of wall-like members 34 arranged in parallel stably fix the reinforcing member 135 to the gate drive substrate 7. Generally, spacers are arranged between the reinforcing member 135 and the gate drive substrate 7 in at least four positions separated so that they are not aligned in a line. For example, the spacers can be separated from each other in four positions like the spacers 134 of the thirteenth preferred embodiment. Each single wall-like member 34 shown in FIG. 30 extending in one direction is regarded as including a plurality of positions in itself.

In the semiconductor device 214, the presence of the reinforcing member 135 enhances the rigidity of the gate drive substrate 7. This effectively suppresses the resonance of the gate drive substrate 7.

Not only in the background-art semiconductor device 200, it is generally difficult to make the center of gravity of the gate drive substrate 7 including components provided thereon coincide with the center of gravity of the GCT thyristor element 1, because of restrictions imposed by the control circuit and input and output terminals (not shown) provided on the gate drive substrate 7. This is a cause of the resonance phenomenon. In the semiconductor device 214, the presence of the reinforcing member 135 connected to the cathode fin electrode 5 effectively suppresses the resonance phenomenon in spite of the shift in the center of gravity. Particularly, this structure is effective in suppressing resonance in lower frequency region since it reinforces the part having a large weight ratio which is the most distant from the center of the opening 49, i.e. from the center of gravity of the GCT thyristor element 1.

The upright portions 40 of the reinforcing members 18 and the upright portion 171 of the reinforcing member 135 are both fastened on the same side of the cathode fin electrode 5 to support the gate drive substrate 7 on the cathode fin electrode 5. Therefore the inserting attachment can be achieved easily in the process of assembling the semiconductor device 214.

When the cathode fin electrode 5 is of air-cooling type, a fin 175 (see FIG. 32) is provided on its side wall to effectively dissipate heat. Therefore, the upright portion 171 of the reinforcing member 137 preferably comprises a window 172 formed to open over the fin 175. This allows the cathode fin electrode 5 to effectively dissipate heat.

Fifteenth Preferred Embodiment

Figure 33:
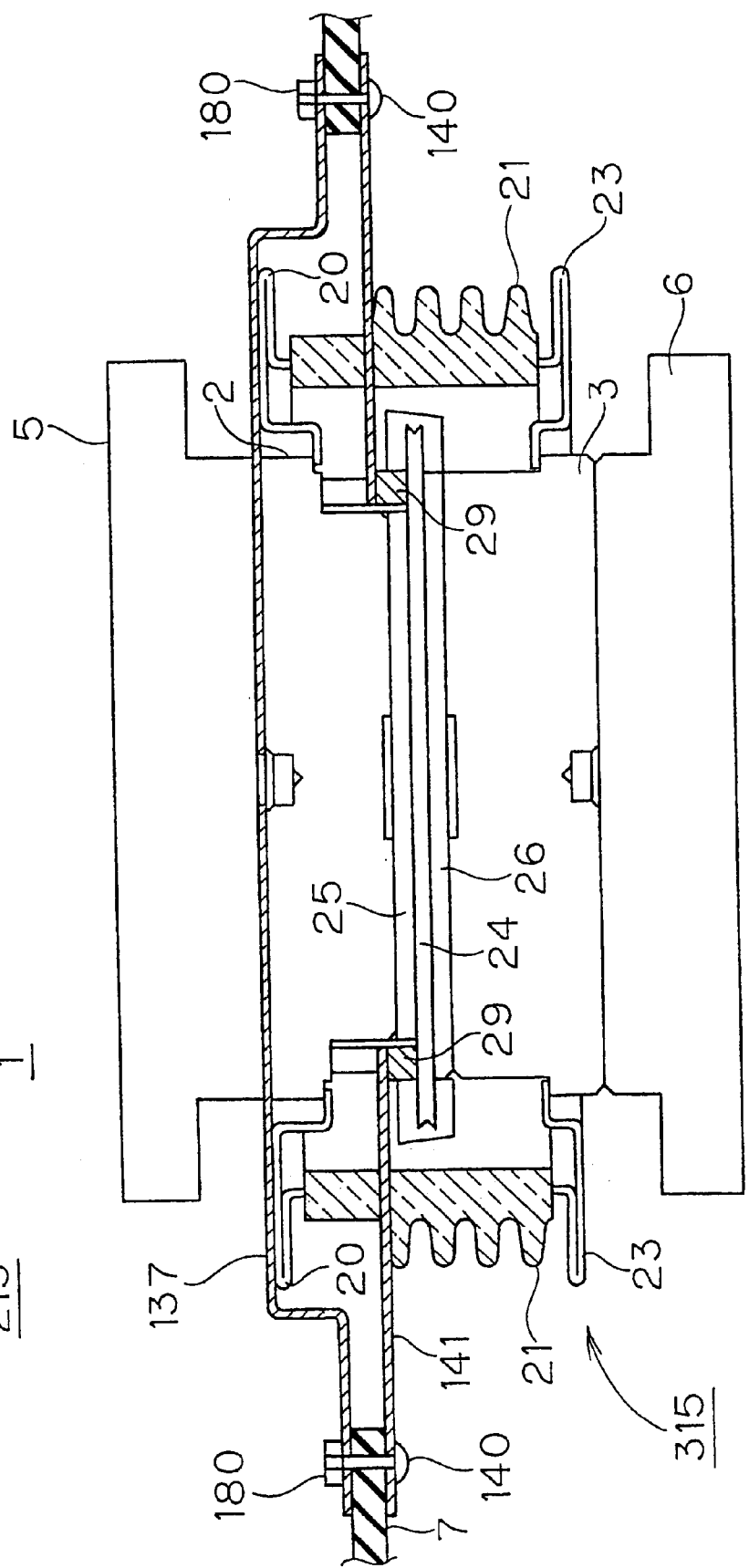
FIG. 33 is a vertical section of a semiconductor device according to a fifteenth preferred embodiment.

FIG. 33 is a vertical section of a semiconductor device 215 according to a fifteenth preferred embodiment. The GDU 315 corresponds to the part of the semiconductor device 215 excluding the cathode fin electrode 5 and the anode fin electrode 6. The semiconductor device 215 characteristically differs from the semiconductor device 200 as a background art in the structure of the first cathode flange (main terminal plate) 14 and the gate flange (control terminal plate) 15 of the GCT thyristor element 1 and in the structure of interconnection patterns provided on the gate drive substrate 7. These features of the semiconductor device 215 can be used in combination with any of the semiconductor devices of other preferred embodiments.

Figure 34:
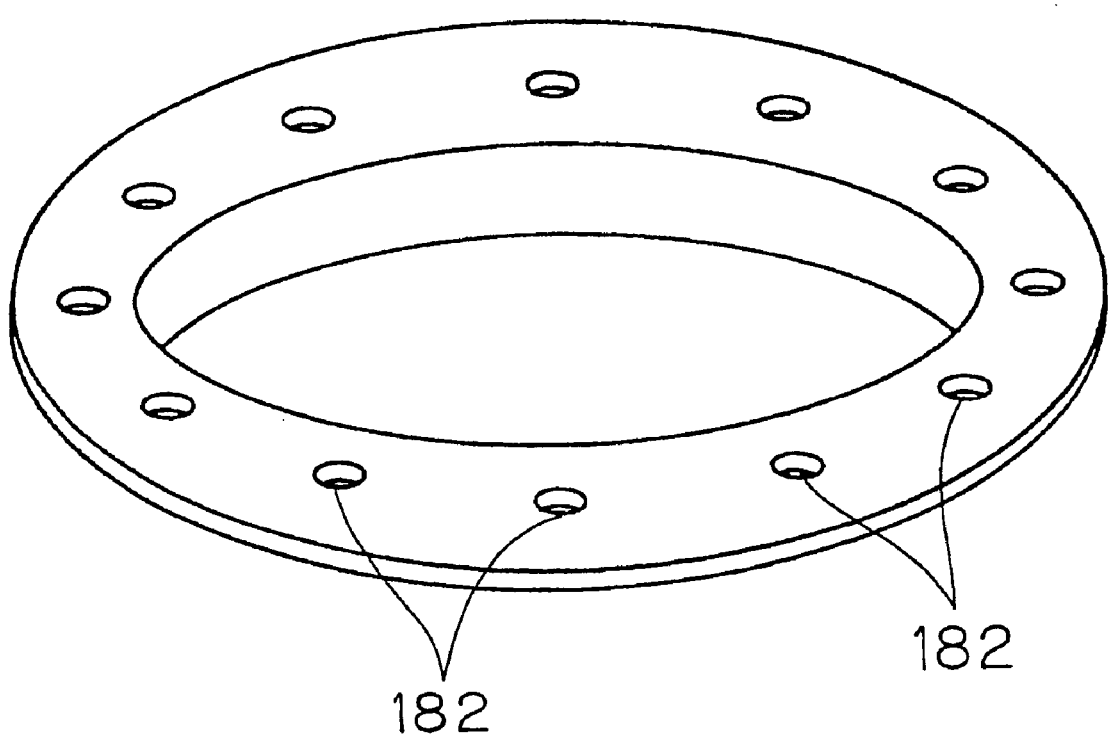
FIG. 34 is a perspective view of the cathode flange of the semiconductor device of FIG. 33.

The semiconductor device 215 uses a cathode flange (main terminal plate) 137 shown in FIG. 34 in place of the first cathode flange 14 of the semiconductor device 200. The cathode flange 137 is obtained by shaping an electrically conductive disk-like thin plate into a form like a cup and forming a plurality of through holes 182 along its periphery. The center part of the cathode flange 137 (i.e. the bottom of the cup) is sandwiched between the cathode post electrode 2 and the cathode fin electrode 5. It also uses a ring-shaped gate flange (control terminal plate) 141 shown in FIG. 33 in place of the gate flange 15 of the semiconductor device 200.

Figure 35:
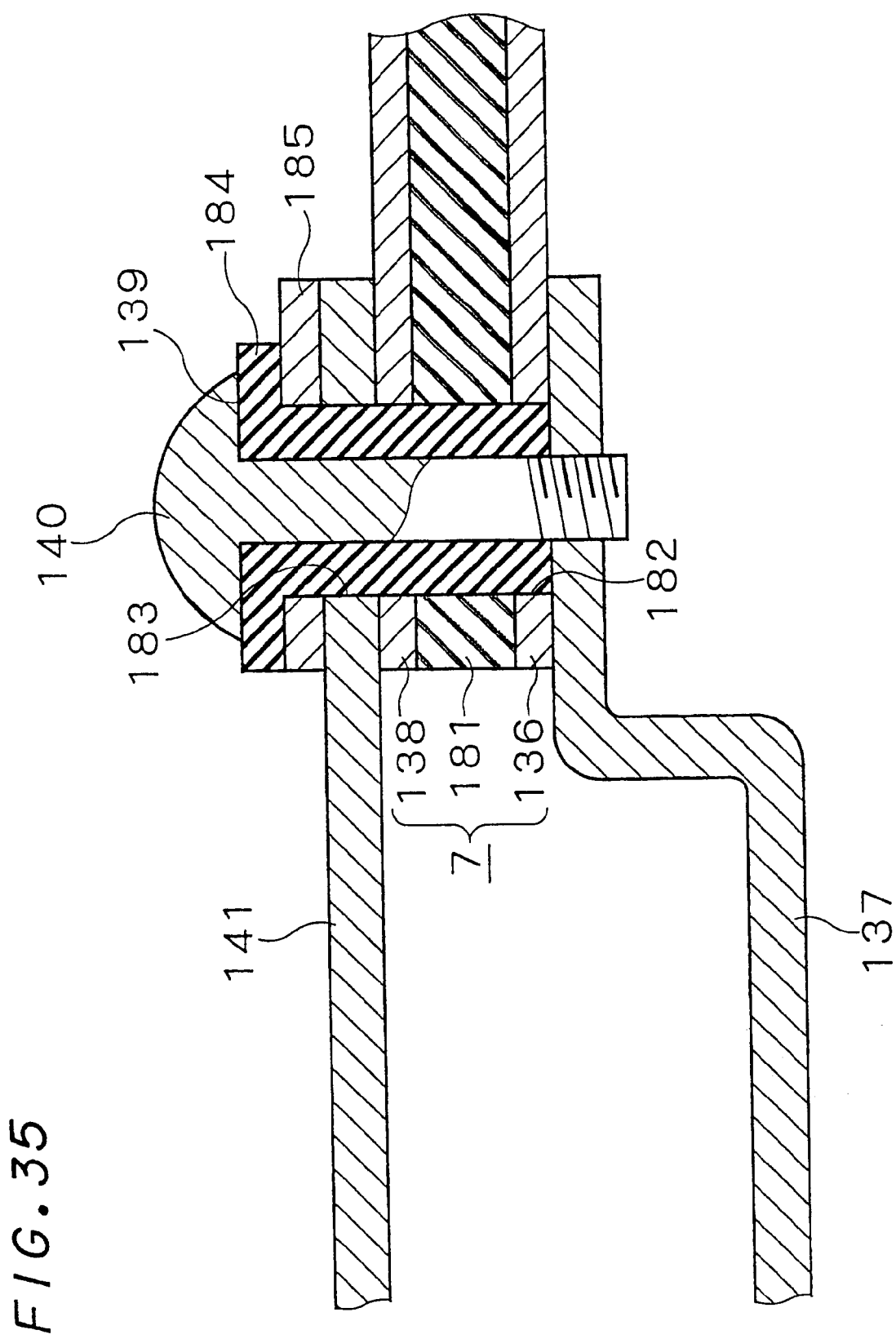
FIG. 35 is a partial enlarged section showing the semiconductor device of FIG. 33.

FIG. 35 is a partial section of the semiconductor device 215, which shows a part in the vicinity of the periphery of the opening 49 of the gate drive substrate 7. The gate drive substrate 7 has interconnection patterns 136 and 138 respectively provided on the upper main surface and the lower main surface of the insulating substrate 181. FIG. 35 shows the gate drive substrate 7 with its upper main surface facing downward. The ring-shaped region along the periphery of the cathode flange 137 is connected to the interconnection pattern 136 in the ring-shaped area formed along the periphery of the opening 49.

Like the gate flange 15 of the semiconductor device 200, the ring-shaped region along the inner periphery of the ring-shaped gate flange 141 is connected to the semiconductor substrate 24 (FIG. 33). The ring-shaped region along the outer periphery of the gate flange 141 is connected to the interconnection pattern 138 in the ring-shaped region formed along the periphery of the opening 49 (FIG. 35). Like the cathode flange 137, the gate flange 141 also comprises a plurality of through holes 183 arranged along its outer periphery. The cathode flange 137 and the gate flange 141 are fastened to the pair of main surfaces of the gate drive substrate 7 with screws 140 inserted in the through holes 182 and 183 with insulating tubes 184 interposed therebetween. A gate flange pressing ring 185 is sandwiched between the flange of the screw 140 and the gate flange 141 so that the gate flange 141 stays in uniform contact with the interconnection pattern 138.

In the semiconductor device 215, the cathode flange 137 and the gate flange 141 are connected to the interconnection patterns 136 and 138 in the ring-shaped region extending along the periphery of the opening 49 of the gate drive substrate 7, which suppresses the inductance present between the control circuit and the semiconductor substrate 24. This enhances operating speed of the GCT thyristor element 1.

Sixteenth Preferred Embodiment

Figure 36:
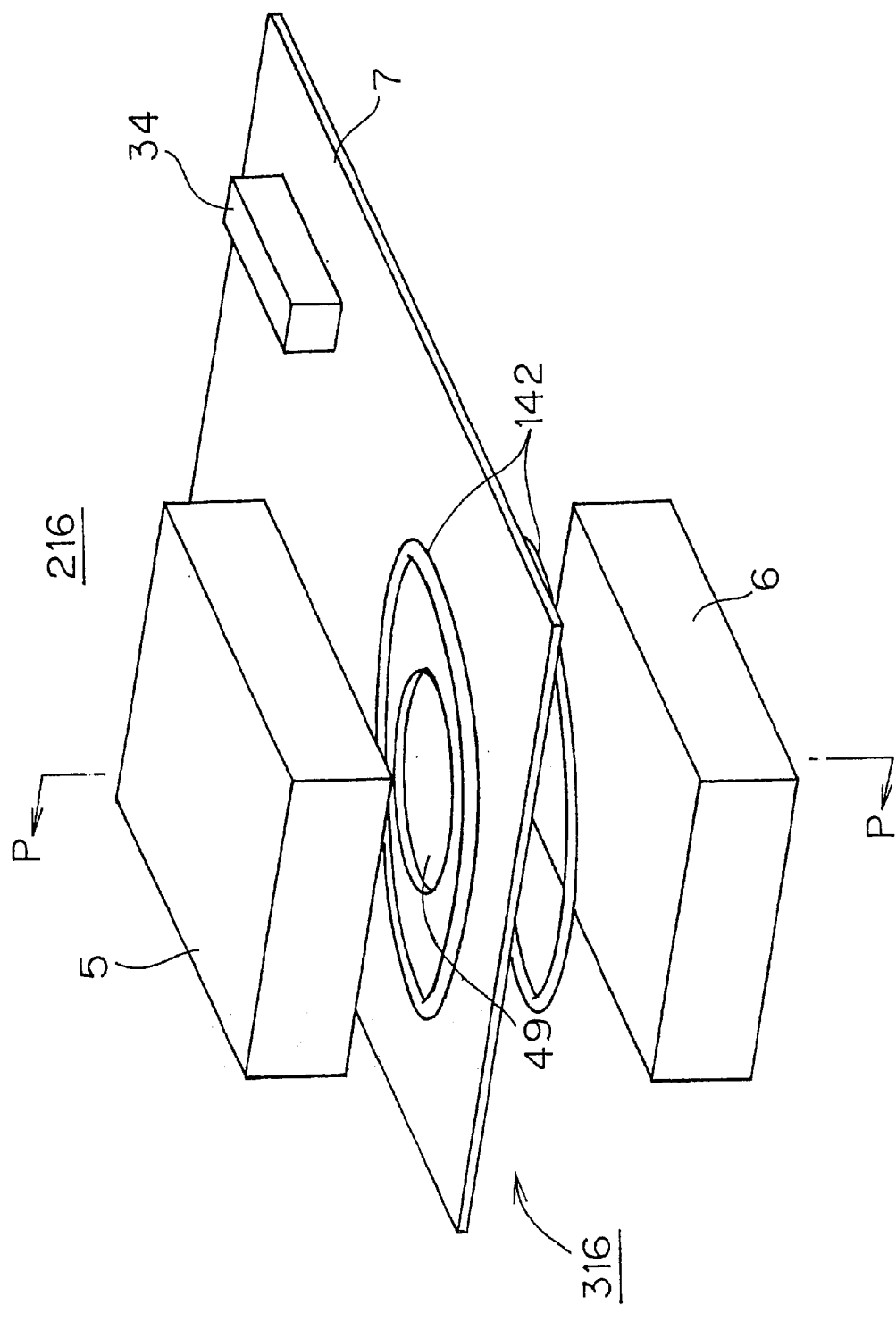
FIG. 36 is a perspective view showing a semiconductor device according to a sixteenth preferred embodiment.
Figure 37:
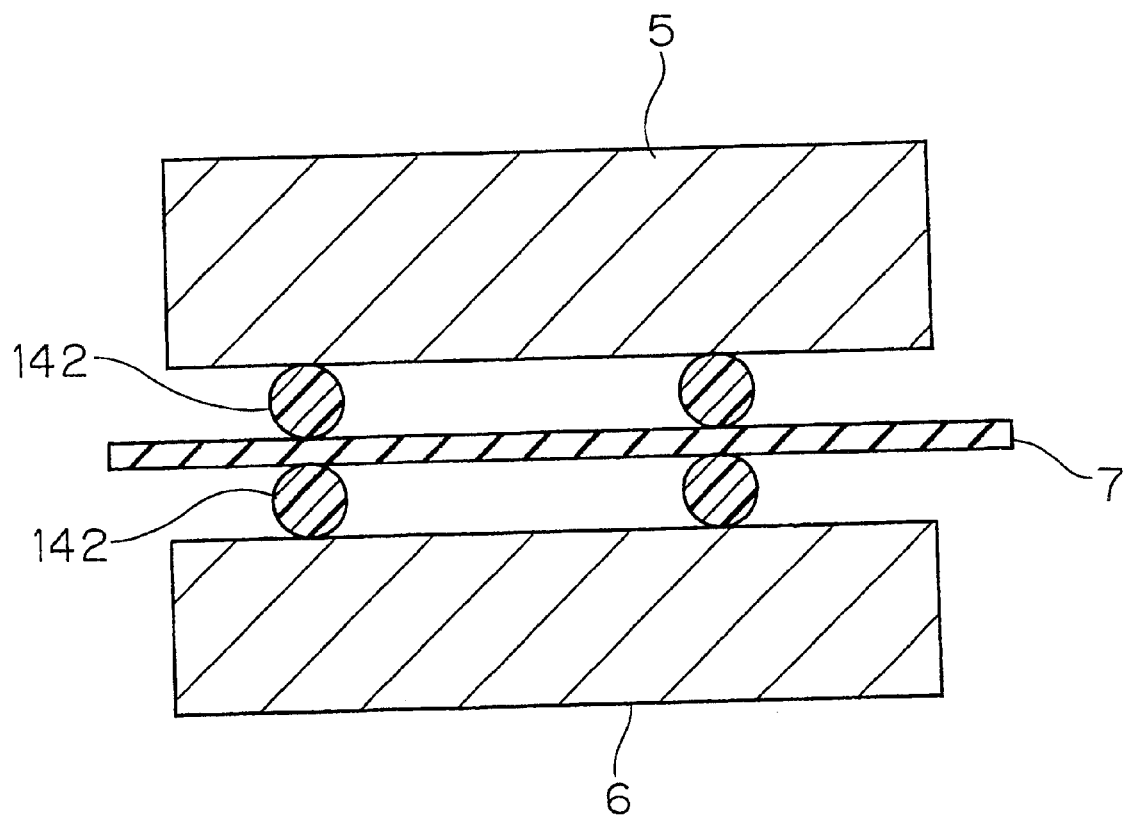
FIG. 37 is a partial section of the semiconductor device of FIG. 36 taken along the line P-P.

FIG. 36 is a perspective view schematically showing a semiconductor device 216 according to a sixteenth preferred embodiment. FIG. 37 is the partial section of the semiconductor device 216 taken along the line P—P of FIG. 36. Like the semiconductor device 205 of the fifth preferred embodiment, the semiconductor device 216 is suitable for the stacking attachment in the assembly process. The GDU 316 corresponds to the part of the semiconductor device 216 excluding the cathode fin electrode 5 and the anode fin electrode 6.

The semiconductor device 216 characteristically differs from the semiconductor device 200 described as a background art in that it uses ring-shaped elastic members 142 in place of the reinforcing members 18 and spacers 37 provided on the gate drive substrate 7. The pair of ring-shaped elastic members 142 are both arranged to surround the opening 49. One ring-shaped elastic member 142 is sandwiched with a pressing force between the bottom of the cathode fin electrode 5 and the upper main surface of the gate drive substrate 7. The other ring-shaped elastic member 142 is sandwiched with a pressing force between the upper surface of the anode fin electrode 6 (the surface which faces the lower main surface of the gate drive substrate 7) and the lower main surface of the gate drive substrate 7.

In the semiconductor device 216, the pair of ring-shaped elastic members 142 are thus interposed between the pair of fin electrodes 5 and 6 and the gate drive substrate 7, which suppresses the resonance of the gate drive substrate 7. Commercially available low-price O-rings can be used as the pair of ring-shaped elastic members 142.

In the process of assembling the semiconductor device 216, one ring-shaped elastic member 142 is first provided on the upper surface of the anode fin electrode 6 and then the GDU 316 is set inside the ring-shaped elastic member 142. Next the other ring-shaped elastic member 142 is provided above the cathode post electrode 2 of the GDU 316 (FIG. 40) and then the cathode fin electrode 5 is laid on it. The semiconductor device 216 can thus be easily assembled by using the stacking attachment.

Modifications

The preferred embodiments have shown examples in which the spacers 37 supporting the flat portions 41 or reinforcing members 120 are arranged in separated two positions (the first to sixth, twelfth and fourteenth preferred embodiments), arranged in separated three positions (the eighth preferred embodiment) and extended in one direction (the ninth preferred embodiment). These arrangements can be generally represented as: the spacers are provided in positions including at least two points separated in one direction. For example, in the ninth preferred embodiment, the spacer 130 is provided in positions including continuous infinite points (i.e. at least two points) extending along the direction in which it extends.

Similarly, the spacers 37 of the seventh and tenth preferred embodiments and the spacers 134 of the thirteenth preferred embodiment can generally be arranged in positions including at least four points separated to surround the opening 49. For example, the spacers may be arranged in separated five or more positions around the opening 49, or may be arranged to extend along the periphery of the opening 49.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

(a) a circuit board having a pair of main surfaces and an opening selectively formed through said pair of main surfaces;

(b) a pressure-contact type semiconductor element inserted in said opening, said pressure-contact type semiconductor element comprising a semiconductor substrate, a pair of main electrodes between which opposite main surfaces of said semiconductor substrate are sandwiched, a fin electrode abutting on one of said pair of main electrodes and facing one main surface of said pair of said circuit board, and a control terminal connected to said semiconductor substrate;

(c) a control circuit attached to said circuit board and electrically connected to said control terminal to control said pressure-contact type semiconductor element; and (d) a supporting member configured to support said circuit board on said fin electrode, wherein said fin electrode contacts said supporting member at three or more supporting points arranged to surround said opening.

2. The semiconductor device according to claim 1, wherein said supporting member comprises, (d-1) a pair of reinforcing members having a pair of flat portions arranged to extend in one direction along the periphery of said opening, while facing said one main surface in a pair of positions facing each other across said opening, and a pair of upright portions respectively coupled to said pair of flat portions at one end in said one direction, said pair of upright portions vertically standing above said one main surface and detachably fixed on a side wall surface of said fin electrode, (d-2) a spacer interposed between said pair of flat portions and said one main surface to fixedly couple said pair of flat portions and said circuit board at an interval therebetween, said spacer being arranged, for each said flat portion, in a position including at least two points spaced from each other along said one direction, and (d-3) a fixing member provided in such a position as to surround said opening together with said pair of upright portions and interposed between said fin electrode and said one main surface to detachably fix said fin electrode and said circuit board at an interval therebetween.

3. The semiconductor device according to claim 1, wherein said supporting member comprises, (d-1) a pair of reinforcing members interposed between said fin electrode and said one main surface in a pair of positions facing each other across said opening, said pair of reinforcing members extending in one direction along the periphery of said opening and detachably fixed along said one direction in close contact on a surface of said fin electrode which faces said one main surface, and (d-2) a spacer interposed between said pair of reinforcing members and said one main surface to fixedly couple said pair of reinforcing members and said circuit board at an interval therebetween, said spacer being arranged, for each said reinforcing member, in a position including at least two points spaced from each other along said one direction.

4. The semiconductor device according to claim 1, wherein said supporting member comprises, (d-1) a pair of reinforcing members having a pair of flat portions arranged to extend in one direction along the periphery of said opening, while facing said one main surface in a pair of positions facing each other across said opening, a pair of upright portions respectively coupled to said pair of flat portions at one end in said one direction, said pair of upright portions vertically standing above said one main surface and detachably fixed on a side wall surface of said fin electrode, and a pair of fixing portions respectively coupled to said pair of flat portions at the other end in said one direction and detachably fixed to said fin electrode, and (d-2) a spacer interposed between said pair of flat portions and said one main surface to fixedly couple said pair of flat portions and said circuit board at an interval therebetween, said spacer being arranged, for each said flat portion, in a position including at least two points spaced from each other along said one direction.

5. The semiconductor device according to claim 2, wherein said fixing member comprises, (d-3-1) a spacer having a projection projecting to a side opposite to said one end along said one direction, said spacer being fixed on said circuit board and abutting on a surface of said fin electrode which faces said one main surface to hold the interval between said fin electrode and said circuit board, and (d-3-2) an engaging member fixed to said fin electrode and detachably engaged with said projection with an elastic recovery force to press said projection against said fin electrode.

6. The semiconductor device according to claim 3, wherein said supporting member further comprises, (d-3) a pair of engaging members fixed to said fin electrode and engaged slidably in said one direction with said pair of reinforcing members with an elastic recovery force to press said pair of reinforcing members against said fin electrode, and said pair of reinforcing members are fixed by said pair of engaging members in close contact on said surface of said fin electrode which faces said one main surface.

7. The semiconductor device according to claim 4, wherein said pair of fixing portions comprise a pair of protrusions vertically standing above said one main surface and detachably fixed on another side wall surface of said fin electrode which is opposite to said side wall surface.

8. The semiconductor device according to claim 7, wherein said pair of fixing portions are fastened with screws and thus detachably coupled respectively to said pair of flat portions.

9. The semiconductor device according to claim 7, wherein said pair of fixing portions are fastened with screws and thus detachably fixed to said another side wall surface.

10. The semiconductor device according to claim 2, wherein said one direction is a direction approximately connecting the center of said opening and the center of said one main surface, and while said pair of flat portions have two ends in said one direction, said one end at which said pair of upright portions are coupled is the end closer to the center of said one main surface.

11. The semiconductor device according to claim 2, wherein, for each said flat portion, said spacer extends along said one direction in close contact with each said flat portion and said one main surface along said one direction.

12. The semiconductor device according to claim 1, wherein said circuit board has first and second interconnection patterns provided on said one main surface, said pressure-contact type semiconductor element further comprises a main terminal plate, said main terminal plate having its inner region electrically connected to said one main electrode, said main terminal plate having a branch-like protrusion projecting outward from said inner region, said branch-like protrusion of said main terminal plate being connected to said first interconnection pattern in a part disposed in the vicinity of the periphery of said opening, and said control circuit is electrically connected to said main terminal plate as well as said control terminal to control said pressure-contact type semiconductor element, and wherein said control terminal is a control terminal plate having its inner region electrically connected to said semiconductor substrate, said control terminal plate having a branch-like protrusion projecting outward from said inner region, said branch-like protrusion of said control terminal plate being connected to said second interconnection pattern in a part disposed in the vicinity of the periphery of said opening.

13. The semiconductor device according to claim 1, wherein said pressure-contact type semiconductor element is a gate commutated turn-off thyristor element.

14. A semiconductor device comprising:
   (a) a circuit board having a pair of main surfaces and an opening selectively formed through said pair of main surfaces;
   (b) a pressure-contact type semiconductor element inserted in said opening, said pressure-contact type semiconductor element comprising a semiconductor substrate, a pair of main electrodes between which opposite main surfaces of said semiconductor substrate are sandwiched, a fin electrode abutting on one of said pair of main electrodes and facing one main surface of said pair of main surfaces of said circuit board, and a control terminal connected to said semiconductor substrate;
   (c) a control circuit attached to said circuit board and electrically connected to said control terminal to control said pressure-contact type semiconductor element;
   (d) a pair of reinforcing members having a pair of flat portions arranged to extend in one direction along the periphery of said opening, while facing said one main surface in a pair of positions facing each other across said opening, and a pair of upright portions respectively coupled to said pair of flat portions at one end in said one direction, said pair of upright portions vertically standing above said one main surface and detachably fixed on a side wall surface of said fin electrode; and
   (e) a spacer interposed between said pair of flat portions and said one main surface to fixedly couple said pair of flat portions and said circuit board at an interval therebetween, said spacer being arranged, for each said flat portion, to extend along said one direction in close contact with each said flat portion and said one main surface along said one direction.

15. The semiconductor device according to claim 14, wherein
   said circuit board has first and second interconnection patterns provided on said one main surface,
   said pressure-contact type semiconductor element further comprises a main terminal plate, said main terminal plate having its inner region electrically connected to said one main electrode, said main terminal plate having a branch-like protrusion projecting outward from said inner region, said branch-like protrusion of said main terminal plate being connected to said first interconnection pattern in a part disposed in the vicinity of the periphery of said opening, and
   said control circuit is electrically connected to said main terminal plate as well as said control terminal to control said pressure-contact type semiconductor element,
   and wherein said control terminal is a control terminal plate having its inner region electrically connected to said semiconductor substrate, said control terminal plate having a branch-like protrusion projecting outward from said inner region, said branch-like protrusion of said control terminal plate being connected to said second interconnection pattern in a part disposed in the vicinity of the periphery of said opening.

16. The semiconductor device according to claim 14, wherein said pressure-contact type semiconductor element is a gate commutated turn-off thyristor element.

17. A semiconductor device comprising:
   (a) a circuit board having a pair of main surfaces and an opening selectively formed through said pair of main surfaces;
   (b) a pressure-contact type semiconductor element inserted in said opening, said pressure-contact type semiconductor element comprising a semiconductor substrate, a pair of main electrodes between which opposite main surfaces of said semiconductor substrate are sandwiched, a fin electrode abutting on one of said pair of main electrodes and facing one main surface of said pair of main surfaces of said circuit board, and a control terminal connected to said semiconductor substrate;
   (c) a control circuit attached to said circuit board and electrically connected to said control terminal to control said pressure-contact type semiconductor element;
   (d) a pair of reinforcing members having a pair of flat portions arranged to extend in one direction along the periphery of said opening, while facing said one main surface in a pair of positions facing each other across said opening, and a pair of upright portions respectively coupled to said pair of flat portions at one end in said one direction, said pair of upright portions vertically standing above said one main surface and detachably fixed on a side wall surface of said fin electrode;
   (e) a spacer interposed between said pair of flat portions and said one main surface to fixedly couple said pair of flat portions and said circuit board at an interval therebetween, said spacer being arranged, for each said flat portion, in a position including at least two points spaced from each other along said one direction;
   (f) another reinforcing member having another plate-like flat portion arranged to face an area of said one main surface which does not face said fin electrode, and another upright portion coupled to one end of said another flat portion in one direction along said one main surface, said another upright portion vertically standing above said one main surface and detachably fixed on said side wall surface of said fin electrode; and
   (g) another spacer interposed between said another flat portion and said one main surface and fixedly coupling said another flat portion and said circuit board at an interval therebetween, said another spacer being arranged in a position including at least four points separated from one another and not aligned in a straight line.

18. The semiconductor device according to claim 17, wherein said fin electrode has a fin on its said side wall surface, and
   said another upright portion has a window selectively opening in a part facing said fin.

19. The semiconductor device according to claim 17, wherein
   said circuit board has first and second interconnection patterns provided on said one main surface,
   said pressure-contact type semiconductor element further comprises a main terminal plate, said main terminal plate having its inner region electrically connected to said one main electrode, said main terminal plate having a branch-like protrusion projecting outward from said inner region, said branch-like protrusion of said main terminal plate being connected to said first interconnection pattern in a part disposed in the vicinity of the periphery of said opening, and said control circuit is electrically connected to said main terminal plate as well as said control terminal to control said pressure-contact type semiconductor element, and wherein said control terminal is a control terminal plate having its inner region electrically connected to said semiconductor substrate, said control terminal plate having a branch-like protrusion projecting outward from said inner region, said branch-like protrusion of said control terminal plate being connected to said second interconnection pattern in a part disposed in the vicinity of the periphery of said opening.

20. The semiconductor device according to claim 17, wherein said pressure-contact type semiconductor element is a gate commutated turn-off thyristor element.

* * * * *